(12) United States Patent
Shuma et al.

(10) Patent No.: US 11,663,381 B2
(45) Date of Patent: May 30, 2023

(54) CLOCK MAPPING IN AN INTEGRATED CIRCUIT DESIGN

(71) Applicant: INTERNATIONAL BUSINESS MACHINES CORPORATION, Armonk, NY (US)

(72) Inventors: Stephen Gerard Shuma, Underhill, VT (US); Ali S. El-Zein, Austin, TX (US); Wolfgang Roesner, Austin, TX (US); Viresh Paruthi, Austin, TX (US); Benedikt Geukes, Stuttgart (DE); Klaus-Dieter Schubert, Schoenaich (DE); Birgit Schubert, Schoenaich (DE); Stephen John Barnfield, New York, NY (US); Derek E. Williams, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 17/468,304

(22) Filed: Sep. 7, 2021

(65) Prior Publication Data

US 2023/0075770 A1 Mar. 9, 2023

(51) Int. Cl.
*G06F 30/30* (2020.01)
*G06F 30/327* (2020.01)
*G06F 30/31* (2020.01)
*G06F 30/323* (2020.01)

(52) U.S. Cl.
CPC ............ *G06F 30/327* (2020.01); *G06F 30/31* (2020.01); *G06F 30/323* (2020.01)

(58) Field of Classification Search
CPC ....... G06F 30/327; G06F 30/31; G06F 30/323
See application file for complete search history.

(56) References Cited

U.S. PATENT DOCUMENTS

| 7,143,367 | B2 | 11/2006 | Eng |
| 8,151,227 | B2 | 4/2012 | Teig et al. |
| 8,584,062 | B2 | 11/2013 | Xia et al. |
| 8,661,383 | B1* | 2/2014 | Dobkin ................. G06F 30/398 716/108 |
| 8,930,863 | B2 | 1/2015 | Nayak et al. |
| 10,268,797 | B2 | 4/2019 | McElvain et al. |
| 10,372,858 | B2 | 8/2019 | Odiz et al. |
| 10,586,003 | B1 | 3/2020 | Suresh |

(Continued)

OTHER PUBLICATIONS

OpenLane: The Open-Source Digital ASIC Implementation Flow, Ghazy, AA. et al.; 2020.

(Continued)

*Primary Examiner* — Jack Chiang
*Assistant Examiner* — Brandon Bowers
(74) *Attorney, Agent, or Firm* — Brian F. Russell; Brian Restauro

(57) ABSTRACT

A processor receives, as input, a first hardware description language (HDL) file defining an entity of a modular circuit design. The first HDL file instantiates, by a storage element declaration in a hardware description language, a storage element within the entity. The first HDL file omits a port map for the storage element. Based on the first HDL file, the processor automatically fully elaborates a port map for the storage element. The processor stores, in data storage, a derived second HDL file defining the entity and including the port map.

24 Claims, 36 Drawing Sheets

(56) References Cited

U.S. PATENT DOCUMENTS

| | | | |
|---|---|---|---|
| 10,762,265 B1* | 9/2020 | Fang | G06F 9/547 |
| 10,796,048 B1 | 10/2020 | Azuelos et al. | |
| 10,911,323 B2 | 2/2021 | Hiers et al. | |
| 10,915,683 B2 | 2/2021 | Surisetty et al. | |
| 11,010,522 B2 | 5/2021 | Chen et al. | |
| 2003/0033595 A1* | 2/2003 | Takagi | G06F 30/30 717/143 |
| 2013/0125097 A1* | 5/2013 | Ebcioglu | G06F 12/0862 717/136 |
| 2015/0339424 A1* | 11/2015 | Chang | G06F 13/20 716/136 |
| 2020/0401750 A1 | 12/2020 | Mondal et al. | |

OTHER PUBLICATIONS

RTL-Aware Dataflow-Driven Macro Placement, Vidal-Obiols, A. et al.; 2017-2019.
RTL Dynamic Power Optimization for FPGAs, Howland, D. et al.; 2008.
Mechanism to Restore Hierarchy to a "Flattened" Digital-Logic Design, Anonymously; Oct. 29, 2009.
A Pseudo Hierarchy Approach for Improved Performance and Reduced Logic Overhead in Very High Speed Processors, Anonymously; Sep. 21, 2010.
Enabling Back Annotation of Physical Design Optimizations into RTL Hierarchical HDL Designs, Anonymously; Oct. 19, 2017.
Congestion Mitigation by Congestion Optimized Library Cell Swapping and Selective Standard Cell Repulsion, Anonymously; Aug. 30, 2012.
Semantic Preserving RTL Transformation for Control-Data Slicing in Virtual IPs, Muhammad, W. et al.; Jan. 2008.
RTL Hardware Design Using VHDL Chu, PP.; 2006.
High Level Synthesis of Neural Network Chips, Nigir, ME.; Feb. 1993.
A Graph-Based Modeling Method for Register Coupling in Chip Functional Verification, Anonymously; Feb. 26, 2014.
Deterministic Method for Tracking and Reproducing Logic Design Transformations, Anonymously; May 5, 2006.
Makefile Generation for Mixed HDL Design, Carstens, J.; Apr. 25, 2004.
C-Based Interactive RTL Design Methodology, Shin, D. et al.; Dec. 2003.
Function Binding in RTL Design Methodology, Xie, Q. et al.; Jun. 2001.
Systems Design Lecture 7: Introduction to Hardware Design Patterns, Wawrzynek, J. et al.; 2010.
Meta-Core Processors, Anonymously; Sep. 17, 2010.
Virtualizing a Backplane and a Control and Timing Module Used in a Modular Network Element, Anonymously; Apr. 23, 2021.
Mapper Recovery and Millicode Register Deallocation, Anonymously; Dec. 20, 2018.
Hardware Synthesis from a Recursive Functional Language, Zhai, K. et al.; 2015.
Delphi: A Framework for RTL-Based Architecture design Evaluation Using DSENT Models Papamichael, MK. et al.; 2017.
Register Transfer Level Information Flow Tracking for Provably Secure Hardware Design, Ardeshiricham, A. et al.; 2018.
Efficient Techniques to Monitor the Strength of Signals in Verilog-HDL Models and Testbenches, Anonymously; Feb. 24, 2006.
Embedded System Design and Modeling—System Design Flow and Methodology, Gerstlauer, A.; 2008.
Introduction to Digital System Design—RTL Hardware Design, Chu, P.; 2003.
Method and System for Enhanced Formal and Semi-Formal Verification Using Simulation, Reduction, and Case-Splitting Strategies, Anonymously; Nov. 27, 2011.
Linear Resolution Proofs of Combinatorial Equivalence of Logic Transformation, Anonymously; Sep. 5, 2010.
Methodology to Validate Limited Changes to Pre-Validated IP Cores, Anonymously; Jul. 3, 2008.

* cited by examiner

```
HDL file 400
                                                        450
                                                  ┌─────┴─────┐
                                                     456
                                                  ┌──┴──┐
latch0 : n_dff  ~452
generic_map (width = 4; init = 0) ~454
port_map (CLK  => clka_1to1; ~458
          ACT  => my_clk_act; ~460
                                     462
          DIN  => data_in_invert(0 to 3); ~464
          DOUT => data_out_int  (0 to 3)
         );
                                        470
                                    ┌────┴────┐
                                       474
                                    ┌──┴──┐
func12x : my_logic_func ~472
port_map (a   => a; ~476
          b   => b; ~478
          c   => c; ~480
          out => my_out ~482
         );
                                              490
                                        ┌──────┴──────┐
data_out(0 to 3)     <=
data_out_int(0 to 2) &
(data_out_int(3) XOR my_out);

END ~492
```

Figure 4B

```
latch0 : n_dff  ~602
generic_map (width = 4; init = 9) ~604
port_map
    (CLK  => clkb_3to1;  ~608  ~610
     ACT  => other_clk_gate;
     DIN  => E(0 to 3);  ~612
     DOUT => D(0 to 3)   ~614
    );
ATTRIBUTE hard_latch of LATCH0:  ~620
    "HARD = YES; RING = FUNC"
```

X <= [Y]; ~802

P(0 to 3) <= [Q(0 to 3)].X"F"; ~804

L(0 to 16)@.my_inst_name <= [m(0 to 16)]; ~806

```
SHDL file 900
...
@@LATCH(region = clka, ratio = 1:1; act = my_clk_gate);  ~902
X <= [Y]; ~904
@@LATCH(ratio = 2:1); ~906
P <= [Q]; ~908
@@LATCH.HARD(hard = yes); ~910
@@LATCH.FUNC(ring = func); ~912
@@LATCH.CLKB_4to1(region = clkb, ratio = 4:1); ~914
@@LATCH(act = other_clk_gate); ~916
D(0 to 3)@HARD@FUNC@CLKB_4to1 <= [E(0 to 3)].x"9"; ~918
...
```

Figure 9

SHDL file 1000

```
ENTITY sample; ~1002

PINI a; ~1006
PINI b; ~1008
PINI c; ~1010
              ←1012
PINI data_in(0 to 3); ~1014
PINO data_out(0 to 3); ~1016
                              }~1004 data_in_invert <= NOT(data_in(0 to 3)); ~1020 my_clk_act      <= c AND (a_b); ~1022 a_b             <= a AND (NOT b); ~1024

@@LATCH (CLK = clka; RATIO = 1to1; ~1030
         act = my_clk_act);
data_out_internal(0 to 3) <=
         [data_in_internal(0 to 3)].x "0"; ~1032 func12x: my_logic_func ~1042  }
port_map (out => my_out ~1044  }~1040
         );

data_out(0 to 3) <= data_out_int(0 to 2) ~1050 &
         (data_out_int(3) XOR my_out);
```

Figure 10

```
NHDL file 1300 logic14x: XOR2  ~1352
PORT MAP(in1 => x_y ~1356
         in2 => e    ~1358      }~1354   }~1350
         out => m);  ~1360

END ~1362

--@@INTENT my_intent END ~1364
--@@IMPLEMENTATION new_impl OF ~1372
--    my_intent IS
--
-- e   <= ((x AND y) OR (x AND z)); ~1374
-- x_y <= x OR y; ~1376
--
-- logic14x : XOR2 ~1382
-- PORT MAP(in1 => x_y; ~1384        ~1386
--          in2 => e_buf; ~1386              }~1380      }~1370
--          out => m); ~1388
--
-- logic15x : BUF ~1392
-- PORT MAP(IN  => e; ~1394                  }~1390
--          OUT => e_buf); ~1396
--
--@@END IMPLEMENTATION new_impl; ~1398
```

Figure 13B

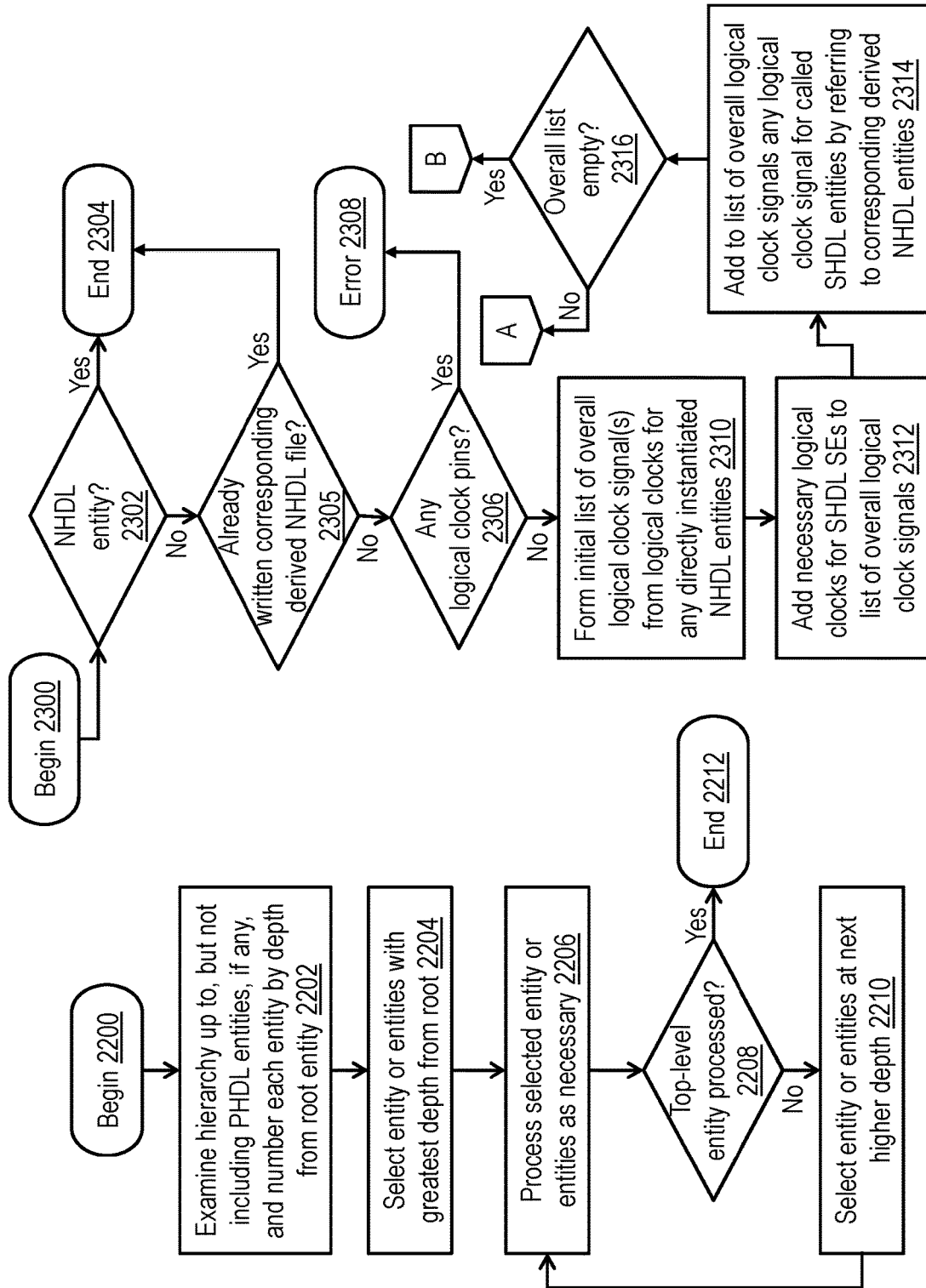

```
Control file 2500

@@USE IMPLEMENTATION
    sample2.my_intent.new_impl; ~2502

@@INTENT sample2.my_intent BEGIN ~2504
Y_Z <= Y or Z; ~2506 out => M); ~2508
@@INTENT sample2.my_intent END ~2510

@@IMPLEMENTATION new_impl OF
    sample2.my_intent IS
e    <= ((x AND y) OR (x AND z));  ⎫
x_y  <= x OR y;                    ⎪
                                   ⎬ ~2512
logic14x : XOR2                    ⎪
PORT MAP(in1 => x_y;               ⎪
         in2 => e_buf;             ⎪
         out => foo);              ⎪
                                   ⎪
logic15x : BUF                     ⎪
PORT MAP(IN => e;                  ⎪
         OUT => e_buf);            ⎭

@@END IMPLEMENTATION new_impl;
```

Figure 25

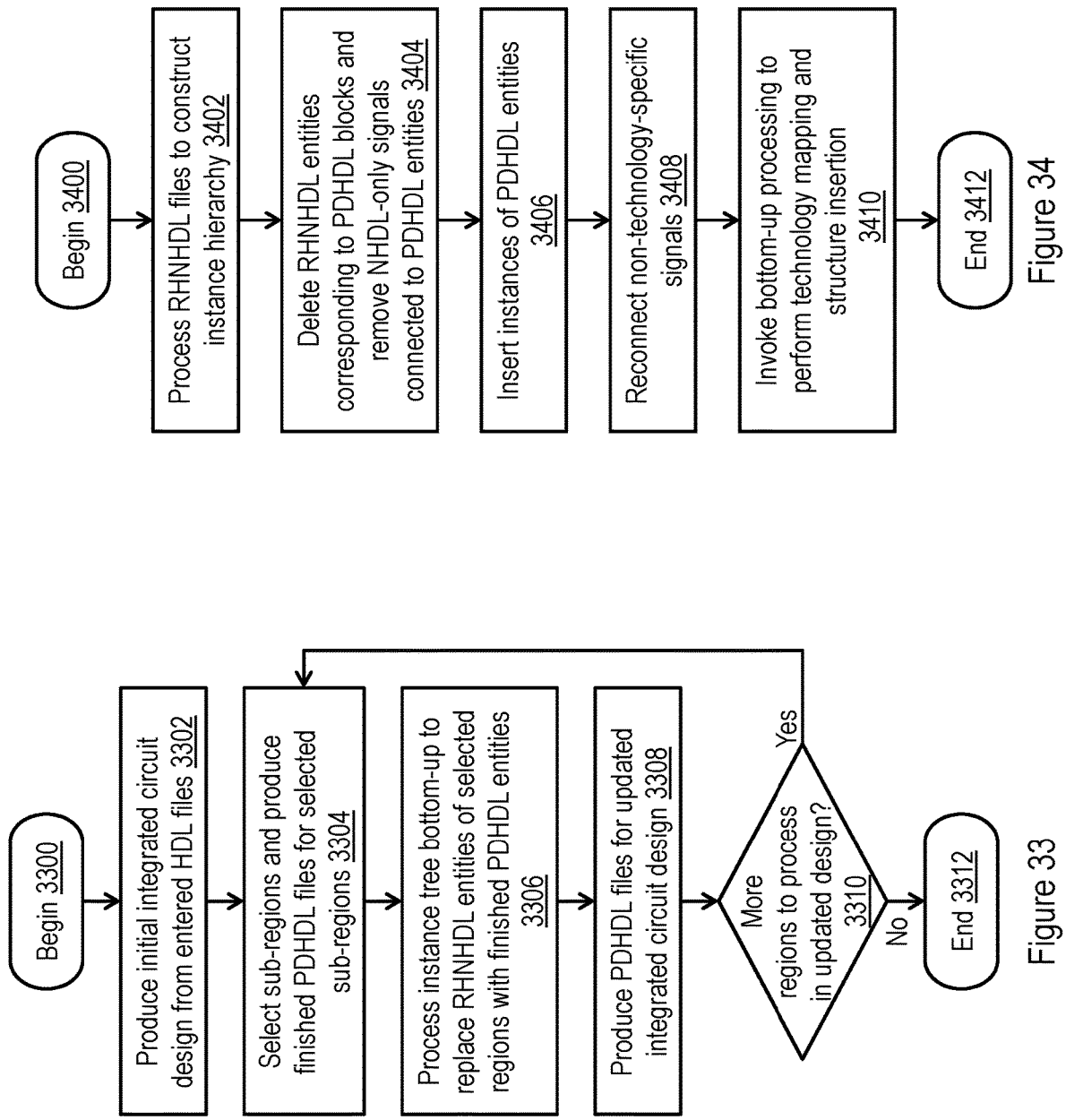

CLOCK MAPPING IN AN INTEGRATED CIRCUIT DESIGN

BACKGROUND OF THE INVENTION

This disclosure relates to electronic design automation and, more particularly, to improved techniques of integrated circuit design.

Modern processor and system-on-chip designs can include billions of transistors integrated within a semiconductor substrate. To design such large integrated circuits, teams of designers typically employ sophistical electronic design automation (EDA) tools, which assist the designers in defining and modeling the behavior of the overall integrated circuit (or subsets thereof) and developing a physical layout of a chip.

Hardware description languages (HDLs), such as VHDL or Verilog, enable the description of an integrated circuit design in a modular, hierarchical fashion. A module (or entity/architecture in VHDL) can describe one component of a modular circuit design by listing instances of subcomponents and the interconnections between the subcomponents. An instance can be a reference to a primitive circuit component (e.g., a logic gate or flip-flop) or a reference to another module. In the latter case, the instance, which can be referred to as a "module instance," "child instance," or "non-primitive instance," directs the model construction process (e.g., logic synthesis) to substitute the contents of the referenced module for the instance. A hierarchical circuit design is one in which some module, called the top-level module, instantiates one or more other modules, which may in turn instantiate one or more other modules, and so on.

In at least some prior art design processes, chip designers are required to enter, in the HDL files describing a chip, a full description of every signal and entity. Thus, chip designers are required to not only enter code defining the logic and signals utilized to perform the mainline function of each module, but also to manually and fully type in HDL code representing logic and functions for support structures that are not part of the module's mainline function. As one specific example, many designs include a series of latches connected in a ring structure referred to as a "scan chain" that allows a set of initial values to be "scanned in" the design on power up and/or allows a set of values to be "scanned out" of the latches in response to certain failure conditions. This scan chain forms a portion of so-called "pervasive" logic that provides various support functions to the design (e.g., scanning in initial values at power on) rather than functions forming part of the functional intent of the design when operating normally. Other examples of pervasive logic structures are DFT (Design-for-Test) logic, ABIST (Array Built-In-Self-Test) logic, and scan chain multiplexing and isolation structures. These pervasive logic structures tend to be rather complex and often need to be modified with each new technology generation as a design evolves.

The various clock control structures that provide clocking to storage elements and latches in a design also tend to be rather complex and, again, the details of these structures tend to change with each technology generation as the design evolves. Manually entering these non-functional-intent structures creates a significant burden in current design methodologies and is prone to human error.

In addition to the foregoing disadvantages of prior art design methodologies, the requirement that all non-functional-intent structures (e.g., pervasive logic, clock control structure, etc.) be explicitly expressed in the set of HDL files defining a design also adversely impacts performance when simulating the design. Most simulation is only intended to, and need only exercise, the behavior of the design related to its functional intent. However, in a design methodology having only one level of abstraction (i.e., one requiring a fully elaborated model with all the pervasive structures present), the inclusion of the non-functional-intent portion of the design in the model will degrade the simulation performance of the design.

BRIEF SUMMARY

In view of the foregoing and other considerations, the present disclosure appreciates that it would be useful and desirable to implement a design methodology that supports more than one level of abstraction in the models produced for a design. By supporting multiple different models of a design having differing levels of abstraction, simulation performance can be improved, coding effort and errors can be reduced by allowing logic designers to reduce or eliminate entry of code other than that representing the functional intent of the model, the design can be insulated from technology generation-dependent changes to the pervasive logic, and the differing preferences and objectives of physical designers and logic designers with regard to the hierarchical organizations of models can be satisfied.

In some embodiments, a processor receives, as input, a first hardware description language (HDL) file defining an entity of a modular circuit design. The first HDL file instantiates, by a storage element declaration in a hardware description language, a storage element within the entity. The first HDL file omits a port map for the storage element. Based on the first HDL file, the processor automatically fully elaborates a port map for the storage element. The processor stores, in data storage, a derived second HDL file defining the entity and including the port map.

In various embodiments, the disclosed techniques can be implemented in a method, a data processing system, and/or a program product.

In at least one embodiment, the storage element declaration specifies only a data input signal and a data output signal of the storage element.

In at least one embodiment, the storage element is one of multiple storage elements within the entity and the processor applies to the multiple storage elements characteristics defined by an attribute declaration statement in the first HDL file. The characteristics may include, for example, a clock region and a clock frequency relative to a global clock.

In at least one embodiment, the first HDL file includes a storage element variable declaration statement defining a value for a particular characteristics of a plurality of characteristics of a storage element and the processor applies the value to the storage element based on the first HDL file including a storage element declaration for the storage.

In at least one embodiment, the processor replaces a portion of an implementation defined within the entity based on an expression of design refinement intent specified in comments within the second HDL file.

In at least one embodiment, the processor compiles the second HDL file with one or more additional HDL files to form a functional simulation model of the modular circuit design.

In at least one embodiment, the processor automatically creates on the entity a port for a functional signal not referenced within the entity and not found within the entity.

BRIEF DESCRIPTION OF THE SEVERAL VIEWS OF THE DRAWINGS

FIGS. 4A-4B together depict a conventional HDL file that declares an example of an entity;

FIG. 9 illustrates an exemplary SHDL file that employs an improved syntax to define latch attributes and latch variables and to declare storage elements in accordance with one embodiment;

FIG. 10 depicts an exemplary SHDL file that declares an example of an entity in accordance with one embodiment;

FIGS. 13A-13B depict an exemplary HDL file including a declaration of design refinement intent in accordance with one embodiment;

FIG. 22 is a high-level logical flowchart of an exemplary process by which a stitching engine processes a modular circuit design to generate derived NHDL files in accordance with one embodiment;

FIGS. 23A-23B together form a high-level logical flowchart of an exemplary process for processing a SHDL entity to obtain a derived NHDL entity in a modular circuit design in accordance with one embodiment;

FIG. 25 illustrates an exemplary refinement control file in accordance with one embodiment;

FIG. 33 illustrates a high-level logical flowchart of an exemplary iterative integrated circuit design process in accordance with one embodiment;

FIG. 34 depicts a high-level logical flowchart of an exemplary process for preparing a physical design entity for substitution in an integrated circuit design in place of a more abstract design entity in accordance with one embodiment.

DETAILED DESCRIPTION

Figure 1:
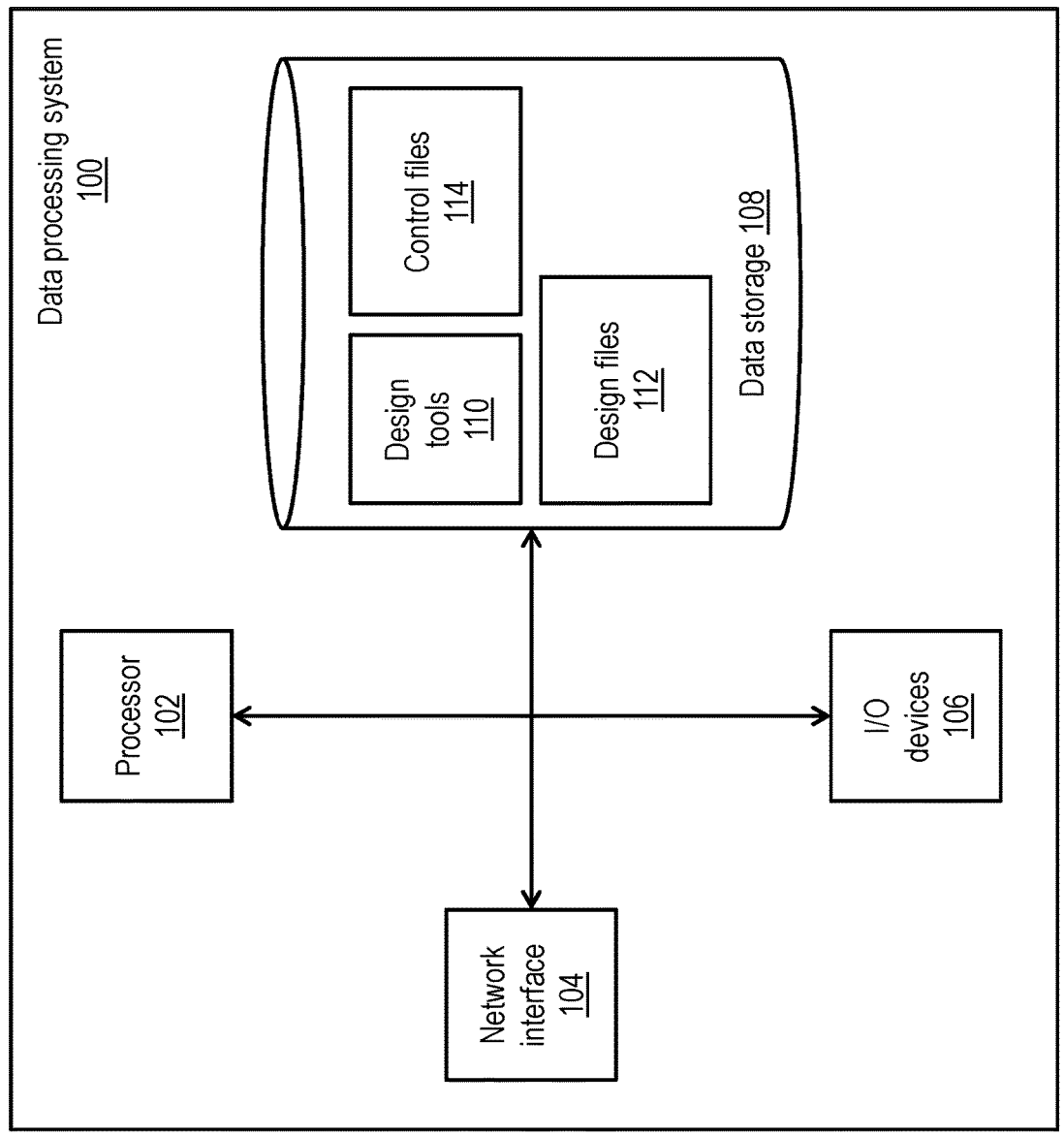
FIG. 1 is a high-level block diagram of a data processing system in accordance with one embodiment.

With reference now to the figures, and in particular with reference to FIG. 1, an exemplary embodiment of a data processing system 100 that may be utilized to implement aspects of the disclosed inventions is illustrated. In this example, data processing system 100 includes a processor 102 that processes data under the direction of program instructions. Processor 102 is communicatively coupled to other components of data processing system 100, such as a network interface 104, input/output (I/O) devices 106, and data storage 108. Data storage 108, which may include volatile and/or non-volatile storage media, can store software (or program code) containing program instructions executable by processor 102, data to be processed by processor 102, and data produced by the processing performed by processor 102.

For example, in the illustrated embodiment, data storage 108 stores one or more design tools 110 as described in detail herein. These design tools 110 include, among others, stitching engine 210, transform engine 218, HDL compiler 214, logic synthesis engine 302, chip integration tool 306, and PD writer engine 312. When executed by processor 102, a design tool 110 may receive, as inputs, one or more design files 112, and possibly, one or more control files 114, such as control files 220, 221, and 310 described below. For example, input design files 112 can include one or more hardware description language (HDL) files defining an integrated circuit design. Control files 114 can include one or more files specifying attributes of or constraints for the integrated circuit design or its processing by design tools 110. By executing design tools 110, processor 102 can generate as outputs, among other things, new and/or updated design files 112, various simulation models of an integrated circuit design (or portion thereof), gatelist representations of an integrated circuit design (or portion thereof), etc. It will be appreciated by those skilled in the art that in some embodiments, some or all of design tools 110, design files 112, and control files 114 may alternatively or additionally be stored on storage media external to data processing system 100 that is accessible to processor 102, for example, via network interface 104.

Figure 2:
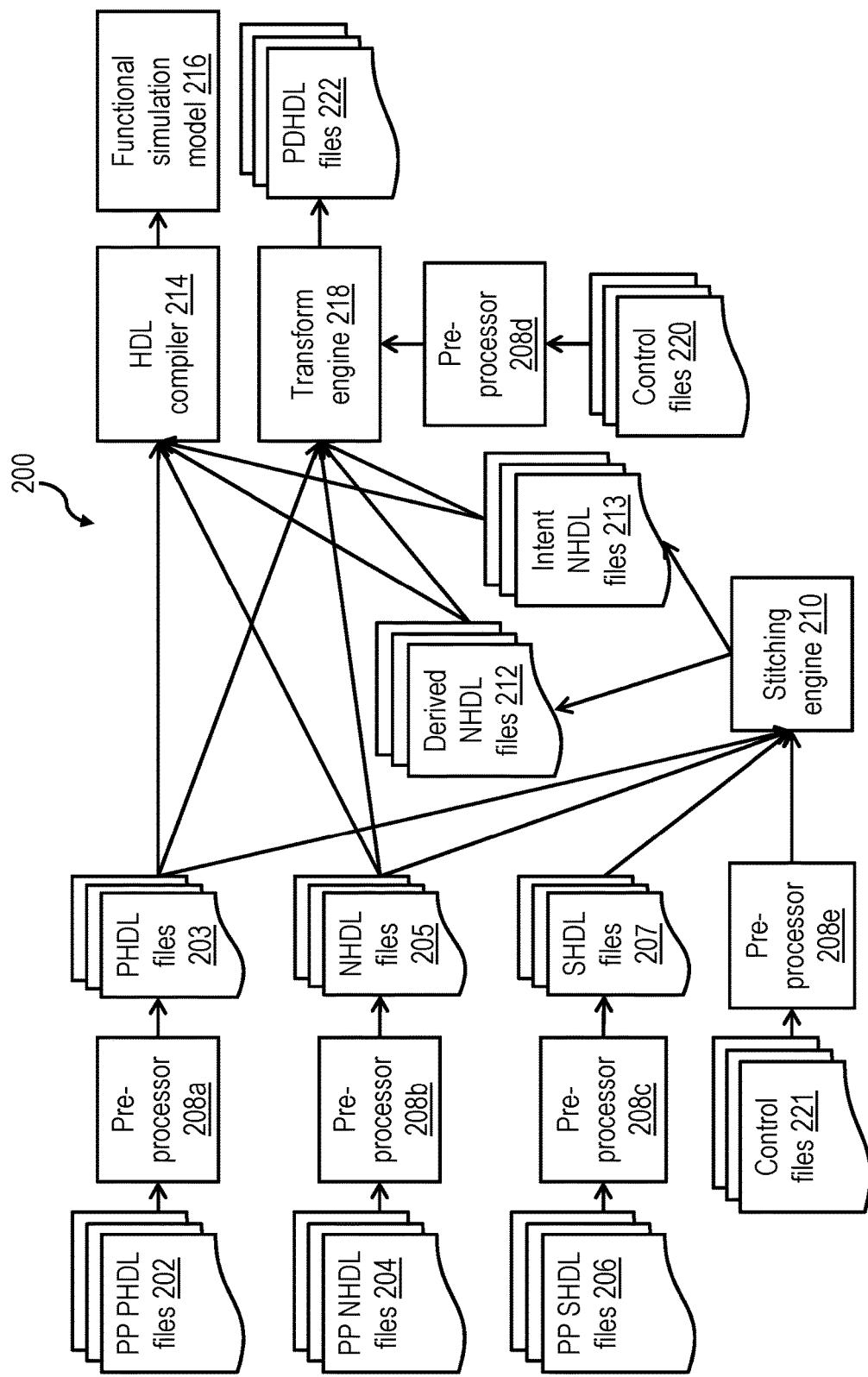
FIGS. 2-3 together form a data flow diagram of an exemplary design methodology that transforms hardware description language (HDL) files to support various representations of an integrated circuit design in accordance with one embodiment.
Figure 3:
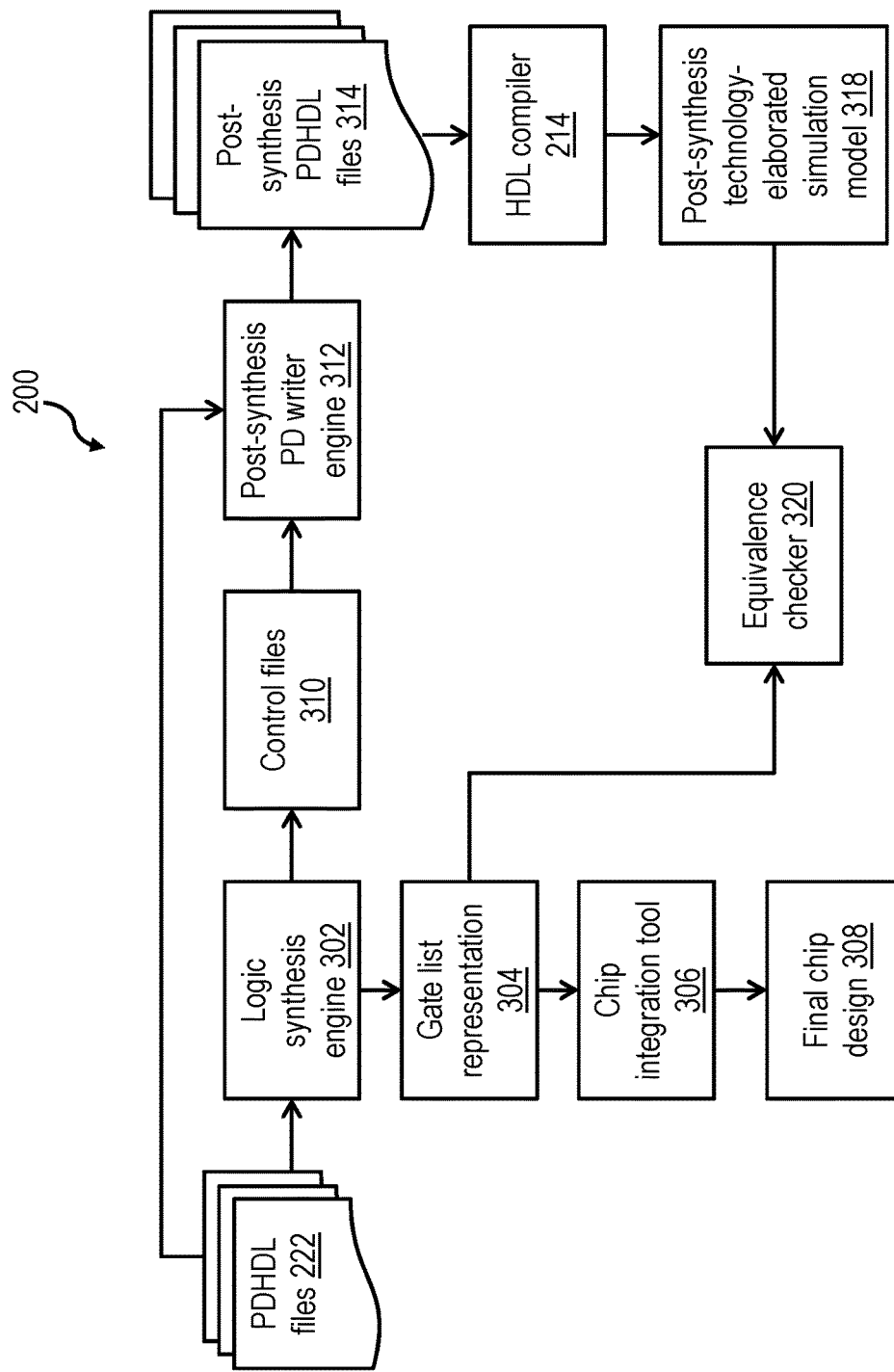

Referring now to FIGS. 2-3, there are depicted data flow diagrams of an exemplary end-to-end design methodology 200 for transforming HDL files to support various representations of an integrated circuit design in accordance with one embodiment. Design methodology 200 begins with design files and can generate a final physical integrated circuit chip design and a logically equivalent simulation model.

The present disclosure appreciates that using a single model of a design throughout the design process may be suboptimal because no one model can satisfy the needs of all of the different constituencies involved in the design process. For example, logic designers responsible for developing the functional operation of the design may prefer the design to reflect an organizational hierarchy of entities (each of which is represented by a specific HDL file) that is structured around the logical makeup of the design and the allocation of responsibility for developing the functions within the design among various logic designers. On the other hand, physical designers, who bear responsibility for laying out a floorplan for a physical design as realized in integrated circuitry, may desire to use a model that is organized based on boundaries for placeable floorplan objects and logic synthesis boundaries rather than logic functions. As one example, during physical design, a number of smaller logic entities, possibly assigned to different designers, may be combined into a larger entity—a so-called "large-block"—that is run through logic synthesis to create a placeable set of logic for the chip design. Performing synthesis on this large-block allows the logic synthesis tool to perform better optimizations over a larger portion of the design than would be possible if each of the individual smaller entities were synthesized alone. However, the hierarchical organization necessary to allow this large block synthesis is incompatible with the hierarchy organization preferred by logic designers, which would separate the various entities into enclosing entities based on design responsibility.

As illustrated, the depicted design methodology 200 supports various different types of input modular design files 112, which can be created or derived from inputs provided by logic designers involved in the development of an integrated circuit design. In this example, the types of modular design files 112 that can be utilized in design methodology 200 include at least PHDL files 203, NHDL files 205, and SHDL files 207.

As utilized herein, NHDL ("normalized" HDL) files 205 refer to HDL files that follow all the conventions and requirements of a native HDL. One example of such a NHDL file is described below with reference to FIGS. 4A-4B. By convention, NHDL files 205 simplify or "normalize" out elements other than those that support the design's functional intent. For example, in a NHDL file 205, a simplified or abstract storage element, which can be used to generically represent the function of a latch or storage element, is driven by a generic single phase logical clock signal (e.g., as shown in FIG. 5). This abstract storage element also provides for clock gating. However, storage elements in NHDL files 205 omit more complex technology-specific multi-phase clocking signals used in many technologies and the associated technology-specific clock control structures (e.g., shown in FIGS. 11-12) that will be present in the final realization of the integrated circuit. By employing simplified storage elements, the complexity of a functional simulation model 216 derived from NHDL files is significantly reduced, thus allowing for more efficient simulation of the functional intent of the design.

In some embodiments, the depicted process also supports PP NHDL (pre-processor NHDL) files 204. PP NHDL files 204 may be pseudo-NHDL files that include pre-processor constructs that are expanded and elaborated by a pre-processor 208b to create expanded legal NHDL files 205. Pre-processor 208b may support, among other things, looping constructs to unwind a simple description into a number of similar replicated blocks of HDL code. When such pre-processor directives are present, PP NHDL files 204 are typically not directly usable by an HDL compiler (e.g., HDL compiler 214) until pre-processor 208b has processed PP NHDL files 204 into NHDL files 205. If a PP NHDL file 204 has no pre-processor directives (they are not required), the corresponding NHDL file 205 is the same as the associated PP NHDL file 204.

While NHDL files 205 provides significant reductions in complexity and lower code entry overhead for designers, additional complexity reductions and entry overhead efficiency can optionally be achieved using a type of HDL files referred to herein as SHDL ("simplified" HDL) files 207. SHDL files 207 include one or more statements employing a unique simplified syntax, as explained below with reference to FIGS. 7-10. For example, in preferred embodiments, the simplified syntax employed in SHDL files 207 provides a significant simplification for the entry of storage elements (e.g., latches). In addition, the syntax of SHDL files 207 can be utilized to automate certain overhead functions like signal declaration and port map elaboration. SHDL files 207 may have a corresponding set of PP SHDL (pre-processor SHDL) files 206 that are processed by a pre-processor 208c to produce legal SHDL files 207 for those PP SHDL files 206 including pre-processing directives as described above.

Figure 11:
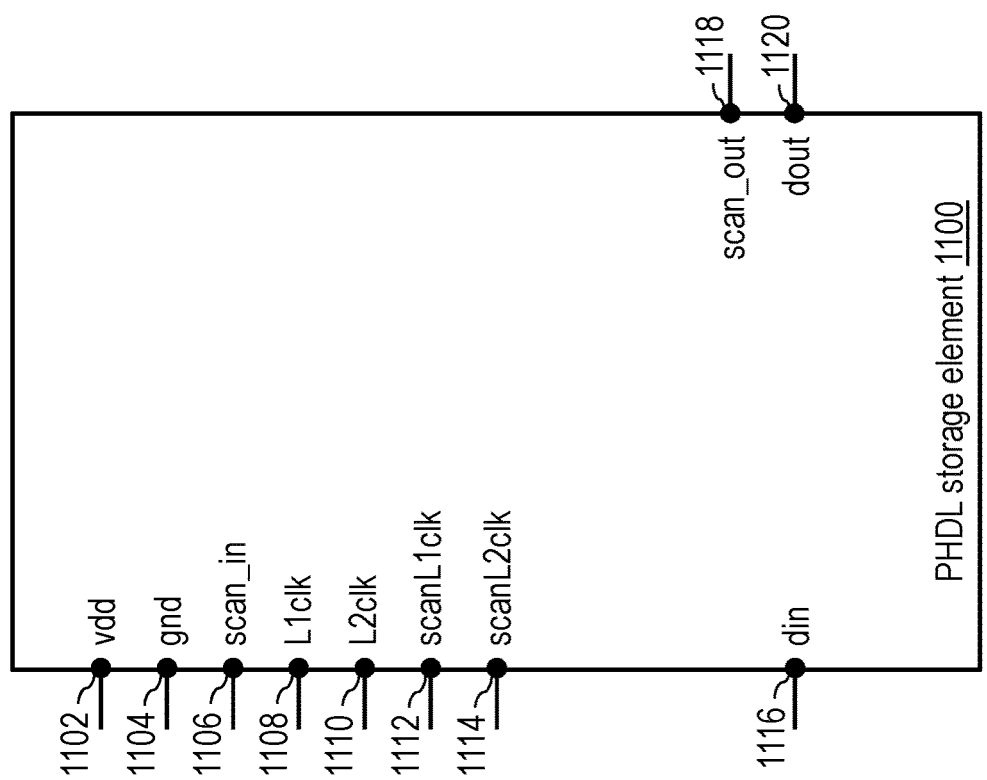
FIG. 11 is a graphical representation of an exemplary pervasive HDL (PHDL) storage element in accordance with one embodiment.
Figure 12:
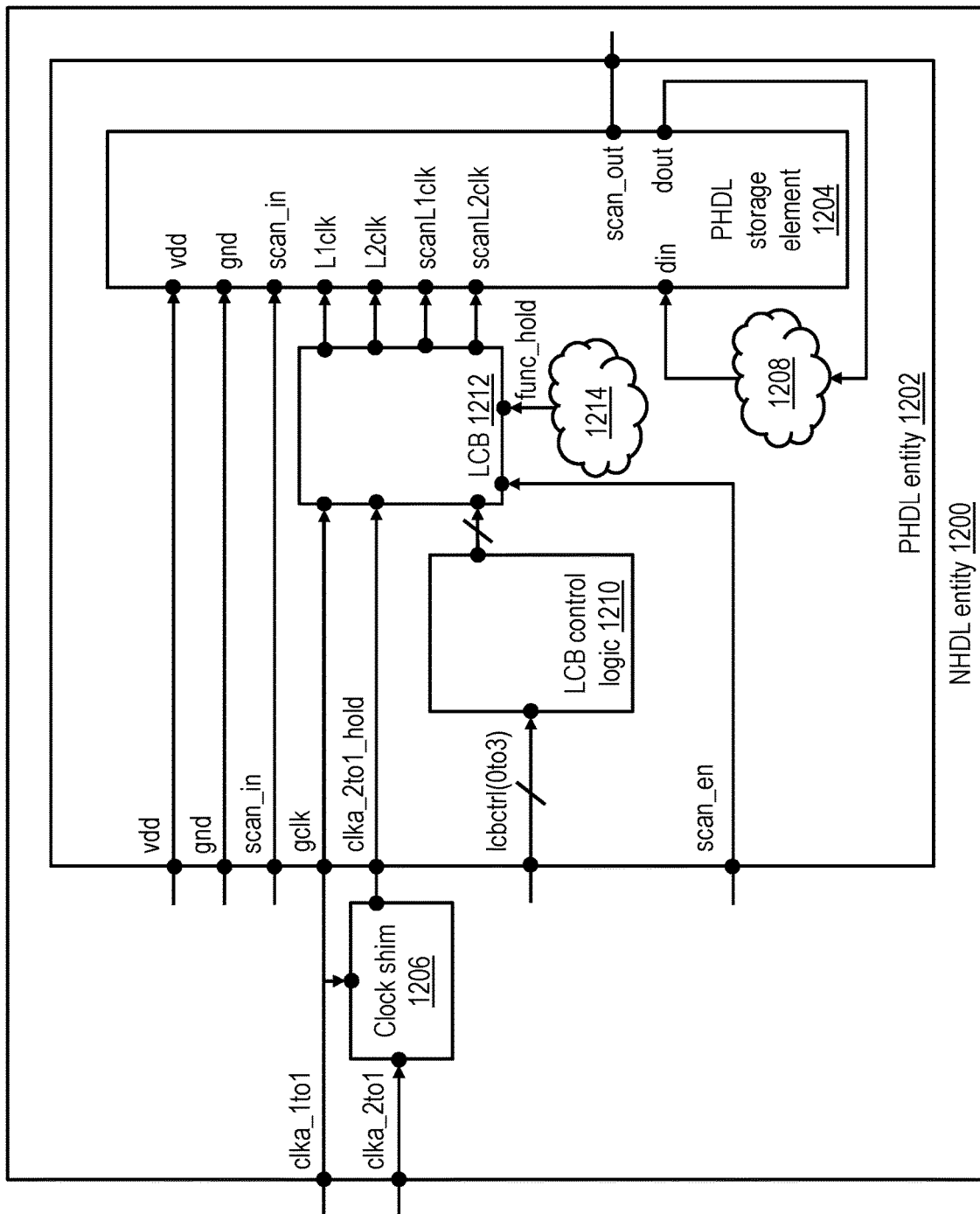
FIG. 12 is a high-level block diagram of an exemplary NHDL entity that encapsulates a PHDL entity for inclusion in a functional simulation model in accordance with one embodiment.

In some cases, additional HDL files, referred to herein as PHDL ("physical" HDL) files 203, may also be employed. A PHDL file 203 more fully defines an entity, for example, by specifying not only the functional components of the entity, but also by specifying a substantially complete representation of the various technology-specific structures within the entity (e.g., as illustrated in FIGS. 11-12). Like NHDL files 205, PHDL files 203 are legal files for a selected native HDL that can be directly compiled by an HDL compiler 214 and follow all syntactic and semantic rules for the native HDL. Unlike NHDL files 205, PHDL files 203 contain technology-specific signals and instances of technology-specific support structures and do not make use of abstract or simplified storage elements. In general, the difference between PHDL files 203 and NHDL files 205 is one of convention about the structures used and the set of control signals involved. In accordance with at least some embodiments, a special set of conventions (described below in FIG. 12) can be employed to allow entities defined by PHDL files 203 to coexist in the same simulation model with entities defined by NHDL files 205 and SHDL files 207. As with NHDL files 205 and SHDL files 207, PHDL files 203 can optionally be derived from corresponding PP PHDL (pre-processor PHDL) files 202 by a pre-processor 208a.

As indicated in FIG. 2 by arrows, NHDL files 205 and PHDL files 203 can be directly processed by a HDL compiler 214 to include instances of the entities defined by such files in a functional simulation model 216. While NHDL files 205 and PHDL files 203 can be directly processed by a HDL compiler 214 (because they follow the full syntactic and semantic rules of the native HDL being employed), SHDL files 207 cannot be directly processed by HDL compiler 214. In order to permit instances of entities defined by SHDL files 207 to be included in functional simulation model 216, the content of each SHDL file 207 is processed by a stitching engine 210 to, among other things, convert simplified SHDL storage element instantiations found within the SHDL file 207 into NHDL storage element instantiations, connect clock signals to those NHDL storage elements, elaborate port maps on entities instantiated by the SHDL entity, and/or provide necessary signal declarations to produce a legal derived NHDL file 212 for the given SHDL file 207. In at least some embodiments, stitching engine 210 performs these functions by examining PHDL files 203, NHDL files 205, and SHDL files 207 to determine the proper ports to be added to a SHDL entity to clock the newly instantiated NDHL storage element(s) and to properly elaborate the port maps for the NHDL and/or SHDL entity or entities instantiated within the SHDL entity. As a result of this processing, stitching engine 210 generates derived NHDL files 212, which are passed to HDL compiler 214 along with PHDL files 203 and NHDL files 205 to be compiled to produce a functional simulation model 216. An exemplary process by which stitching engine 210 processes SHDL files 207 to obtain derived NHDL files 212 is described below with reference to FIGS. 22 and 23A-23B. In at least some embodiments, stitching engine 210 additionally processes expressions of the logic designer's intent in refinement found within NHDL files 205 and SHDL files 207 to produce to a set of intent NHDL files 213 as described below with reference to FIGS. 20-21. The expression of designer's intent set forth in NHDL files 205 and SHDL files 207 can be subsequently overridden by directives in control files 221, which may be pre-processed prior to input into stitching engine 210 by a pre-processor 208e. As indicated, intent NHDL files 213 may also be provided as an input to the HDL compiler 214 to control the generation of a functional simulation model 216.

Derived NHDL files 212, NHDL files 205, PHDL files 203 and intent NHDL files 213 may alternatively or additionally be processed by a transform engine 218. As described in detail below with reference to FIG. 24, transform engine 218 transforms these HDL files into "physical design" HDL (PDHDL files) 222 defining a physical representation of the integrated circuit design complete with technology-dependent pervasive and other non-functional-intent structures. The operation of transform engine 218 can be controlled by control files 220, which may, for example, include various "recipes" for controlling the creation of the integrated circuit design. As indicated, in some embodiments, control files 220 may optionally be processed by a pre-processor 208d to unroll code or support other optimizations.

Referring now to FIG. 3, design methodology 200 continues by further processing the integrated circuit design, which is now fully defined by PDHDL files 222. As shown, PDHDL files 222 are processed by a logic synthesis engine 302 to create a realizable integrated circuit design from the functions described in the PDHDL files 222. During this process, various simple optimizations/alterations may be made to the various pervasive structures added to the design to produce PHDL files 222. In particular, the scan chain among a set of storage elements may be reordered based on the assigned physical placement of the storage elements in the integrated circuit floorplan. Logic synthesis engine 302 produces a gate list representation 304 of the integrated circuit design. This gate list representation 304 can then processed by a chip integration tool 306 to produce a detailed final chip design 308 representing the exact circuit layouts on the various layers within the integrated circuit, which may be fabricated in an integrated circuit chip utilizing the selected technology node.

The processing of PDHDL files 222 by logical synthesis engine 302 additionally generates control files 310 that document the changes to the design imposed by logic synthesis engine 302. These changes are then utilized by post-synthesis physical design (PD) writer engine 312 to update PDHDL files 222 to obtain post-synthesis PDHDL files 314. It is important to note that post-synthesis PDHDL files 314 still represent the integrated circuit design in a set of fully legal HDL files defining the design utilizing native HDL syntax rather than as a "flattened" collection of gates (as in gate list representation 304). However, post-synthesis PDHDL files 314 do include within the design all the technology-specific support structures, such as pervasive logic structures. As such, when post-synthesis PDHDL files 314 are compiled by an HDL compiler 316, the resultant post-synthesis technology-elaborated simulation model 318, which can be utilized to simulate a physical realization of the design, is (or should be) fully equivalent in behavior to the gate list representation 304 generated by logic synthesis engine 302. This equivalence can be formally verified, for example, by an equivalence checker 320.

Figure 4A:
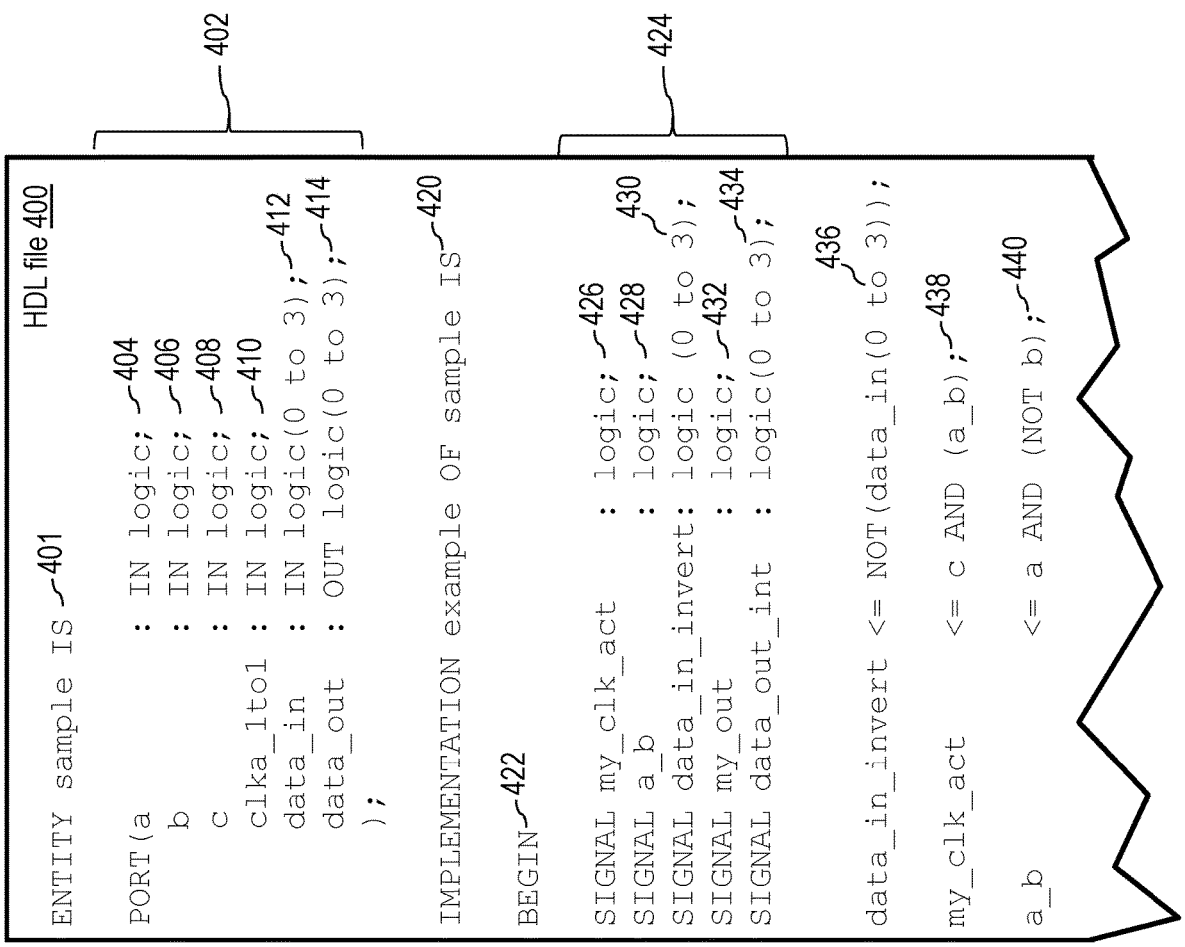
Figures 5, 6:
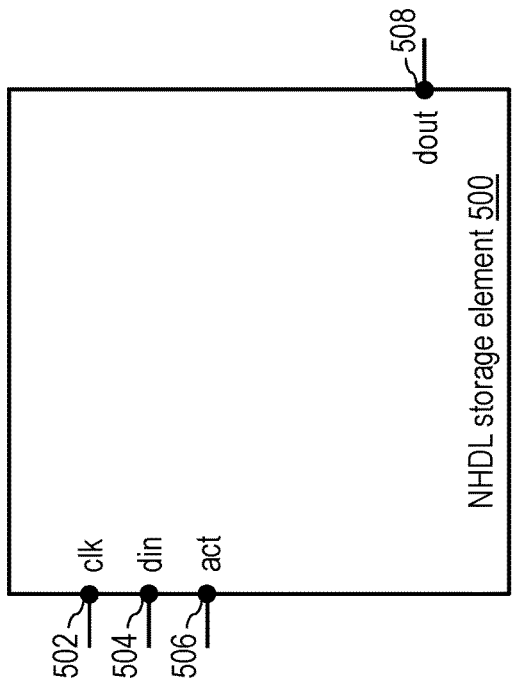
FIG. 5 is a graphical representation of an exemplary normalized HDL (NHDL) storage element in accordance with one embodiment.
FIG. 6 illustrates exemplary HDL code that can be utilized to instantiate an instance of the NHDL storage element of FIG. 5 in accordance with one embodiment.

Referring now to FIGS. 4A-4B, a conventional HDL file 400 that declares an example of an entity for a modular circuit design is depicted. HDL file 400 may be, for example, one of NHDL files 205. In the depicted example, HDL file 400 includes statements employing a generalized HDL syntax that is similar to, but does not conform exactly to the syntax of a particular conventional HDL, such as Verilog and VHDL. In other embodiments, HDL file 400 may be expressed in a conventional HDL.

HDL file 400 begins with an entity declaration 401 that specifies the entity name of the entity defined by HDL file 400, which in this case is "sample." Immediately following entity declaration 401 is a port declaration section 402 that specifies each of the ports of the entity. Port declaration section 402 begins with the term PORT followed by a set of parenthesis enclosing one or more port declarations, such as port declarations 404-414. Each port declaration takes the form PORT NAME: DIRECTION TYPE (SIZE). Thus, port declarations 404-414 declare that entity "sample" has six ports named "a," "b," "c," "clka_1to1," "data_in," and "data_out," respectively. In this case, the first five of these ports are input ports (as indicated by a DIRECTION of IN) and the sixth port is an output port (as indicated by a DIRECTION of OUT). In at least some embodiments, an additional DIRECTION of BIDI (bi-directional) may also be supported. In this example, all six ports have a TYPE of LOGIC. Other suitable port types such as BOOLEAN may, of course, be employed. Port declarations 404-410 implicitly indicate the associated ports are single-bit ports by omitting an explicit SIZE. Ports "data_in" and "data_out," however, are 4-bit ports, as indicated by the SIZE parameter of (0 to 3) in port declarations 412 and 414.

Following port declaration section 402 is an implementation declaration 420 that initiates the declaration of one of possible implementations of entity "sample." Implementation declaration 420 corresponds to an "architecture" declaration in VHDL. In this case, the implementation is assigned an implementation name of "sample." Following implementation declaration 420 the implementation is described between an enclosing statement pair formed by begin statement 422 and end statement 492. The implementation description begins with a signal declaration section 424 that declares all internal logic signals within the implementation of entity "sample." Each signal declaration 426-434 in signal declaration section 424 takes the form SIGNAL NAME: TYPE (SIZE). Thus, signal declarations 426-434 declare that implementation "example" of entity "sample" has five internal logic signals named "my_clk_act," "a_b," "data_in_invert," "my_out," and "data_out_int," respectively. In this example, all five signals have a TYPE of LOGIC. Other suitable signal types such as BOOLEAN may, of course, be employed. Signal declarations 426, 428, and 432 implicitly indicate the associated signals are single-bit signals by omitting an explicit SIZE. Signals "data_in_invert" and "data_out_int," however, are 4-bit signals, as indicated by the SIZE parameter of (0 to 3) in signal declarations 430 and 434.

Following signal declaration section 424 are a series of statements, for example, defining primitive logic within the implementation, specifying a signal reassignment, or instantiating a child entity enclosed by the entity "sample" in the implementation "example." For example, logic statement 436 assigns to signal "data_in_invert" a value obtained by inverting the input value presented on port "data_in," logic statement 438 assigns to signal "my_clk_act" a value obtained by performing a logical AND function on signal "a_b" and the value present on input port "c," and logic statement 440 assigns, to signal "a_b," a value obtained by performing a logical AND function on the value present on input port "a" and the inversion of the value present on input port "b." A subsequent logic statement 490, shown in FIG. 4B, assigns a value to output "data_out" derived from the outputs of two child entities instantiated within entity "sample" as discussed below.

In this example, HDL file 400 instantiates a first child entity by entity instantiation 450 and instantiates a second child entity by entity instantiation 470. Each entity instantiation begins with an entity declaration 452 or 472 of the form INSTANCE NAME:ENTITY NAME. Thus, for example, entity declaration 452 declares a child entity "n_dff" having instance name "latch0," and entity declaration 472 declares a child entity "my_logic_func" having instance name "func12x." Instance names are constrained to be unique within a given parent entity.

For polymorphic entities capable of being instantiated with differing attributes, the associated entity instantiation can include a generic map statement, such as generic map statement 454. In this example, the two attributes of the polymorphic child entity "n_dff" established by generic map statement 454 are the width of the latch (e.g., 4 bits) and its initial value (e.g., 0). The entity instantiation 450 or 470 next includes a port map section 456 or 474 enumerating within enclosing parenthesis a series of port declarations (e.g., port declarations 458-464 or port declarations 476-482) explicitly declaring each port of the child entity and the signal or port of the parent entity to which that port is connected. In this example, each port declaration of a child entity takes the form of PORT:SIGNAL/PORT NAME. Thus, for example, port declarations 458-464 declare ports "CLK," "ACT," "DIN," and "DOUT" on instance "latch0" and respectively connect these ports to port "clka_1to1" and signals "my_clk_act," "data_in_invert," and "data_out_int" in the parent entity. Similarly, port declarations 476-482 declare ports "a," "b," "c," and "out" on instance "func12x" and respectively connect these ports to ports "a," "b," "c" and signal "my_out" in the parent entity. It should be noted that in some cases, a port name of a port on the child entity may match the port/signal name in the parent entity (e.g., as in port declarations 476-480). In other cases, the port name of the port on the child entity and the port/signal name in the parent entity do not match (e.g., as with port "CLK" and signal "clka_1to1" in port declaration 458). Regardless of whether a port name on the child entity matches a port/signal name on the parent entity, conventional HDLs typically require full elaboration of the port map in HDL file 400.

With reference now to FIG. 5, there is illustrated a graphical representation of an exemplary NHDL storage element 500 in accordance with one embodiment. FIG. 5 specifically illustrates that NHDL storage element 500 (e.g., a latch) provides the minimum set of ports to support the functional intent for NHDL storage element 500. In this example, these ports (represented in each of the figures by a dot on the boundary of an entity or storage element) include a clock port (clk) 502, a clock gate port (act) 506, a data input port (din) 504, and a data output port (dout) 508. It should be noted that NHDL storage element 500 omits any and all technology-specific ports, so that NHDL storage element 500 can serve as a minimum canonical form of a storage element.

Despite the simplicity of the form of NHDL storage element 500, a significant amount of manual textual data entry is required to instantiate NHDL storage element 500 in a conventional HDL. For example, FIG. 6 illustrates a HDL entity instantiation 600 that can be utilized to instantiate an instance of the NHDL storage element of FIG. 5 in accordance with one embodiment.

Entity instantiation 600 begins with an entity declaration 602 that declares an entity "n_dff" having an instance "latch0." Entity declaration 602 is followed by a generic map statement 604 establishing the width of the latch (e.g., 4 bits) and its initial value (e.g., 9). Entity instantiation 600 next includes a port map section 606 enumerating within enclosing parenthesis a series of port declarations 608-614 explicitly declaring each port of the entity and the signal or port of the parent entity to which that port is connected. Thus, in this example, port declarations 608-615 declare the four canonical ports "CLK," "ACT," "DIN," and "DOUT" and respectively connect these ports to signals or ports "clkb_3to1," "other_clk_gate," "E," and "D," respectively, where these latter two ports/signals are defined as each including 4 bits. Following port map section 606, entity instantiation 600 includes an attribute declaration 620 that establishes an attribute name and associates a string value with this attribute name. The attribute string value defines one or more characteristics of entity "n_dff." In this case, these characteristic may be expressed in the form of keyword/value pairs. In this particular example, attribute declaration 620 establishes the attribute "hard_latch," which enumerates the characteristics HARD (i.e., whether the latch is a metastable hardened latch) and RING (i.e., the scan chain to which the latch belongs). In this case, keyword HARD is assigned the value YES, and keyword RING is assigned the value FDNC (functional).

A few points should be noted regarding entity instantiation 600 of FIG. 6. First, despite the simplicity of NHDL storage element 500, the corresponding entity instantiation 600 is lengthy and complex, particularly in the context of the requirement that logic designers manually type such code for each entity in an integrated circuit design potentially containing thousands or millions of such entities. Second, clocking signals, such as "clkb_3to1" and "other_clk_gate," which are connected to clock port 502 and clock gate port 506, respectively, are required by the HDL to be explicitly connected to their ports in each entity instantiation despite the fact that these clocking signals are frequently shared by many entities in a given clock region of a design.

In order to relieve the manual typing burden on logic designers and to reduce associated human data entry errors, design methodology 200 supports the use of a simplified HDL (SHDL) in SHDL files 207 to define and instantiate design entities in an integrated circuit design. As noted above, SHDL files 207 describing SHDL entities can be processed by stitching engine 210 to obtain, in an automated manner, derived NHDL files 212 that are fully legal HDL files. These derived NHDL files 212 define design entities that are logically and functionally equivalent to those defined by the input SHDL files 207.

Figures 7, 8:
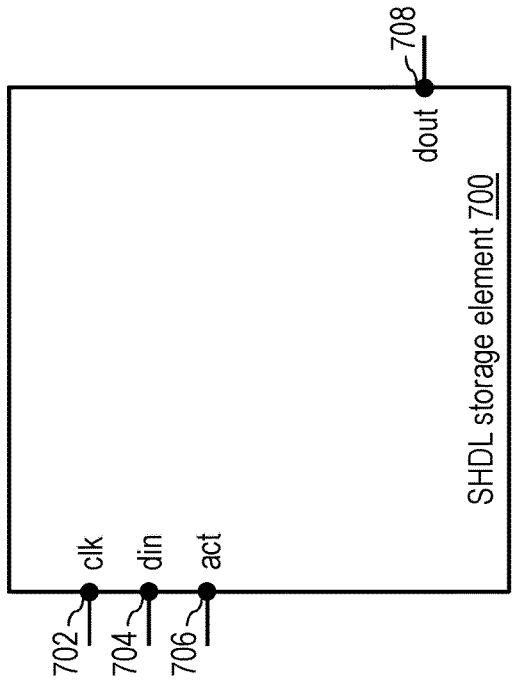
FIG. 7 is a graphical representation of an exemplary simplified HDL (SHDL) storage element in accordance with one embodiment.
FIG. 8 depicts exemplary HDL code that can be utilized to define SHDL storage elements in accordance with one embodiment.

With reference now to FIG. 7, there is illustrated a graphical representation of an exemplary SHDL storage element 700 that may be instantiated utilizing a statement in a SHDL file in accordance with one embodiment. As can be seen by comparison of FIG. 7 and FIG. 5, SHDL storage element 700 (e.g., a latch) of FIG. 7 is identical to NHDL storage element 500 of FIG. 5 because, like NHDL storage element 500, SHDL storage element 700 is intended to include the minimum set of port required to model the logical designer's functional intent for the given storage element. As shown, this minimum set of ports includes a clock port (clk) 702, a clock gate port (act) 706, a data input port (din) 704, and a data output port (dout) 708.

The designer data entry requirements for instantiating an SHDL storage element 700 in an SHDL file are significantly reduced compared to those necessary to enter a NHDL storage element 500 in an NHDL file (or an SHDL file). For example, FIG. 8 depicts an exemplary SHDL code fragment 800 that can be utilized in an SHDL file 207 to define three SHDL storage elements in accordance with one embodiment. In SHDL code fragment 800, SHDL storage element (SE) declaration 802 employs a syntax of the general form OUTPUT SIGNAL NAME (SIZE)<=[INPUT SIGNAL NAME (SIZE)].INIT_TYPE"INIT VALUE" to declare a storage element (indicated by the use of square brackets) that receives signal "Y" as an input and produces signal "X" as an output. It should be noted that, in this example, the instance name of the storage element and all port names are unspecified and can be automatically supplied by stitching engine 210. Stitching engine 210 can additionally infer that the storage element is a single-bit storage element and has an initial value (INIT VALUE) of '0' based on the absence of an explicit specification of SIZE, INIT_TYPE, and INIT VALUE. The appropriate connections for clock port 702 and clock gate port 706 cannot be arbitrarily inferred by stitching engine 210 and are set for one or more storage elements within a SHDL file by a SHDL attribute or variable declaration, as described further below with reference to FIG. 9.

This allows the data entry specifying connections that are likely common among a number of storage elements in a design to be entered in one place and amortized across the sharing storage element instantiations. It should be appreciated that the typing burden on a logic designer associated with instantiating a storage element utilizing a SHDL storage element (SE) declaration is greatly reduced as compared to the HDL entity instantiation 600 of FIG. 6.

SHDL code fragment 800 additionally includes SHDL SE declaration 804, which declares a SHDL storage element that receives, as input, a 4-bit signal "Q" and produces, as output, a 4-bit signal "P." The constant hexadecimal value, X"F", after the period following the closing bracket specifies the initial value for the storage element, in this case hexadecimal F. The 'X' in the constant specifies the constant is hexadecimal. Decimal constants are simple entered with no leading qualifier and binary constants are precede by 'B' instead of the 'X' used in hexadecimal. In absence of a specified constant, stitching engine 210 applies an initial value of '0' by default.

SHDL code fragment 800 additionally includes a SHDL SE declaration 806, which declares a SHDL storage element that receives, as input, a 17-bit signal "m" and produces, as output, a 17-bit signal "L." The inclusion of the "@.my_inst_name" following the output signal name specifies that the logic designer desires to assign the instance name "my_inst_name" to the storage element rather than to allow stitching engine 210 to assign an automatically generated name to the storage element instance.

With reference now to FIG. 9, there is illustrated an exemplary SHDL file 900 that employs an improved syntax to define storage element attributes and storage element variables and to declare storage elements in accordance with one embodiment. As noted above, storage elements can have a variety of characteristics, including, those set forth as keyword/value pairs in Table I, below.

TABLE I

| Keyword | Description | Possible values |
|---|---|---|
| REGION | Clocking region that sources the clock for this storage element | Project specific string names specifying different clock regions in the design |
| RATIO | Specifies clock divide down ratio within the given clock region | Project specific string names |
| ACT | Specifies functional clock gating signal (if any) for this storage element | Signal name, '0', or '1' |
| SCAN | Specifies whether or not the storage element is to be connected to a scan ring | YES, NO, or MAYBE |
| RING | Specifies to which of the scan rings in the design the storage element is to be connected | Project specific string names (e.g., FUNC, MODE, etc.) |
| HARD | Specifies whether or not to use a metastable hardened latch | YES or NO |
| ENDIAN | Specifies whether the internal storage elements are numbered by big-endian or little-endian | BIG or LITTLE |

Of the storage elements characteristics, for a given integrated circuit design or for most integrated circuit designs, certain default values are predetermined by stitching engine 210 and applied to all declared storage elements unless a different value is explicitly specified in an SHDL attribute declaration or SHDL variable declaration. For example, in addition to the default latch size of 1-bit and initial value of '0,' stitching engine 210 may apply a default value of '1' to attribute ACT, a default value of NO to attribute HARD, a default value of BIG to attribute ENDIAN, and a default value of YES to attribute SCAN. For others of these attributes (e.g., those requiring text strings), stitching engine 210 may not have predetermined default values.

In accordance with at least some embodiments, a logic designer can either establish or modify the values applicable to storage elements declared in a SHDL file through use of SHDL attribute declarations and SHDL variable declarations. In the illustrated example, SHDL attribute declarations take the form of:

@@LATCH (Charateristic1=Value1,
 Characteristic2=Value 2, . . . ).

This SHDL attribute declaration is then interpreted by stitching engine 210 to set or to modify the values of the specified characteristics for all SHDL storage elements declared within the SHDL file after (i.e., below) the SHDL attribute declaration unless changed. Thus, for example, SHDL attribute declaration 902 establishes values for the REGION, RATIO, and ACT applied by stitching engine 210 to the SHDL storage element declared by SE declaration 904. It should be noted that REGION and RATIO together specify the appropriate clock signal to be connected to clock port 702 of the SHDL storage element, and ACT specifies the appropriate signal to connect to clock gating port 706 of the SHDL storage element. When SHDL file 900 is processed by stitching engine 210, stitching engine 210 also applies the values for REGION and ACT specified in SHDL attribute declaration 902 to the SHDL storage element declared by SE declaration 908; however, the value for RATIO applicable to the SHDL storage element declared by SE declaration 908 is updated by intervening SHDL attribute declaration 906.

FIG. 9 further illustrates that SHDL variable declarations can be utilized to set characteristic values for a single latch declaration without modifying the generally prevailing attribute values. In this example, SHDL variable declarations, such as SHDL variable declarations 910, 912, and 914, employ a syntax as follows:

@@LATCH.VariableName (Characteristic1=Value1,
 Characteristic2=Value 2, . . . ).

Thus, for example, SHDL variable declaration 910 declares a variable with variable name HARD that can be utilized to set the storage element characteristic HARD to the value of YES only for a subsequent SE declaration that references variable HARD.

SE declaration 918 illustrates the effect of SHDL variable declarations when referenced by a SE declaration. In this example, SE declaration 918 defines a SHDL storage element that receives a 4-bit input signal E and produces a 4-bit output signal D. The three keywords HARD, FDNC, and CLKB_4to1 referenced by the use of @ statements on the output side of SHDL SE declaration 918 apply the values defined by SHDL variable declarations 910, 912, and 914, respectively, meaning that stitching engine 210 will instantiate a multistable hardened storage element that belongs to the functional scan chain, has a clock port connected to a clock signal "clkb_4to1," and has an initial value of x'9'. Stitching engine 210 will additionally connect the clock gating port to the signal "other_clk_gate" based on the value specified by SHDL attribute declaration 916. It should again by noted that SHDL variable declarations 910-914 will have no effect on the values of subsequently declared SHDL storage elements that do not reference the declared variables. It should also be noted that SHDL attribute declarations and SHDL variable declarations also have no effect on NHDL storage elements, which may also be instantiated in SHDL files.

Referring now to FIG. 10, there is depicted an exemplary SHDL file 1000 that declares an example of an entity in accordance with one embodiment. In order to promote understanding of the value of the SHDL syntax introduced herein, the entity declared is the same as that declared in HDL file 400 of FIGS. 4A-4B, above.

SHDL file 1000 begins with an entity declaration 1002 that specifies the entity name of the entity defined by SHDL file 1000, which again in this case is "sample." Immediately following entity declaration 1002 is a port declaration section 1004 that specifies each of the ports of entity "sample." Port declaration section 402 omits the redundant term PORT and enclosing parenthesis and simply contains succinct port declarations 1006-1010 and 1014-1016. Each port declaration takes the form PIN DIRECTION NAME (SIZE), where the term PIN identifies the statement as a port declaration and DIRECTION can be input (I), output (O), or bi-directional (B). Thus, port declarations 1006-1010 and 1014-1016 declare that entity "sample" has five ports named "a," "b," "c," "data_in," and "data_out," respectively, of which four are input ports (as indicated by a DIRECTION of I) and the fifth port is an output port (as indicated by a DIRECTION of O). As before, port declarations 1006-1016 implicitly indicate the associated ports are single-bit ports by omitting an explicit SIZE. Ports "data_in" and "data_out," however, are 4-bit ports, as indicated by the SIZE parameter of (0 to 3) in port declarations 1014 and 1016. As noted by reference number 1012, SHDL file 1000 does not contain (and need not contain) an explicit port declaration for a logical clock signal (i.e., "clka_1to1") because such clock ports can be added automatically by stitching engine 210, as discussed further below, for example, with respect to FIGS. 23A-23B.

Following port declaration section 1004 no implementation declaration (like implementation declaration 420) or begin and end statements (like begin statement 422 and end statement 492) are employed since SHDL file 1000 only enumerates a single implementation. SHDL file 1000 similarly omits an explicit signal declaration section (e.g., like signal declaration section 424) because the use of functional signal names in logic statements is sufficient to enable stitching engine 210 to determine what functional signals are to be declared in derived NHDL files 212.

SHDL file 1000 can next include one or more statements defining primitive logic within the entity, specifying a signal reassignment, or instantiating a child entity enclosed by the entity "sample." In this example, SHDL file 1000 includes logic statements 1020-1024 and 1050 respectively corresponding to logic statements 436-440 and 490, described above. SHDL file 1000 additionally includes a SHDL SE declaration 1032 to simply and succinctly declare, utilizing the syntax described above with reference to FIG. 8, an SHDL storage element that latches 4-bit input signal "data_in_internal" and produces a 4-bit output signal "data_out_internal." SHDL SE declaration 1032 further specifies an initial value for the storage element of x'0'. In order to appropriately specify the inputs of clock port 702 and clock gate port 706, SHDL SE declaration 1032 is prefaced by an attribute declaration 1030 specifying the connection of clock port 702 of the SHDL storage element to a logical clock signal derived from clock signal "clka" utilizing a 1:1 frequency ratio and the connection to the clock gate port 706 of the SHDL storage element to signal "my_clk_act."

The declaration within SHDL file 1000 of the instance "func12x" of entity "my_logic_func" is similarly greatly abbreviated as compared to HDL file 400. In particular, entity instantiation 1040 begins with an entity declaration 1042 that, like entity declaration 472, declares instance "func12x" of entity "my_logic_func." The associated port map 1044, however, is significantly shorter than corresponding port map 474. This abbreviation is possible because stitching engine 210 is preferably configured to connect, by default, signals in the parent entity sample having names matching those of ports of child instance "my_logic_func." Accordingly, port map 1044 need only declare the port "out" on instance "func12x" and specify its connection to signal "my_out" in the parent entity, as these names do not match.

With reference now to FIG. 11, there is illustrated a graphical representation of an exemplary PHDL storage element 1100 in accordance with one embodiment. As can be seen by comparison of PHDL storage element 1100 with PHDL storage element 500 of FIG. 5, PHDL storage element 1100 has significant additional complexity in that in addition to a data input port 1116, data output port 1120, and clock ports 1108, 1110 (L1clk and L2clk, respectively), PHDL storage element 1100 includes additional technology-specific ports that, while required for a physical realization of an integrated circuit, do not serve the logic designer's functional intent. These additional ports include power-related ports, such as power port 1102 (vdd) and ground port 1104 (gnd). In addition, these additional ports include scan input port 1106 (scan_in) and scan output port 1118 (scan_out) supporting connection of PHDL storage element 1100 in a scan chain, as well as two scan clock ports 1112, 1114 for connection of scan clocks (scanL1clk and scanL2clk). While clock ports 1108 and 1110 serve to provide the functional clocking for PHDL storage element 1100, this same functionality is instead provided in a single clock signal in NHDL storage element 500. The specific set of technology-specific signals illustrated for PHDL storage element 1100 is merely representative and many possible sets of technology-specific signals may be possible for a given technology or technology generation.

As will be appreciated, the declaration of such a PHDL storage element 1100 in a PHDL file 203 is substantially more complex and even more tedious to manually code than the NHDL storage element declaration section 600 of FIG. 6. Further, the declaration of a PHDL entity generally has ports associated with non-functional-intent logic that are, in general, incompatible with a functional simulation model 216 constructed from NHDL modules that follow NHDL conventions. Such PHDL entities would explicitly reference technology-specific ports and signals either absent from or implemented and/or named differently than the signals in a functional simulation model. This incompatibility poses a significant issue in that, in modern design methodologies, it is common for intellectual property (IP) blocks (i.e., large functional portions of an overall integrated circuit design) to be licensed-in from third parties, and these IP blocks are generally received in the form of a fully elaborated PHDL entity.

In accordance with one aspect of the disclosed inventions, the incompatibility between PHDL entities and models derived from native and derived NHDL entities is resolved by supporting the incorporation of PHDL entities directly into a functional simulation model 216 by instantiating each PHDL entity to be included in functional simulation model 216 within an enclosing "wrapper" of a NHDL entity among other conventions and mechanisms described below. Referring now to FIG. 12, there is depicted a high-level block diagram of an exemplary NHDL entity 1200 that encapsulates a PHDL entity 1202 for inclusion in a functional simulation model 216 in accordance with one embodiment.

As will be appreciated, PHDL entity 1202 may include functional-intent logic, non-functional intent logic, and/or other hierarchically instantiated PHDL entities, which, in turn, may include functional-intent logic, non-functional intent logic, or still further PHDL entities. In the example of FIG. 12, PHDL entity 1202 includes PHDL entities 1204, 1210, and 1212, as well as dataflow logic 1208 and clock control logic 1214, which generates a signal "func_hold" sourcing the "act" port of NHDL storage element 500 as described above with reference to FIG. 5. PHDL entity 1204 is a PHDL storage element as described above with reference to FIG. 11, PHDL entity 1210 is local clock buffer (LCB) control logic, and PHDL entity 1212 is a LCB controlled by LCB control logic 1210. To incorporate PHDL entity 1202 into a functional simulation model 216, the PHDL file 203 defining PHDL entity 1202 is not modified; instead, the NHDL file 205 defining NHDL entity 1200 is constructed to appropriately connect functional-intent inputs and outputs of PHDL entity 1202 and to appropriately manage the non-functional-intent inputs and outputs of PHDL entity 1202.

The input ports of PHDL entity 1202 can be generally categorized as including: (1) functional-intent input ports (e.g., "gclk") having a direct analog in the larger functional simulation model 216, (2) functional-intent input ports (e.g., "clka_2o1_hold") having no direct analog in the larger functional simulation model 216, and (3) non-functional-intent input ports (e.g., scan-related inputs (e.g., "scan_in" and "scan_en"), local clock buffer (LCB) control signals ("lcbctrl(0to3)", etc.). For the first category of input ports, the NHDL file 205 defining NHDL entity 1200 includes HDL statements directly connecting the input ports of PHDL entity 1202 to the appropriate input ports of NHDL entity 1200 and from there to the larger functional simulation model 216 (e.g., HDL statements connecting signal "clka_1to1" to "gclk"). For each input port in the second category of input ports, the NHDL file 205 includes HDL statement(s) instantiating shim logic (e.g., NHDL clock shim entity 1206) in NHDL entity 1200 that produces, based on signals present in functional simulation model 216, a suitable input signal (e.g., "clka_2to1_hold") for connection to an input port of PHDL entity 1202. For the third category of input port, the NHDL file 205 defining NHDL entity 1200 specifies no signal connections. Instead, the PHDL file 203 defining PHDL entity 1202 contains appropriate HDL statements to provide default values for such input ports, if unconnected. For example, these HDL default value statements may tie the "vdd" port and "gnd" port to values of '1' and '0,' respectively. Similarly, the HDL default value statements may default ports "scan_in," "lcbctrl(0to3)," and "scan_en" to values of '0', '0000,' and '0,' respectively.

The output ports of PHDL entity 1202 can similarly be generally categorized as including: (1) functional-intent output ports having a direct analog in the larger functional simulation model 216, (2) functional-intent output ports having no direct analog in the larger functional simulation model 216, and (3) non-functional-intent output ports (e.g., "scan_out"). For the first category of output ports, the NHDL file 205 defining NHDL entity 1200 includes HDL statements directly connecting the output ports to the appropriate output ports of entity 1200 and from there to signals in the larger functional simulation model 216. For output ports in the second category, the NHDL file 205 defining NHDL entity 1200 can include HDL statement(s) defining shim logic (not shown here) in NHDL entity 1200 that produces a suitable output signal for connection to other logic in the larger functional simulation model 216. For the third category of output port, the NHDL file 205 defining NHDL entity 1200 specifies no signal connections, simply leaving those output ports sinkless (e.g., "scan_out").

The encapsulation of PHDL entities in NHDL entities in the described manner, in addition to solving the inherent incompatibility between PHDL entities and functional simulation models 216, also advantageously enables incremental, bottom-up development of a model of a larger scope of integrated circuit design while retaining the HDL files defining the model in a form that can be simulated at each increment of design development via functional-intent-only simulation. For example, returning briefly to design methodology 200 of FIGS. 2-3, the team or teams of logic and physical designers responsible for a smaller first unit instantiated within a larger second unit of an integrated circuit design may develop the design of the first unit through design methodology 200 to the point of producing a PHDL file defining the first unit and instantiating technology-specific structures within the first unit. This PHDL may be, for example, a PHDL file 203, PDHDL file 222, or post-synthesis PDHDL file 314. Alternatively, the PHDL file defining the first unit may be licensed-in as an IP block for inclusion within the second unit. In either case, it would be desirable to be able to simulate the first unit within the context of a model of the larger second unit without requiring the entire model to be composed of fully technology-enabled design entities. As will be appreciated by those skilled in the art, simulation of such a fully technology-elaborated simulation model, while perhaps required at certain stages of design methodology 200, is much less efficient than simulation of only the functional-intent portion of the model via functional simulation model 216. In accordance with the disclosed inventions, the PHDL entity corresponding to the first unit can be encapsulated in a NHDL "wrapper" entity (e.g., defined by a NHDL file 205 or derived NHDL file 212) to build a functional simulation model 216 of the larger second unit, which may include (instantiate) the NHDL "wrapper" entity. This technique can be repeated any desired or required number of times at varying levels of the design hierarchy to build up a functional simulation model of desired scope that is suitable for functional-only simulation.

Figure 13A:

With reference now to FIGS. 13A-13B, there is depicted an exemplary NHDL file 1300 including an expression of design refinement intent in accordance with one embodiment. NHDL file 1300 may be among the NHDL files 205 received as an input by stitching engine 210, as shown in FIG. 2.

NHDL file 1300 begins with an entity declaration 1301 that specifies the entity name of the entity defined by NHDL file 1300 is "sample2." Immediately following entity declaration 1301 is a port declaration section 1302 that specifies each of the ports of entity "sample2." Port declaration section 1302 includes port declarations 1304-1310 of the form PORT NAME: DIRECTION TYPE that declare four ports named "x," "y," "z," and "m." In this case, the first three of these ports are input ports (as indicated by a DIRECTION of IN), and the fourth port is an output port (as indicated by a DIRECTION of OUT).

Following port declaration section 1302 is an implementation declaration 1312 that initiates the declaration of the implementation "example" of entity "sample2." Following implementation declaration 420, the implementation is described between an enclosing statement pair formed by begin statement 1320 and end statement 1362. The implementation description begins with a signal declaration section 1322 that declares all internal logic signals within the implementation of entity "sample2," namely, "e," "x_y," and "y_z."

Following signal declaration section 1322 are a series of statements, for example, defining primitive logic within the implementation, specifying a signal reassignment, or instantiating a child entity enclosed by the entity "sample2" in the implementation "example." For example, logic statement 1334 assigns to signal "Y_Z" a value obtained by performing a logical OR of input signals "Y" and "Z," and logic statement 1336 assigns to signal "E" a value obtained by performing a logical AND on input signal "X" and signal "Y_Z."

In this example, HDL file 1300 also instantiates a first child entity (i.e., instance "logic13x" of entity "OR2") by entity instantiation 1338 and instantiates a second child entity (i.e., instance "logic14x" of entity "XOR2") by entity instantiation 1350. Each entity instantiation begins with an entity declaration 1340 or 1352 followed by a port map section 1342 or 1354 enumerating within enclosing parenthesis a series of port declarations (e.g., port declarations 1344-1348 or port declarations 1356-1360) explicitly declaring each port of the child entity and the signal or port of the parent entity to which that port is connected.

The present disclosure appreciates that for at least some design entities, such as that defined by NHDL file 1300, a designer may desire to simulate alternative logic in certain regions of the design. That is, rather than defining a full alternative implementation/architecture of the entity, the designer may want to make targeted changes within an implementation, for example, to replace a generic multiplier, generic adder, or other primitive component with a more specific physical implementation of the corresponding logic function (e.g., a Dadda or Wallace tree multiplier in place of a generic multiplier or a ripple-carry adder or carry-save adder in place of a generic adder). As other examples, the designer may desire to rewrite or restructure a logic equation, remove or add a signal, remove or add an entity instantiation, or change an assignment of a pin.

In order to support this functionality, the disclosure provides support for a designer to directly provide an expression of the designer's refinement intent for a particular region of the design for a particular step in design methodology. In the example of FIGS. 13A-13B, the designer demarcates within NHDL file 1300 a region of interest in a given implementation for which an alternative design may be desired to be used during the refinement performed by stitching engine 210. In the exemplary syntax, the designer does so by inserting into NHDL file 1300 at the relevant locations an enclosing intent begin statement 1332 signifying the beginning of the region of interest and an intent end statement 1364 signifying the end of the region of interest. Each of statement 1332 and 1364 includes the command @@INTENT followed by a name assigned to the region of interest (e.g., "my_intent"). It should be noted that, in the example of FIGS. 13A-13B, statements 1332 and 1364 are entered into NHDL file 1300 as HDL comments, as indicated by the leading double dashes ("—"). As such, these HDL comments will be ignored if NHDL file 1300 is compiled by an HDL compiler (e.g., HDL compiler 214). In the exemplary syntax of FIGS. 13A-13B, the designer may direct that an alternative design (or "intent implementation") for the region of interest be used through inclusion in NHDL file 1300 of a use statement 1330. In this example, use statement 1330 includes the command @@USE IMPLEMENTATION followed by the name of the alternative design for the region of interest (intent implementation "my_intent.new_impl"). Again, use statement 1330 is entered as an HDL comment designated by leading double dashes.

As shown specifically in FIG. 13B, the designer may define the alternative design for the region of interest in an alternative region declaration 1370, which is expressed in HDL comments. Alternative region declaration 1370 is bounded by an intent implementation declaration 1372 including the command @@IMPLEMENTATION and an end implementation declaration 1398 including the command @@END IMPLEMENTATION. Between these declarations, an alternative design (intent implementation) reflecting the designer's refinement intent for the region of interest is defined. In this example, the alternative design includes two logic statements 1374, 1376 and two entity instantiation sections 1380, 1390. As can be seen by comparison of logic statements 1336 and 1374, logic statement 1374 rewrites the logic equation for generating signal "E" and destroys internal signal "Y_Z." Logical statement 1376 eliminates instantiation of instance "logic13x," resulting in a change in the instance hierarchy. Entity instantiation section 1390, which includes entity declaration 1392 and a port map including port declarations 1394 and 1396, instantiates a new entity (i.e., instance "logic15x" of entity "BUF"), again changing the instance hierarchy. It should be noted that this new entity instantiation also generates as an output a new signal "e_buf" via port declaration 1396. Finally, entity instantiation section 1380, which includes entity declaration 1382 and a port map including port declarations 1384 to 1388, modifies an existing entity (i.e., instance "logic14x" of entity "XOR2") by changing the assignment of ports "int" and "out" to signals "e_buf" and "m," respectively, in port declaration 1386.

Based on the presence of a use statement 1330 in NHDL file 1300, stitching engine 210 performs refinement on NHDL file 1300 to produce a corresponding intent NHDL file 213. An exemplary process by which stitching engine 210 performs this refinement is described below with reference to FIGS. 20-21.

Those skilled in the art will appreciate that the example given in FIGS. 13A-13B is designed to illustrate various illustrative changes to the region of interest that can be made during refinement of a modular circuit design. Although this example illustrates substantial changes to most of an implementation, it will be appreciated that in other embodiments, the modifications to the region of interest may be more limited in scope. In the exemplary syntax for communicating designer intent described herein, it will be assumed that it is not permissible for the alternative design specified via the alternative region declaration 1370 to modify the ports on the entity defined by NHDL file 1300 in port declaration section 1302. However, those skilled in the art will recognize the modifications that can be utilized to support this capability.

Figure 20:
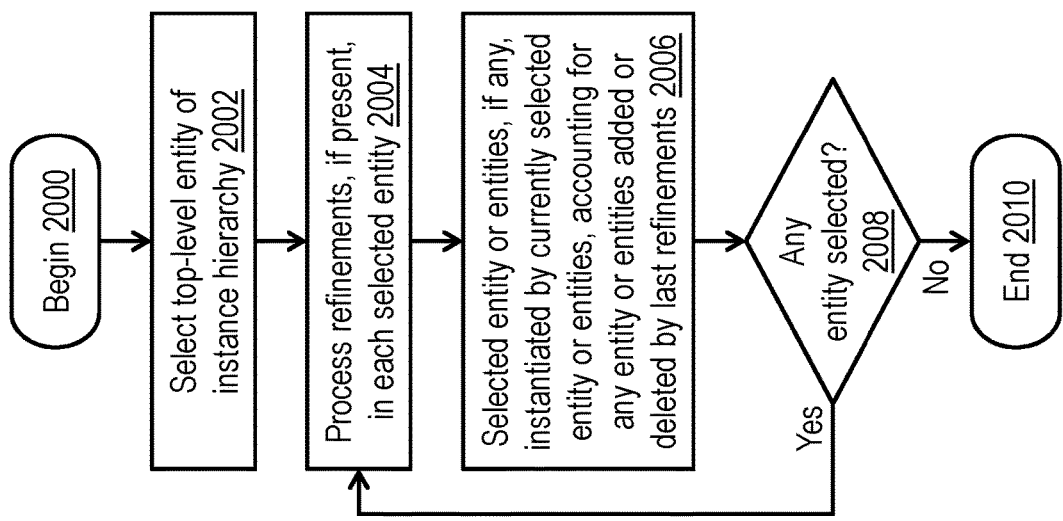
FIG. 20 is a high-level logical flowchart of an exemplary process by which a stitching engine processes an instance hierarchy of a modular circuit design in a top-down manner to perform designer-specified refinements in accordance with one embodiment.

Referring now to FIG. 20, there is depicted a high-level logical flowchart of an exemplary process by which stitching engine 210 processes an instance hierarchy of a modular circuit design in a top-down manner to implement designer-specified refinements in accordance with one embodiment. In one example, the designer-specified refinements to the modular circuit design can be specified as described above with reference to FIGS. 13A-13B.

The process of FIG. 20 begins at block 2000 and then proceeds to block 2002, which illustrates stitching engine 210 selecting the top-level (root) entity of a modular circuit design for processing. Stitching engine 210 then updates each selected entity by processing designer-specified refinements, if present, and invoked by a USE statement for each selected entity (block 2004). An exemplary process for processing these designer-specified refinements at each selected entity is described below with respect to FIG. 21. At block 2006, stitching engine 210 attempts to traverse downwardly in the instance hierarchy by selecting the entity or entities, if any, instantiated by the currently selected entity or entities. In doing so, stitching engine 210 accounts for any entity or entities added or deleted by the refinements made at block 2004. At block 2008, stitching engine 210 determines whether or not any entity or entities are selected by block 2006 (i.e., whether the bottom of the instance hierarchy of the modular circuit design has been reached). If at least one entity is selected at block 2008, the process returns to block 2004, which has been described. If, however, stitching engine 210 determines at block 2008 that no entity is currently selected, the process of refining the modular circuit design is complete, and the process ends at block 2010.

Figure 21:
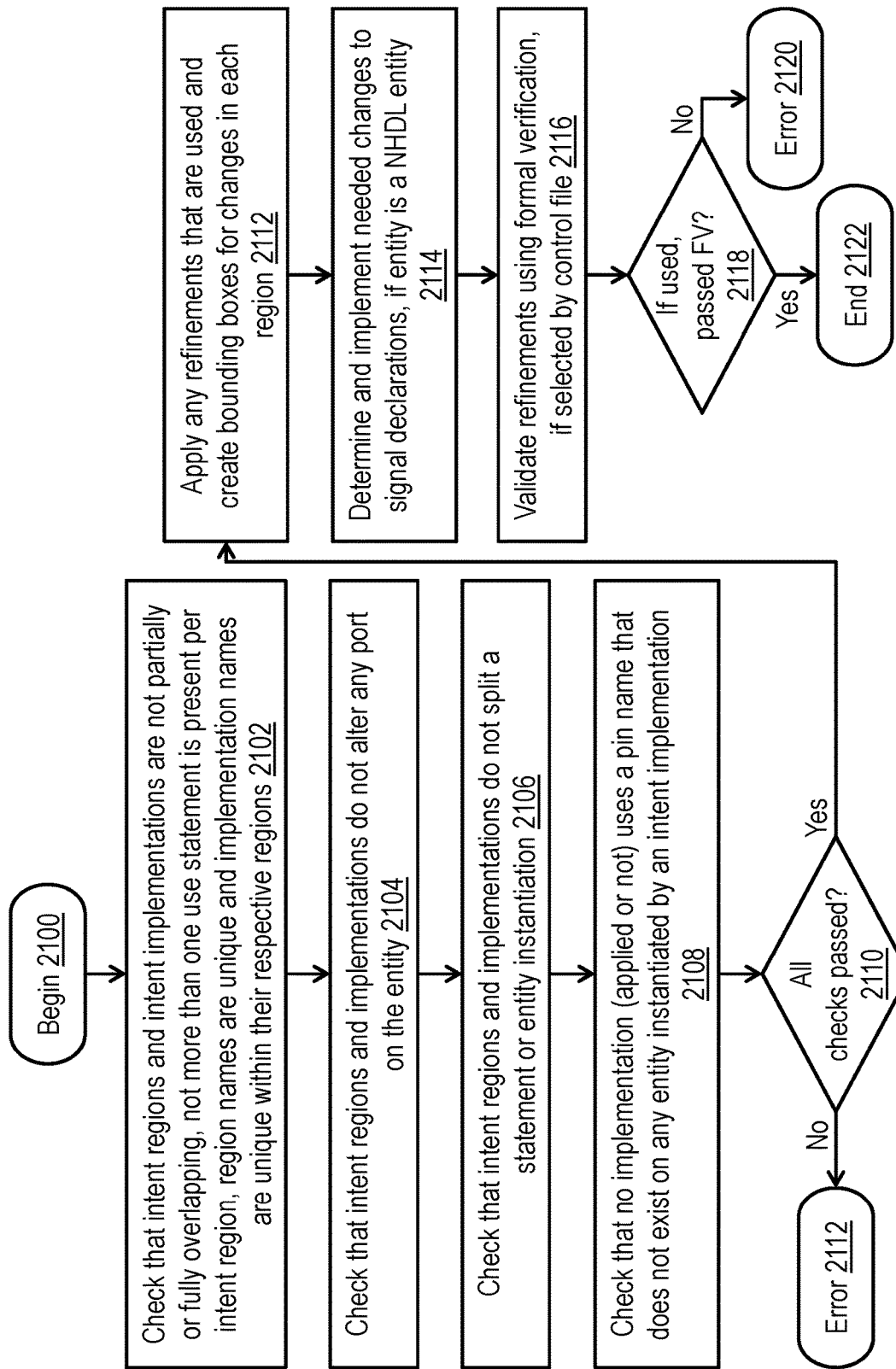
FIG. 21 is a high-level logical flowchart of an exemplary process by which a stitching engine performs refinement of an entity of a modular circuit design in accordance with one embodiment.

With reference now to FIG. 21, there is illustrated a high-level logical flowchart of an exemplary process by which stitching engine 210 performs refinement of an entity of a modular circuit design in accordance with one embodiment. The illustrated process is performed, for example, at block 2004 of FIG. 21 for each selected entity in the instance hierarchy of the modular circuit design.

The process of FIG. 21 begins at block 2100 and then proceeds to blocks 2102-2108, which illustrate stitching engine 210 performing a sequence of tests to determine whether or not the intent regions and intent implementations specified in the HDL file for the selected entity follow the legal rules enforced by stitching engine 210. For example, at block 2102, stitching engine 210 checks that intent regions and intent implementations as defined in the HDL file do not partially or fully overlap, that the HDL file does not contain more than one use statement (e.g., use statement 1330) per intent region, that all region names specified in the HDL file are unique, and that all implementation names are unique within their respective regions. At block 2104, stitching engine 210 additionally checks that the intent regions and intent implementations do not alter a port on the selected entity defined by the HDL file. In addition, stitching engine 210 checks at block 2106 that the intent regions and intent implementations specified in the file do not split any HDL logic statement or entity instantiation. Further, stitching engine 210 checks that no intent implementation (whether or not accompanied by a use statement that applies the intent implementation) uses a pin name that does not exist on an entity instantiated by an intent implementation (block 2108). At block 2110, stitching engine 210 determines whether or not all of the checks illustrated at blocks 2102-2108 have passed. If not, the process of FIG. 21 ends with an error at block 2112. If, however, stitching engine 210 determines at block 2110 that all checks depicted at blocks 2102-2108 have passed, the process proceeds to block 2112.

Block 2112 depicts stitching engine 210 applying to the entity any intent implementations for the intent region that are specified to be used by a use statement (e.g., use statement 1330). At block 2114, if the HDL files is an NHDL 1300, stitching engine 210 additionally determines and implements any changes to the signal declaration section (e.g., signal declaration section 1322) required by the refinements made at block 2112. If specified by a control file, stitching engine 210 may optionally validate that the refinements made at block 2112 result in a logically equivalent entity, for example, utilizing formal verification (block 2116). In at least some embodiments, stitching engine 210 may perform formal verification by invoking a separate verification tool. As a starting point, the verification tool can first attempt to prove logical equivalency between the intent implementation and the region of interest it replaced. If this attempt is successful logical equivalency is established. However, in some cases, logical equivalency cannot be formally verified without performing verification on the entire entity (or possibly a larger portion of the design). One reason for the need to expand the scope of formal verification to the entire entity can be that the input values of the intent implementation may not be subject to the same value constraints when the intent implementation is evaluated on its own as when the intent implementation is evaluated in the context of the enclosing entity (or larger portion of the design). At block 2118, stitching tool 210 determines whether, if formal verification was applied, the refinements passed formal verification. If formal verification was applied and the refinements did not pass formal verification, the process of FIG. 21 ends with an error at block 2120. If, however, the refinements passed formal verification or no formal verification was applied, the process of FIG. 21 ends at block 2122.

Figure 14:
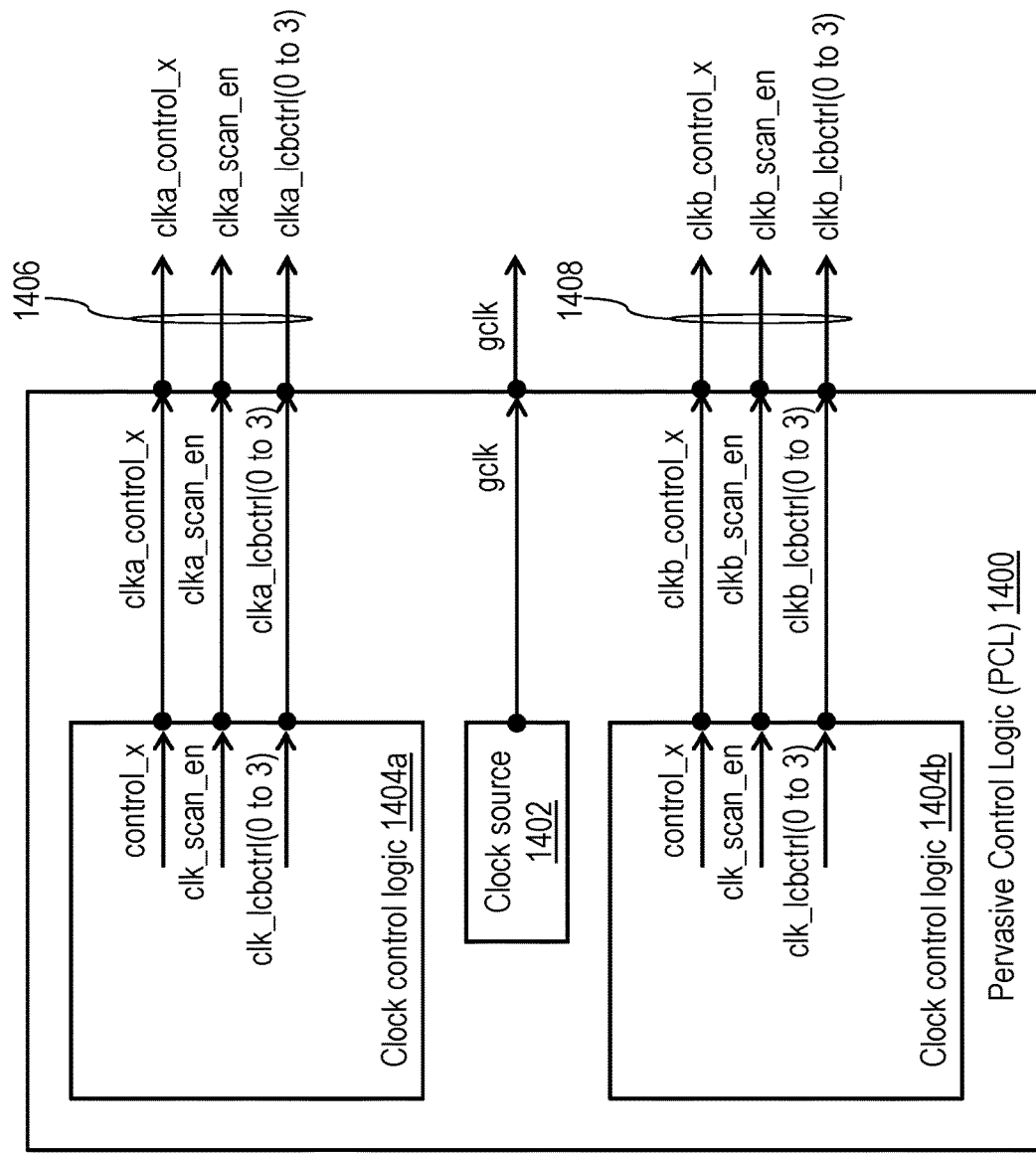
FIG. 14 is a high-level block diagram of pervasive control logic (PCL) that may be incorporated within a modular circuit design in accordance with one embodiment.

With reference now to FIG. 14, there is illustrated a high-level block diagram of pervasive control logic (PCL) 1400 that may be incorporated within a modular circuit design in accordance with one embodiment. In various embodiments, PCL 1400 can be defined by PHDL file(s) 203, NHDL file(s) 205, or SHDL file(s) 207.

In this example, PCL 1400 includes a clock source 1402 (e.g., a phase-locked loop) that generates a global (mesh) clock signal "gclk." In addition, PCL 1400 instantiates one or more, and in this example, two, instances of clock control logic 1404*a*, 1404*b*. Each instance of clock control logic 1404 generates output signals on three output ports named "control_x," "clk_scan_en," and "clk_lcbctrl(0 to 3)." To avoid signal name collisions in PCL 1400, the signals from the output ports on clock control logic 1404*a* are assigned to a clock region "clka," and the signals from the output ports on clock control logic 1404*b* are assigned to a clock region "clkb." The signals driven by the various instances of clock control logic 1404 are thus disambiguated within PCL 1400 by prepending a text string designating the clock region to each signal. Thus, for example, port "control_x" on clock control logic 1404*a* drives signal "clka_control_x," while port "control_x" on clock control logic 1404*b* drives signal "clkb_control_x." The pervasive logic control signals output by PCL 1400 for clock region "clka" are collectively referred to as clka pervasive signals 1406, while the pervasive logic control signals output by PCL 1400 for clock region "clkb" are collectively referred to as clkb pervasive signals 1408.

Figure 15:
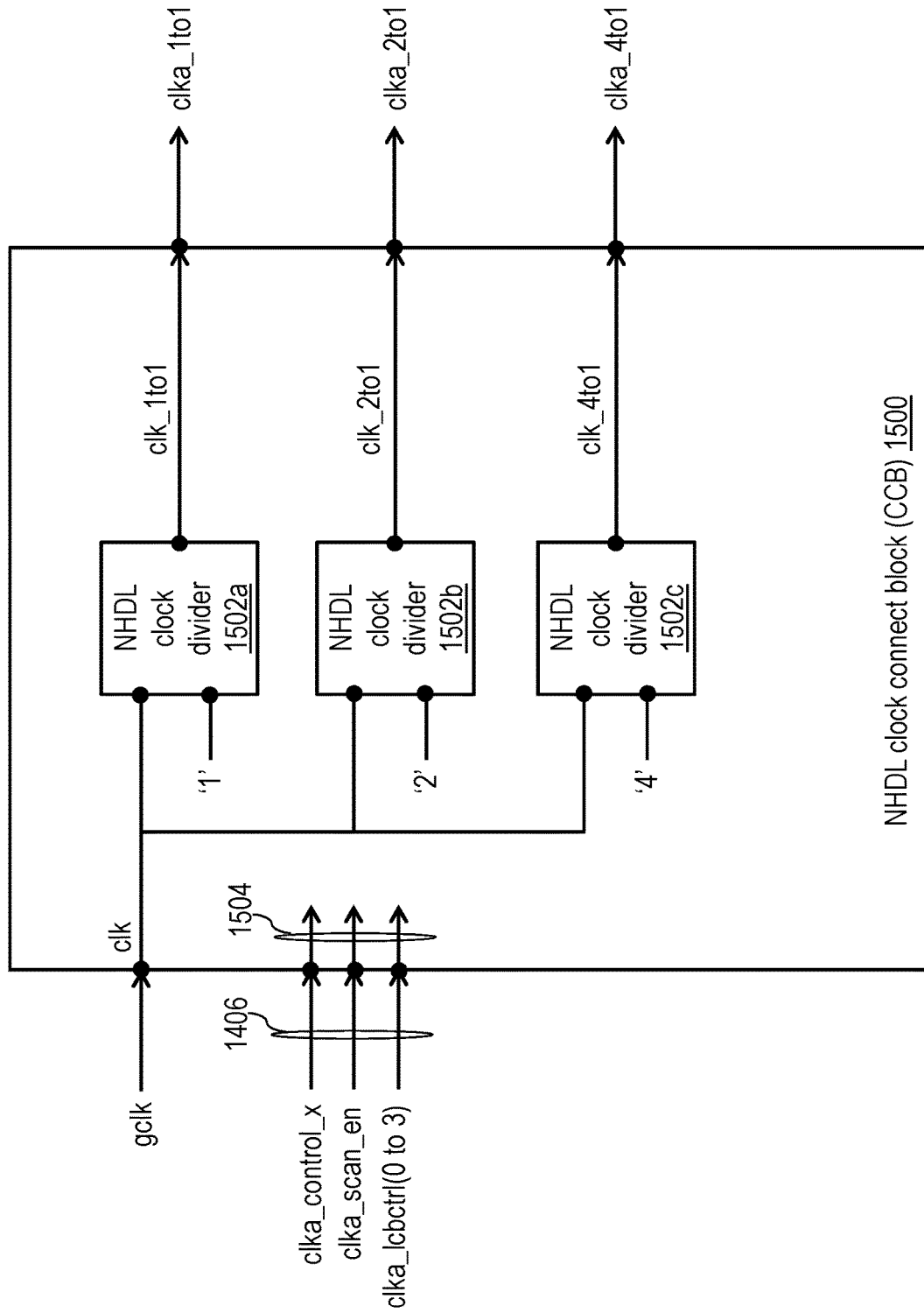
FIG. 15 is a high-level block diagram of a NHDL clock connect block (CCB) that may be incorporated within a modular circuit design in accordance with one embodiment.

Referring now to FIG. 15, there is depicted a high-level block diagram of a NHDL clock connect block (CCB) 1500 for a modular circuit design in accordance with one embodiment. NHDL CCB 1500 is defined by a specific NHDL file, and each instance of NHDL CCB 1500 is controlled by an instance of PCL 1400.

As shown, NHDL CCB 1500 includes one functional-intent port named clk that is connected to global clock signal "gclk" provided by PCL 1400. The associated internal signal "clk" is coupled to one or more instances of a clock divider (in this case, NHDL clock dividers 1502*a*-1502*c*) to produce internal logical clock signals having various frequency ratios with respect to "clk." For example, in this example, NHDL clock dividers 1502*a*-1502*c* respectively produce logical clock signal "clk_1to1" having the same frequency as "clk," logical clock signal "clk_2to1" having half the frequency of "clk," and clock signal "clk_4to1" having one-fourth the frequency of "clk." To prevent signal name collisions among the logical clock signals, these logical clock signals are renamed upon output from NHDL CCB 1500 with the appropriate prepended clock region designation, thus obtaining logical clock signals "clka_1to1," "clka_2to1," and "clka_4to1." It should be noted that although NHDL CCB 1500 provides input ports from clka pervasive signals 1406, the corresponding signals internal to NHDL CCB 1500 (generally shown at 1504) are left sinkless since these signals remain unused in functional simulation.

Figure 16:
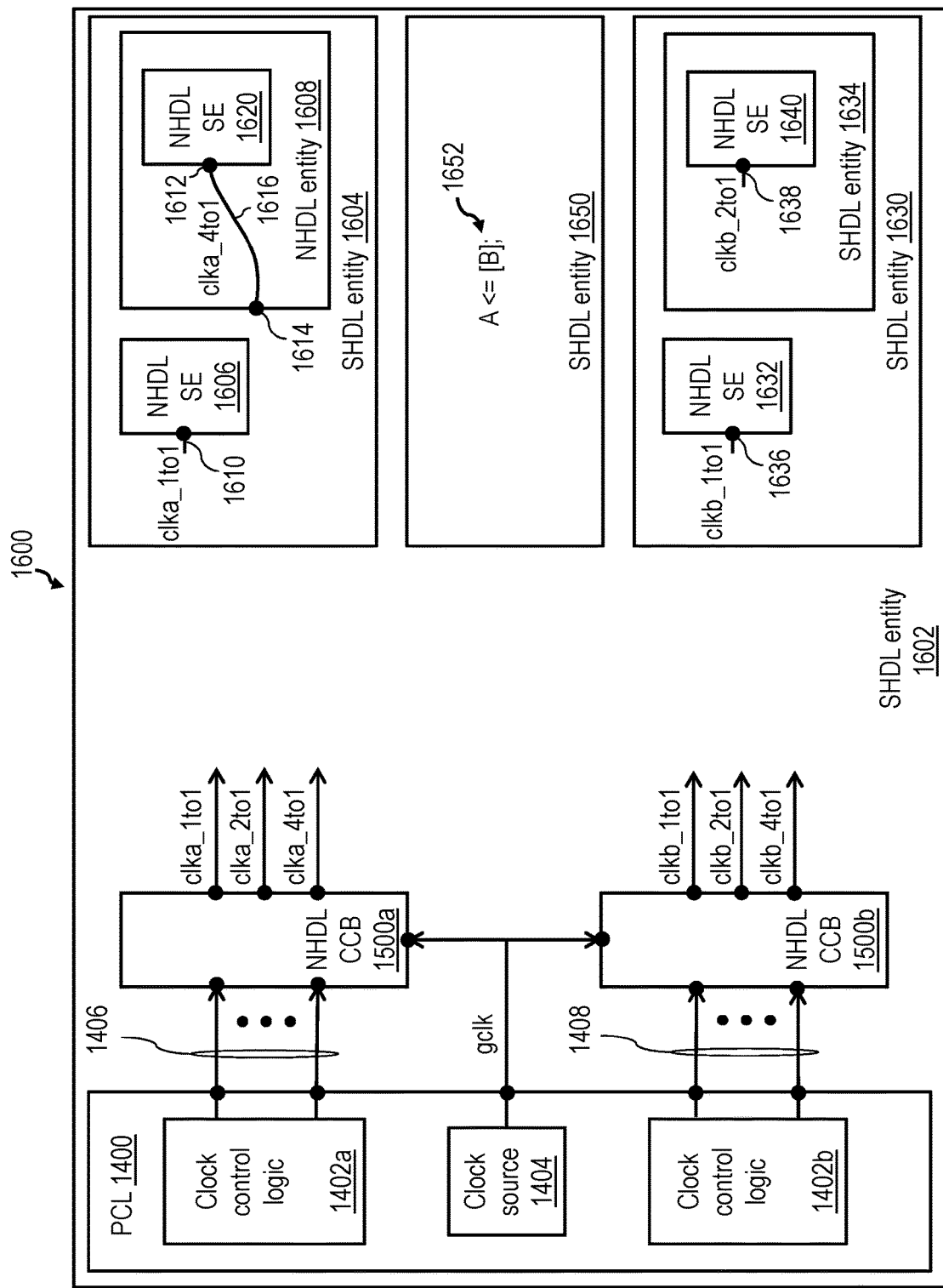
FIG. 16 is a first view of a first exemplary modular circuit design including a SHDL entity that instantiates additional entities in accordance with one embodiment.
Figure 17:
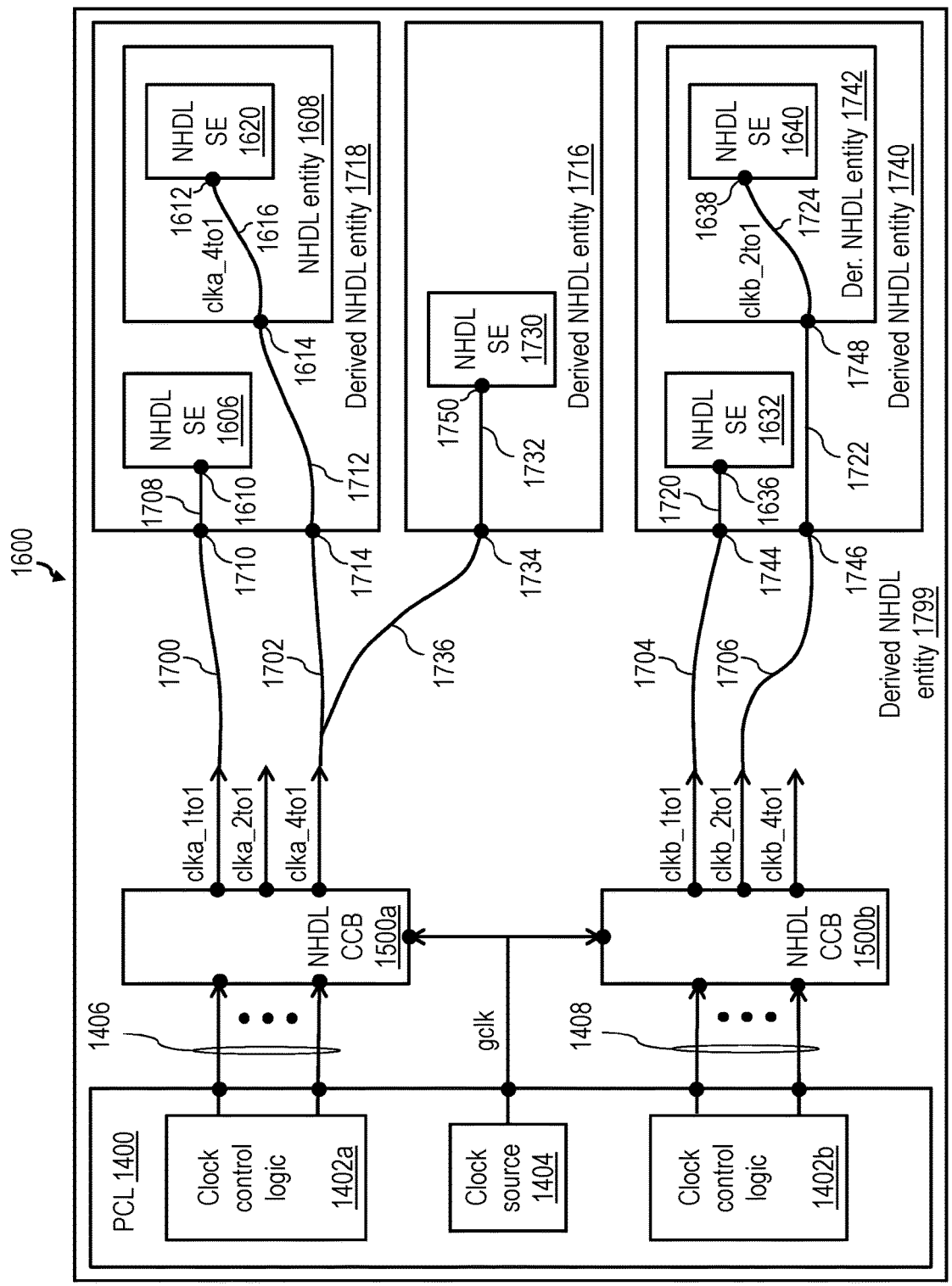
FIG. 17 is a second view of the first exemplary modular circuit design of FIG. 16 illustrating the automated connection of clock signals to the relevant ports of entity instances in accordance with one embodiment.

With reference now to FIG. 16, there is illustrated a first view of a first exemplary modular circuit design 1600 including a SHDL entity 1602 that instantiates additional entities in a hierarchical fashion accordance with one embodiment. Specifically, the first view given in FIG. 16 graphically represents a view of a modular circuit design 1600 defined by SHDL files 207 and NHDL files 205 as initially received by stitching engine 210. The result of the processing performed by stitching engine 210 to produce derived NHDL files 212 for input SHDL files 207 (stitching engine 210 does not alter NHDL files other than to implement refinement intent as described above) is reflected in the second view of the modular circuit design 1600 illustrated in FIG. 17.

As shown in FIG. 16, modular circuit design 1600 includes an instance of PCL 1400 as previously described with reference to FIG. 14 and two instances of NHDL CCB 1500*a*, 1500*b* as described with reference FIG. 15. The clka pervasive signals 1406 generated by PCL 1400 for the clock region "clka" are connected to NHDL CCB 1500*a*. Similarly, the clkb pervasive signals 1408 generated by PCL 1400 for the clock region "clkb" are connected to NHDL CCB 1500*b*. Based on the global clock signal gclk provided by clock source 1404, NHDL CCB 1500*a* outputs logical clocks "clka_1to1," "clka_2to1," and "clka_4to1" for the clock region "clka," and NHDL CCB 1500*b* outputs logical clocks "clkb_1to1," "clkb_2to1," and "clkb_4to1" for clock region "clkb."

SHDL entity 1602 also instantiates three additional entity instances, namely, SHDL entity 1604, SHDL entity 1650, and SHDL entity 1630. SHDL entity 1604, in addition to optional unillustrated functional logic, in turn includes at least a NHDL SE 1606 and a NHDL entity 1608, which in turn instantiates a NHDL SE 1620. As shown by the lack of any instantiated entities within SHDL entity 1650, the SHDL file 207 defining SHDL entity 1650 does not include any entity declarations, but does include (in addition to statements defining functional logic) a SHDL SE declaration 1652. SHDL entity 1630, in addition to unillustrated functional logic, includes at least a NHDL SE 1632 and a SHDL entity 1634, which in turn instantiates a NHDL SE 1640.

When the SHDL file 207 defining SHDL entity 1602 is received by stitching engine 210, the respective clock domain to which each of NHDL SEs 1606, 1620, 1632, and 1640 belongs can be automatically determined by stitching engine 210. For example, within the SHDL file 207 corresponding to NHDL SE 1604, the NHDL SE declaration section 600 includes a port map section 606 having a port map declaration (corresponding to port map declaration 608 of FIG. 6) that maps the generic clock port 1610 on NHDL SE 1606 to the correct logical clock signal, in this case, "clka_1to1," which is specified by the naming convention to be in the clock region "clka." By reading this port map, stitching engine 210 automatically assigns NHDL SE 1606 to the clock region "clka" with a clocking ratio of "1to1." Stitching engine 210 can utilize the same technique to assign NHDL SE 1632 to the logical clock signal "clkb 1to1" in the "clkb" clock region, to assign NHDL SE 1640 to the logical clock signal "clkb 2to1" in the "clkb" clock region, and to assign NHDL SE 1620 to the logical clock signal "clka_4to"1 in the "clka" clock region. Stitching engine 210 additionally recognizes the connection between clock port 1612 and port 1614 on NHDL entity 1608 represented by signal connection (wire) 1616 based on the presence in the NHDL file corresponding to NHDL entity 1608 of the respective input port declarations of NHDL entity 1608 and the port map on the instantiation of NHDL SE 1620 both enumerating ports associated with signal name "clka_4to1."

SHDL entity 1650 contains no port map for the clocking signal that drives SHDL SE 1652, and stitching engine 210 therefore cannot infer the correct functional clock from such a port map, as by convention, these ports are added automatically by stitching engine 210. However, stitching engine 210 can instead determine the appropriate clock region and logical clock signal for the derived NHDL SE based on a SHDL attribute declaration (e.g., SHDL attribute declaration 902) or SHDL variable declaration (e.g., SHDL variable declaration 914) that establishes the REGION and RATIO for the derived NHDL SE. In the instant case, stitching engine 210 will determine, by convention, that the derived NHDL SE is assigned logical clock signal "clka_4to1" based on the REGION characteristic having a value of "clka" and the RATIO characteristic having a value of "4to1."

Given its knowledge of the logical clock signals from the various clock regions that are required to drive functional operation of the entities and storage elements in the modular circuit design, stitching engine 210 then processes the modular circuit design to transform each SHDL entity into a corresponding derived NHDL entity and to establish signal connections between the logical clock signals output by NHDL CCBs 1500a, 1500b and the clock ports of the entities and storage elements in the modular circuit design. In this transformation of the modular circuit design, stitching engine 210 does not alter NHDL or PHDL entities (which are encapsulated in NHDL entities as discussed with reference to FIG. 12) within the modular circuit design. In at least one embodiment, in order to process the modular circuit design to transform SHDL entities and to make clock signal connections, stitching engine 210 constructs an instance tree data structure of all entity instances within the modular circuit design and processes each instance in the instance tree data structure in a bottom-up manner. One exemplary process for constructing and processing the instance tree is discussed below with reference to FIG. 22. Those skilled in the art will appreciate that in other embodiments, other alternative techniques of processing the instances composing the modular circuit design can be employed.

An example of a bottom-up traversal of the instance tree of modular circuit design 1600 will now be given. In this discussion, it should be understood that, although not discussed explicitly, stitching engine 210 will also process PCL 1400 (and its constituent entities) and NHDL CCBs 1500a, 1500b. (The processing of these entities is omitted to clarify the exposition.) The bottom-up traversal of the instance tree of modular circuit design 1600 by stitching engine 210 begins with NHDL SEs 1620 and 1640. Because NHDL SEs 1620 and 1640 are NHDL entities, all ports (e.g., ports 1612 and 1638) are already fully declared in the port declaration sections of the corresponding NHDL files 205. Accordingly, stitching engine 210 makes no modification to these entities.

Stitching engine 210 then moves to the next higher level of hierarchy in the instance tree and processes NHDL entity 1608 and SHDL entity 1634. Because NHDL entity 1608 is a NHDL entity, port 1614 is already declared and present on NHDL entity 1608 and will naturally cause signal connection 1616 to port 1612 of NHDL SE 1620 to exist already. Again, stitching engine 210 need not (and does not) not make any modification to NHDL entity 1608. When stitching engine 210 processes SHDL entity 1634, stitching engine 210 transforms SHDL entity 1634 to produce a corresponding derived NHDL entity 1742 (see FIG. 17) defined by a respective derived NHDL file 212. Specifically, stitching engine 210 detects the port map for NHDL SE 1640 in SHDL entity 1634 attached to the generic clock (clk) pin 502 at port 1638 (as described below at block 2310 of FIG. 23A) and, based on failing to find the needed logical clock signal "clkb_2to1" within the current entity, creates a port 1748 for this input on derived NHDL entity 1742 (as described, for example, at block 2332 of FIG. 23B). The creation of port 1748, which specifies the same logical clock signal as port 1638 on NHDL SE 1640, then brings signal connection (wire) 1724 between ports 1748 and 1638 into existence. It should be noted that in the described embodiment, the port map on NHDL SE 1640 (and the other NHDL SEs) generally must rename the generic clock (clk) port 502 to the accurate logical clock name for the given project (following the naming convention form of REGION RATIO) so stitching engine 210 can identify such clock inputs ports as needing to be connected. (The declarations of SHDL SEs do not specify port maps; stitching engine 210 derives their clock pins from the associated region/ratio specified in the associated attribute declarations or variable declarations).

Stitching engine 210 next moves to the next higher level of the instance tree, which includes SHDL entities 1604, 1630, and 1650. Stitching engine 210 can process these entities in any order relative to one another. When stitching engine 210 processes SHDL entity 1604, stitching engine 210 transforms SHDL entity 1604 to produce a corresponding derived NHDL entity 1718 defined by a respective derived NHDL file 212. Specifically, stitching engine 210 detects the port map declarations for port 1610 and port 1614 (as described below at block 2310 of FIG. 23A). Based on failing to find the specified logical clock signals "clka_1to1" and "clka_4to1" within the current entity, stitching engine 210 creates ports 1710 and 1714 for these logical clock signals on derived NHDL entity 1718 (as described, for example, at block 2332 of FIG. 23B). The creation of port 1710, which specifies the same logical clock signal as port 1610 on NHDL SE 1606, then brings signal connection (wire) 1708 between ports 1710 and 1610 into existence. Similarly, the creation of port 1714, which specifies the same logical clock signal as port 1614 on NHDL entity 1608, then brings signal connection (wire) 1712 between ports 1714 and 1614 into existence.

When stitching engine 210 processes SHDL entity 1630, stitching engine 210 transforms SHDL entity 1630 to produce a corresponding derived NHDL entity 1740 (see FIG. 17) defined by a respective derived NHDL file 212. Specifically, stitching engine 210 detects the port map declarations for port 1636 and port 1748 (as described below at block 2310 of FIG. 23A). Based on failing to find the specified logical clock signals "clkb_1to1" and "clkb_2to1" within the current entity, stitching engine 210 creates ports 1744 and 1746 for these logical clock signals on derived NHDL entity 1740 (as described, for example, at block 2332 of FIG. 23B). The creation of port 1744, which specifies the same logical clock signal as port 1636 on NHDL SE 1632, then brings signal connection (wire) 1720 between ports 1744 and 1636 into existence. Similarly, the creation of port 1746, which specifies the same logical clock signal as port 1748 on derived NHDL entity 1740, then brings signal connection (wire) 1722 between ports 1746 and 1748 into existence.

When stitching engine 210 processes SHDL entity 1650, stitching engine 210 transforms SHDL entity 1650 to produce a corresponding derived NHDL entity 1716 defined by a respective derived NHDL file 212. Specifically, stitching engine 210 detects within SHDL entity 1650 SHDL SE declaration 1652 (as depicted, for example, at block 2312 of FIG. 23A, described below). Stitching engine 210 uses the clocking information for that storage element (derived from the associated region and ratio characteristics) to create port 1734 on derived NHDL entity 1716. Stitching engine 210 additionally replaces SHDL SE declaration 1652 with the instantiation of NHDL SE 1730 (e.g., at block 2334 of FIG. 23B, described below). Stitching engine 210 also elaborates the port map for NHDL SE 1730 (e.g., at box 2336 of FIG. 23B). The elaboration of the port map connects port 1750 on NHDL SE 1730. The connection of port 1750, which specifies the same logical clock signal as port 1734 on derived NHDL entity 1716, then brings signal connection (wire) 1732 between ports 1734 and 1750 into existence.

Stitching engine 210 thereafter moves to the top level of the instance tree, which includes only SHDL entity 1602. At this point in the processing, SHDL entity 1602 contains derived NHDL entity 1718 having ports 1710 and 1714, derived NHDL entity 1716 having port 1734, and derived NHDL entity 1740 having ports 1744 and 1746. Stitching engine 210 detects all of these ports (e.g., at box 2314 of FIG. 23A, described below) and, in response to detecting these ports, generates elaborated port maps for derived NHDL entities 1718, 1716, and 1740 (e.g., at box 2336 of FIG. 23B). Stitching engine 210 determines (e.g., at box 2320 of FIG. 23B) that all the logical clock signals associated with these ports (as specified by the elaborated port maps) are driven by pre-existing logical clock signals in the entity presently being processed. Accordingly, stitching engine 210 creates signal connection 1700, 1702, 1704, 1706, and 1736, but adds no ports for these logical clock signals. It should be noted that, in this example, the ports finally connect to logical clock signals on the top-level entity. In general, these clock connections are not required to be made at top-level entity and can be made at lower level(s) of the design hierarchy and at differing levels of the hierarchy (if the modular circuit design includes two or more logical clock signals). Finally, stitching engine 210 writes a derived NHDL file 212 corresponding to derived NHDL entity 1799.

Figure 18:
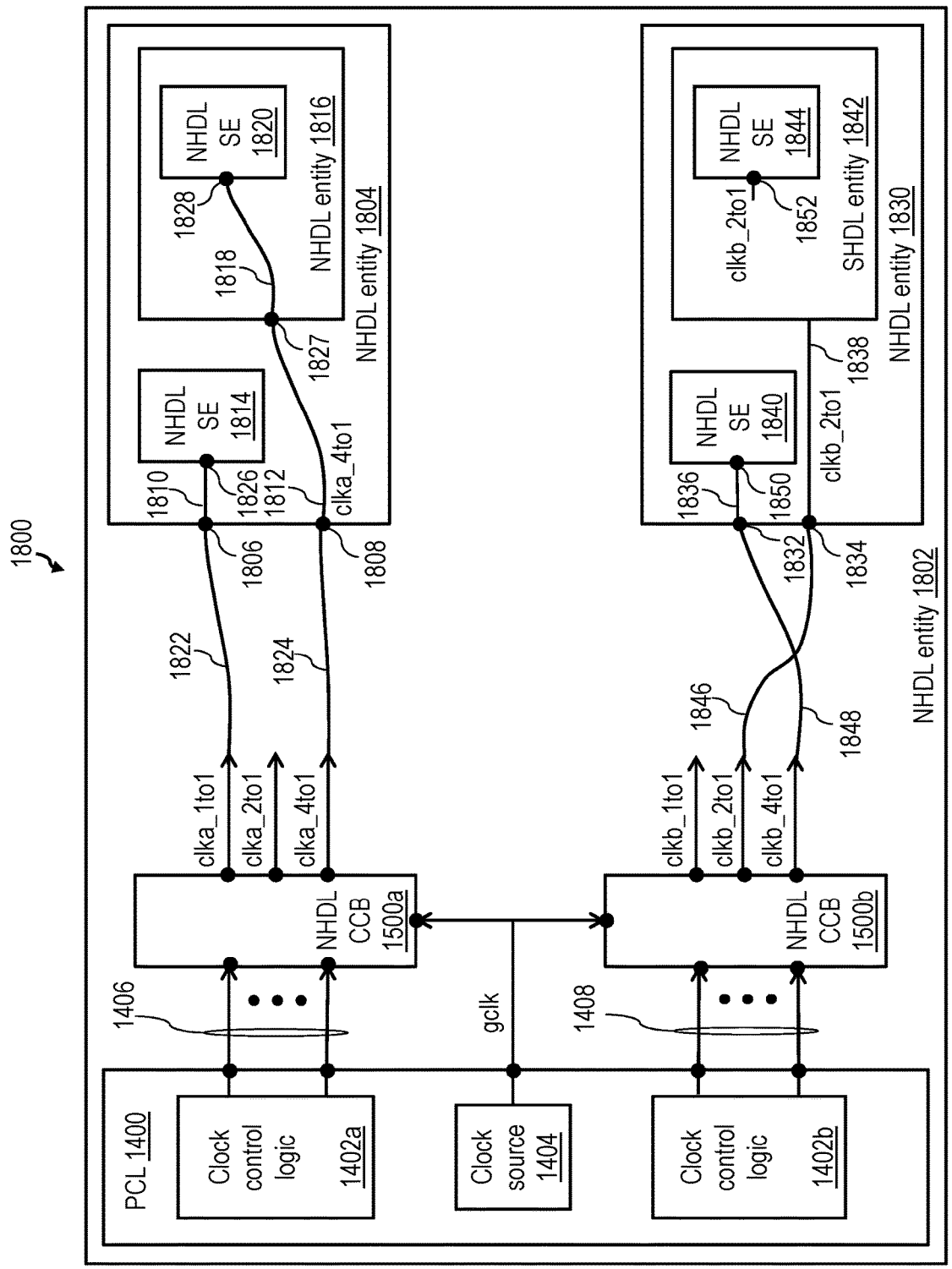
FIG. 18 is a first view of a second exemplary modular circuit design including a NHDL entity that instantiates additional entities in accordance with one embodiment.
Figure 19:
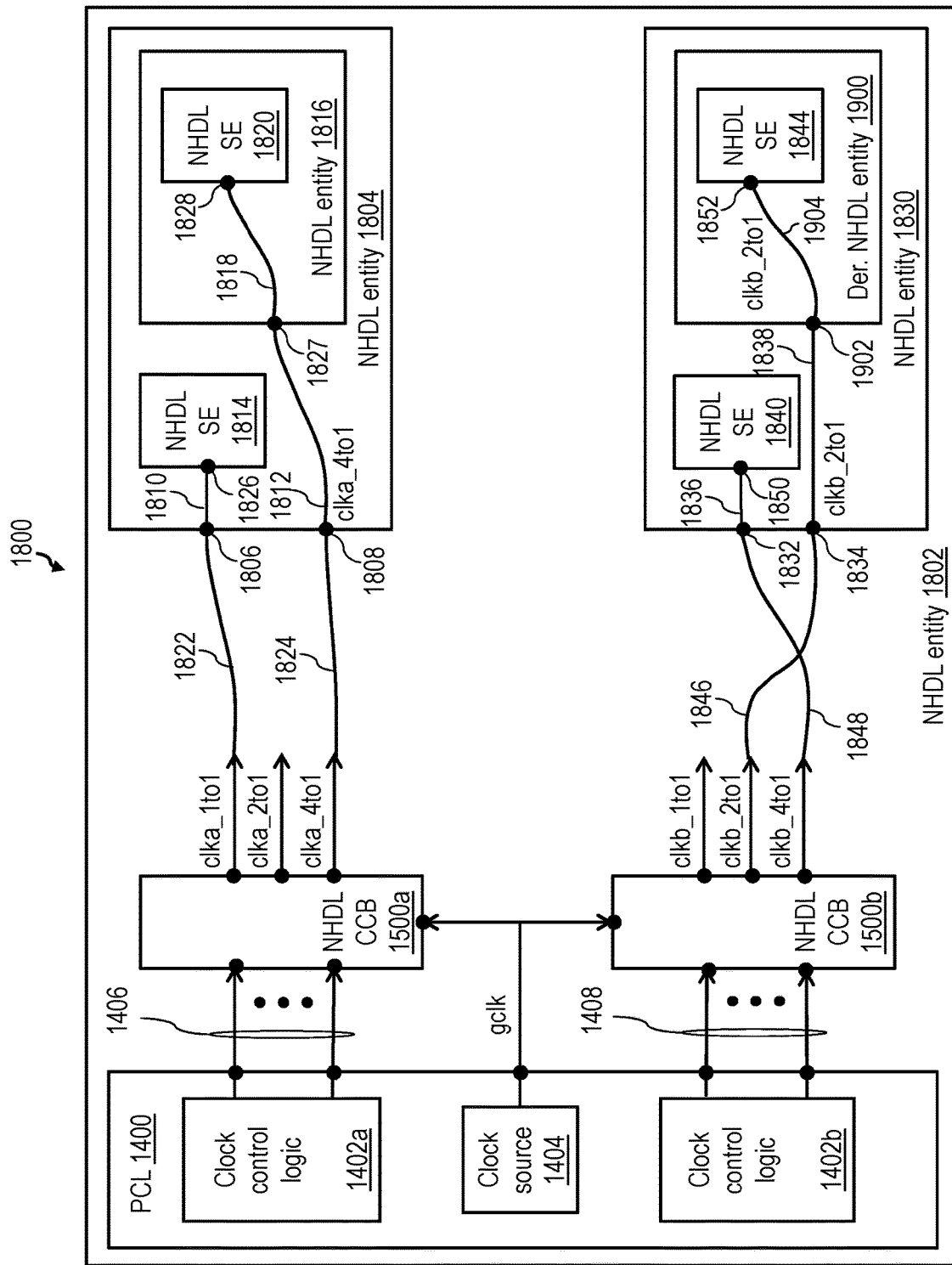
FIG. 19 is a second view of the second exemplary modular circuit design of FIG. 18 illustrating the automated connection of clock signals to the relevant ports of entity instances in accordance with one embodiment.

With reference now to FIGS. 18-19, there are illustrated first and second views of a second exemplary modular circuit design 1800 including a NHDL entity 1802 that instantiates additional entities in accordance with one embodiment. FIG. 18 illustrate the state of modular circuit design 1800 prior to processing by stitching engine 210, and FIG. 19 illustrates the state of modular circuit design 1800 following processing by stitching engine 210.

As seen in FIG. 18, NHDL entity 1802 instantiates two NHDL entities 1804 and 1830. NHDL entity 1804 directly instantiates NHDL SE 1814 and NHDL entity 1816, which in turn instantiates NHDL SE 1820. NHDL SE 1820 includes a clock port 1828, which is connected by clock signal 1818 to port 1827 on NHDL entity 1816. Port 1827 is, in turn, connected by clock signal 1812 to a port 1808 on NHDL entity 1804. NHDL SE 1814 is further connected by a clock signal 1810 to port 1806 on NHDL entity 1804. NHDL entity 1804 and all of the entities it directly or indirectly instantiates (i.e., NHDL SE 1814, NHDL entity 1816, and NHDL SE 1820) are already NHDL entities that have fully elaborated logical clock signals. Because the port map on NHDL entity 1804 is fully elaborated in its corresponding NHDL file 205, clock signals 1822 and 1824 respectively connected to ports 1806 and 1808 of NHDL entity 1804 exist already when the NHDL file 205 is created. Consequently, stitching engine 210 makes no modifications to NHDL entity 1804, its directly or indirectly instantiated entities, or the associated logical clock signals.

FIG. 18 further illustrates that NHDL entity 1830 has two ports 1832 and 1834 connected to clock signals 1848 ("clkb_4to1") and 1846 ("clkb_2to1"), respectively. NHDL entity 1830 instantiates a NHDL SE 1840 and a SHDL entity 1842, which in turn instantiates a NHDL SE 1844. NHDL SE 1840 has a clock port 1850 connected by clock signal 1836 to port 1832 on NHDL entity 1830. The instantiation of SHDL entity 1842 in the HDL code for NHDL entity 1830 has a fully elaborated port map connecting logical clock signal 1838 ("clkb_2to1") to the "clkb_2to1" port 1902 that will subsequently be created for SHDL entity 1842 by stitching engine 210. When processing SHDL entity 1842, stitching engine 210 transforms SHDL entity 1842 to produce a derived NHDL entity 1900 (see FIG. 19). As part of this transformation, stitching engine 210 reads the port map on NHDL SE 1844 (e.g., at block 2310 of FIG. 23A). Based on the clock information contained therein, stitching engine 210 automatically creates port 1902 on derived NHDL entity 1900, causing signal connection 1904 to connect port 1852 and port 1902. With NHDL entity 1830 already fully connected to all necessary logical clock signals, all modifications of modular circuit design 1800 by stitching engine 210 to connect logical clock signals are complete. (No modification is necessary to connect logical clock signal 1836 ("clkb_4to1") required by NHDL entity 1840 as all related ports and signal connections are fully specified in the NHDL file 205 corresponding to NHDL entity 1830.)

With reference now to FIG. 22, there is illustrated a high-level logical flowchart of an exemplary process by which stitching engine 210 generates derived NHDL files 212 describing a modular circuit design in accordance with one embodiment. The process of FIG. 22 begins at block 2200 and then proceeds to block 2202, which illustrates stitching engine 210 examining the instance hierarchy of a modular circuit design defined by one or more input HDL files up to, but not including, PHDL entities, if any. As stitching engine 210 traverses the instance hierarchy, stitching engine 210 numbers each entity instance by its depth from the top-level (root) entity instance. Stitching engine 210 then selects the entity instance(s) with the greatest depth with respect to the top-level entity instance (block 2204) and processes the selected entity instance(s) to create derived NHDL files 212 as necessary (block 2206). An exemplary method by which stitching engine 210 processes a given entity at block 2206 is described below with reference to FIGS. 23A-23B. A separate instance of the illustrated process is performed for each entity selected at block 2204. At block 2208, stitching engine 210 determines whether or not the top-level entity instance has been processed. If so, processing of the modular circuit design is complete, and the process of FIG. 22 ends at block 2212. If, however, stitching engine 210 determines at block 2208 that the top-level entity instance has already been processed, stitching engine 210 selects the entity instance(s) at the next higher depth for processing (block 2210). The process then returns to block 2206, which has been described.

Those skilled in the art should appreciate upon reference to FIG. 22 that, in practice, there are a wide variety of techniques for processing an instance hierarchy of a modular circuit design and that the described inventions are not limited to the specific technique for bottom-up traversal of an instance hierarchy depicted in FIG. 22.

Figure 23B:
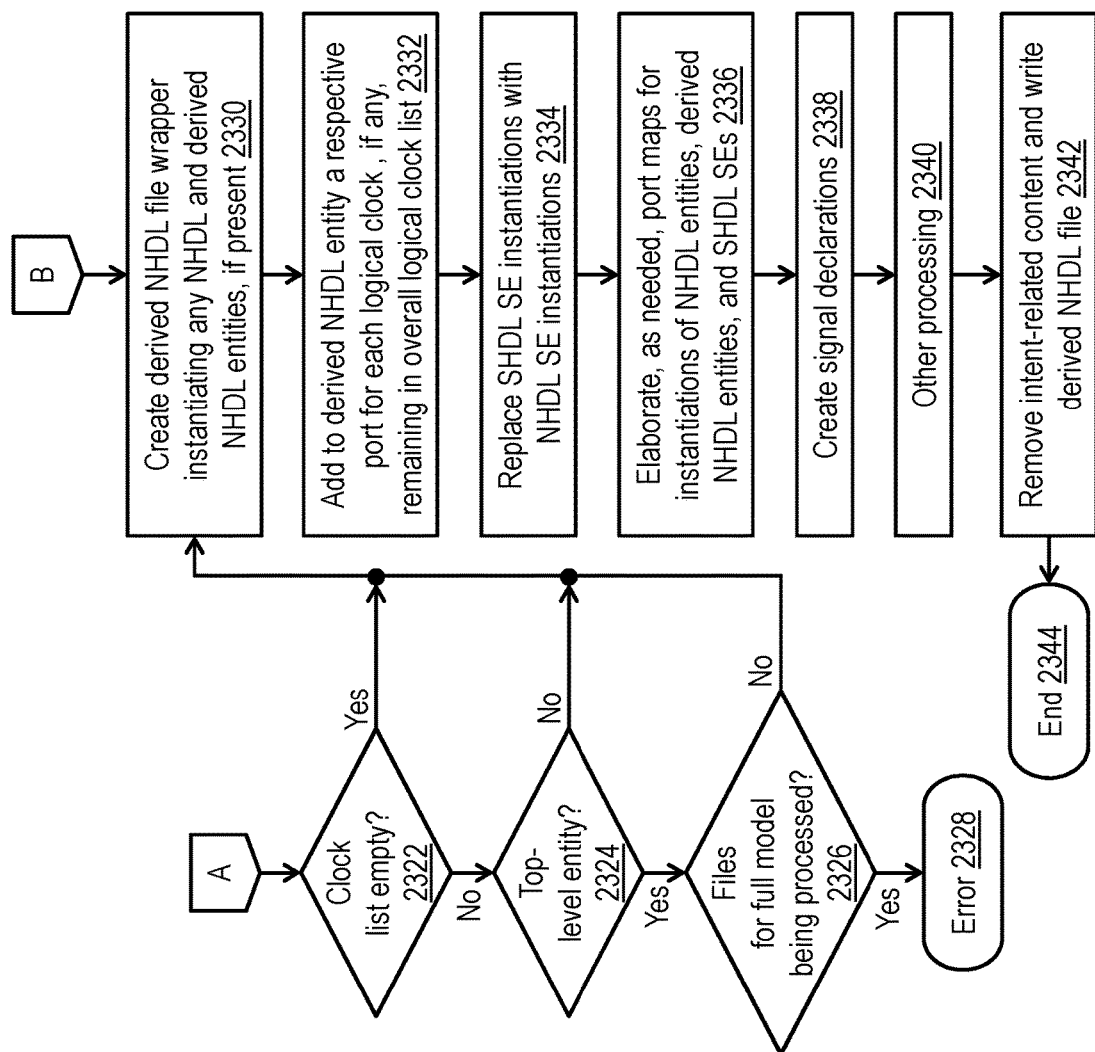

Referring now to FIGS. 23A-23B, there is depicted a more detailed logical flowchart of an exemplary process by which stitching engine 210 generates a derived NHDL file describing a selected entity in a modular circuit design in accordance with one embodiment. The process of FIG. 23A begins at block 2300, for example, when invoked at block 2206 of FIG. 22, and then proceeds to block 2302, which illustrates stitching engine 210 determining the entity type of the entity instance selected for processing. In response to a determination at block 2302 that the entity is a NHDL entity due to a negative determination at block 2302, no additional processing is performed for the entity, and the process terminates at block 2304. In response to a determination at block 2302 that the entity is a SHDL entity rather than a NHDL entity, the process proceeds to block 2305, which depicts stitching engine 210 determining whether or not it has already processed another instance of this same SHDL entity during the traversal of the instance tree and has therefore already written a corresponding derived NDHL file 212. If so, the process ends at block 2304. If, however, stitching engine 210 makes a negative determination at block 2305, stitching engine 210 additionally determines whether or not any logical clock names for the modular circuit design occur as pins on the SHDL entity (block 2306). If so, an error is detected, and the process of FIG. 23A ends with an error at block 2308. (Manual insertion of logical clock pins on a SHDL entity that stitching engine 210 will connect is prohibited, by convention.)

If, however, stitching engine 210 makes a negative determination at block 2306, stitching engine 210 determines all the needed logical clock signal(s) required in the present SHDL entity so ports can be created for them. Specifically, at block 2310, stitching engine 210 forms a list of the logical clock signals referenced by any NHDL entity, if any, directly instantiated by the current SHDL entity. These clock signals may be referenced, for example, in a port map override, if present, or in a port declaration for the NHDL entity. It is possible that the list produced at block 2310 is empty. At block 2312, stitching engine 210 adds to the list of overall logical clock signals logical clock signals, if any, required to drive any SHDL storage element instantiations (e.g., SHDL SE declaration 1652). At block 2314, stitching engine 210 adds to the list of overall logical clock signals the logical clock signals, if any, from derived NHDL entities that replaced any SHDL entities originally called in the SHDL file for the currently selected SHDL entity. These derived NHDL entities are produced in the immediately prior pass through FIG. 22. Stitching engine 210 determines at block 2316 whether or not the overall list of logical clock signals is empty. If not, the process passes through page connector A to FIG. 23B; if so, the process passes through page connector B to FIG. 23B.

Referring now to FIG. 23B, following page connector A, the process proceeds to block 2322, which illustrates stitching engine 210 determining whether or not the list of overall logical clock signals is empty. If so, the process passes to block 2330, which is described below. If not, stitching engine 210 additionally checks at blocks 2324-2326 whether or not the entity being processed is the top-level entity of the modular circuit design and whether or not all files for the full modular circuit design are being processed (i.e., it is not just a portion of the overall model being processed). In response to affirmative determinations at blocks 2324-2326, the process of FIG. 23B terminates with an error at block 2328 because at least one required logical clock signal was not found in the HDL files defining the modular circuit design. If, however, stitching engine 210 makes a negative determination at either of blocks 2324-2326, the process proceeds to block 2330.

At block 2330, which can be reached from any of blocks 2322, 2324, 2326 or from page connector B, stitching engine 210 creates a derived NHDL file 212 defining a derived NHDL entity corresponding to the selected SHDL entity, where the derived NHDL file 212 includes entity instantiations of any included instances and any logic statements from the SHDL entity. Stitching engine 210 also adds to the derived NHDL entity a respective port for each logical clock, if any, in the overall logical clock list (block 2332). Stitching engine 210 also replaces any reference to a SHDL storage element with a NHDL storage element having a fully elaborated port map (block 2334). The processing at block 2334 has the effect of connecting the port of each new NHDL storage element created at block 2334 to the appropriate port created at block 2332. At block 2336, stitching engine 210 fully elaborates, as needed, the port maps for the various NHDL entities and derived NHDL entities that are not SHDL storage elements. Some of these instantiations may already have had full or partial port maps specified. Stitching engine 210 additionally creates the signal declaration section 424 for the derived NHDL file (block 2338) and may additionally perform other processing on the derived NHDL file to conform with the selected native HDL syntax (block 2340). Stitching engine 210 then removes any designer intent comments (as described with respect to FIGS. 13A-13B) and writes into data storage a derived NHDL file 212 describing the derived NHDL entity with its fully elaborated clock connections, pins, and ports (block 2342). The designer intent comments are removed to ensure that the refinement intent expressed in that comments does not impact later stage refinements, as described below with reference to FIG. 24. Thereafter, the process of FIG. 23B ends at block 2344.

Figure 24:
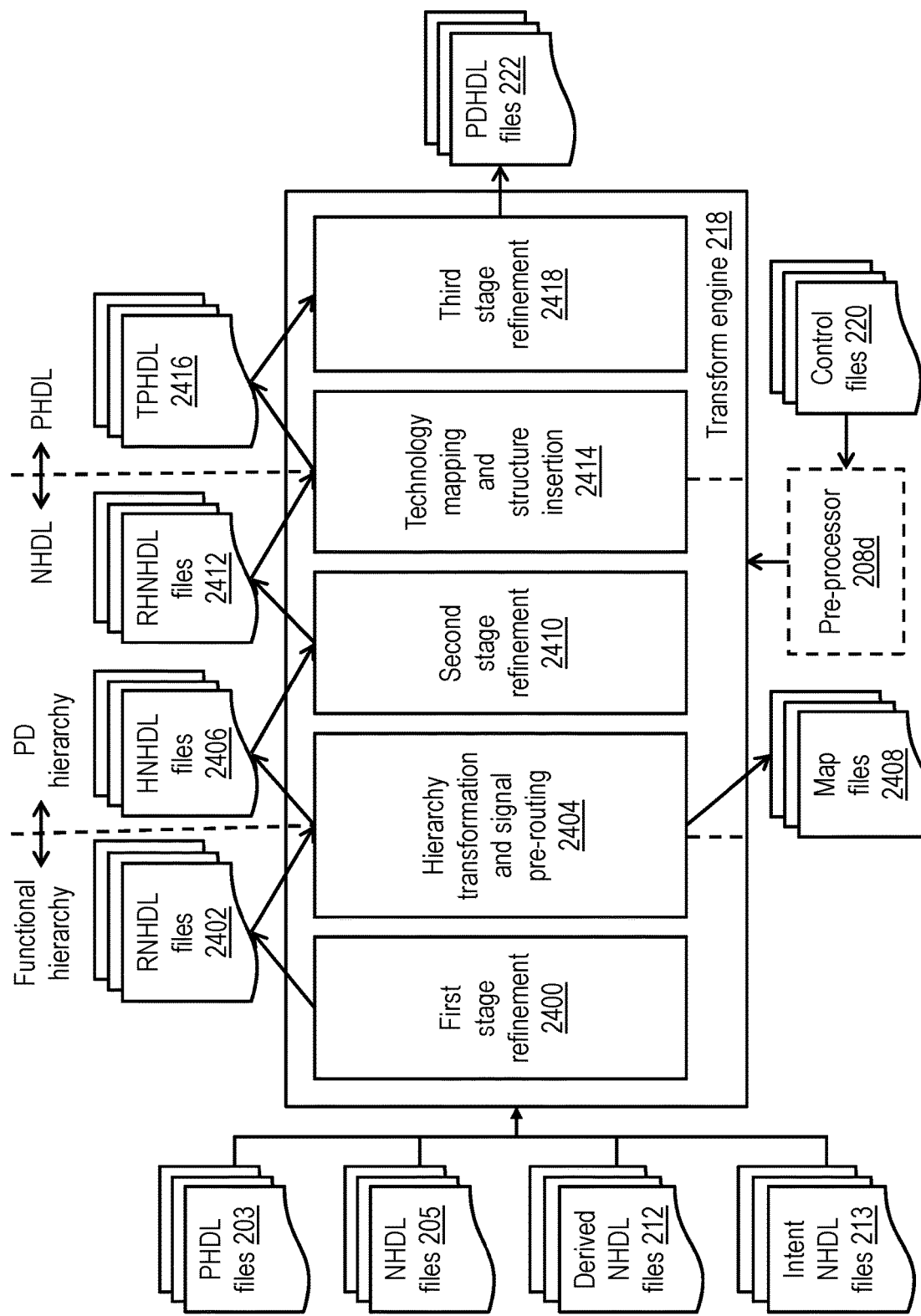
FIG. 24 is a more detailed data flow diagram of the processing performed by transform engine in accordance with one embodiment.

With reference now to FIG. 24, there is illustrated a more detailed data flow diagram of the processing performed by transform engine 218 of FIG. 2 in accordance with one embodiment. As shown, transform engine 218 receives an inputs a collection of PHDL files 203 and/or NHDL files 205 and/or derived NHDL files 212 and/or intent NHDL files 213 that define the various design entities that comprise a modular circuit design. Transform engine 218 refines and transforms the modular circuit design in multiple processing stages to produce "physical design" HDL (PDHDL) files 222 defining a modular circuit design equipped with pervasive logic and other technology-specific structures. In the illustrated example, the processing pipeline of transform engine 218 includes five sequential stages, referred to as first stage refinement 2400, hierarchy transformation and signal pre-routing 2404, second stage refinement 2410, technology mapping and structure insertion 2414, and third stage refinement 2418.

In at least some embodiments, PHDL files 203, which already define pervasive logic and other technology-specific structures, are, by convention, not modified by transform engine 218. (In other embodiments, PHDL files 203 can be refined in third stage refinement 2418.) Instead, transform engine 218 transforms NHDL files 205, 212, and 213 defining portions of the integrated circuit design and collects the HDL files produced as a result of that transformation with the PHDL files 203 defining portions of the integrated circuit design to form the collection of PDHDL files 222 produced by transform engine 218. At intermediate steps in the processing performed by transform engine 218, transform engine 218 produces as outputs and receives as inputs various HDL file collections. For example, at first stage refinement 2400, transform engine 218 receives NHDL files 205, 212, and 213 as inputs and generates "refined" NHDL (RNHDL) files 2402. These RNHDL files 2402 form inputs to hierarchy transformation and signal pre-routing 2404, which in turn produces "hierarchical" NHDL (HNHDL) files 2406. Transform engine 218 utilizes HNHDL files 2406 as inputs to second stage refinement 2410, which generates "refined" HNHDL (RHNHDL) files 2412. These RHNHDL files 2412 form inputs to technology mapping and structure insertion 2414, which in turn produces "technology mapped" PHDL (TPHDL) files 2416. Transform engine 218 utilizes TPHDL files 2416 as inputs to third stage refinement 2418, which generates at least some of the final PDHDL files 222.

At each of the three refinement stages 2400, 2410, and 2418 depicted in FIG. 24, transform engine 218 refines the integrated circuit design in accordance with an expression of physical designer refinement intent. As one example, a first team of physical designers may desire a first set of refinements to be applied to the integrated circuit design as presented to first stage refinement 2400, a different second team of physical hierarchy designers may desire a distinct second set of refinements to be applied to the integrated circuit design as presented to second stage refinement 2410, and a yet different third team of physical chip designers may desire a separate third set of refinements to be applied to the integrated circuit design as presented to third stage refinement 2418. In accordance with one or more embodiments, each of these teams of physical designers may specify its desired refinements to the integrated circuit design without causing any conflict or requiring any coordination between the teams by expressing its design refinement intent in respective set of one or more control files 220. Typically, the nature of the refinements desired at each stage can be unique, and each transform stage can cause new refinements to be necessary. Having distinct steps in the refinement process can accommodate these conditions.

Referring now to FIG. 25, there is depicted an example of a control file 2500 that can be utilized to control refinement by transform engine 218 of a modular circuit design in accordance with an expression of the physical designer refinement intent. Control file 2500, which is an example of one of control files 220 of FIGS. 2 and 25, can be utilized to control refinement by transform engine 218 at any one of first stage refinement 2400, second stage refinement 2410, or third stage refinement 2418. In at least some embodiments, it is preferred if each of refinement stages 2400, 2410, 2418 has its own respective control file(s) 220. It is also preferred if all NHDL files processed by transform engine 218 are stripped of all intent-related HDL comments to avoid any possible conflict between the designer intent expressed in such intent-related HDL comments and the possibly different designer intent expressed in control files 220. In this regard, it should be appreciated that the designer intent expressed in intent-related HDL comments in the HDL files describing the modular circuit design will likely be different from that expressed in control files 220 because the design refinement intent is provided at different stages of the design methodology 200 (e.g., logic design versus physical design refinement) and is therefore likely to be specified by different teams of designers (e.g., logic designers versus physical designers). Thus, by supporting specification of designer intent in both HDL files (through non-compiled intent-related HDL comments) and in control files 220 separate from the HDL files, different teams of designers can control the processing of a modular circuit design at different stages of design methodology 200 without sharing files or coordinating activities.

Referring now specifically to the content of control file 2500, it should first be noted that the statements in control file 2500 are not expressed as comments. HDL comment formatting is unnecessary since control file 2500 is not an HDL file and is not subject to compilation by an HDL compiler. Second, in order to promote understanding, control file 2500 expresses the same designer refinement intent as the intent-related HDL comments in HDL file 1300 of FIGS. 13A-13B. However, those skilled in the art will appreciate that it would not be typical to have the same designer intent expressed for the logic refinement processing performed by stitching engine 210 and the physical refinement processing performed by transform engine 218.

In the example of FIG. 25, the expression of designer intent begins with use statement 2502, which includes the command USE IMPLEMENTATION followed by the name of the alternative design for the region of interest ("sample2.my_intent.new_impl"). Because the design refinement intent is expressed over a collection of possibly multiple HDL files, the namespace of the region of interest takes the form of ENTITY NAME.INTENT REGION NAME.INTENT IMPLEMENTATION NAME. This namespace convention ensures that the designer intent only modifies the proper region(s) of the HDL file for the specified entity.

Control file 2500 then demarcates within the NHDL file defining entity "sample2" (see, e.g., FIGS. 13A-13B) a region of interest in a given implementation for which an alternative design is desired. In the exemplary syntax, the beginning of the region of interest is defined in control file 2500 by an intent begin statement 2504 followed by the HDL statement 2506 at the beginning of the region of interest. Note that, in this example, HDL statement 2506 is copied from logic statement 1334 in the HDL file for the entity "sample2"). The end of the region of interest is similarly defined in control file 2500 by an intent end statement 2510 preceded by an HDL statement 2508 after which the region of interest ends. Note that, in this example, HDL statement 2508 is copied from port declaration 1360 in the HDL file for the entity "sample2." Each of statements 2504 and 2510 includes the command @@INTENT followed by a unique name for the region of interest (e.g., "sample2.my_intent"). Control file 2500 finally defines the alternative design for the region of interest in an alternative region declaration 2512, which corresponding to alternative region declaration 1370, described above.

In response to receipt of a control file 220 such as control file 2500 for a given stage of refinement (e.g., one of refinement stages 2400, 2410, or 2418), transform engine 218 can perform refinement of the modular circuit design, for example, utilizing the processes previously described with reference to FIGS. 20-21. It should be noted that the second stage refinement 2410 performed by transform engine 218 receives as inputs PHDL files 203 and the "hierarchical" NHDL (HNDL) files 2406 generated by transform engine 218 through hierarchy transformation and signal pre-routing 2404, as described below. The second stage refinement 2410 generates "refined" HNHDL files (RHNHDL) files 2412.

The described technique of controlling refinement utilizing expressions of designer intent that are separable from the underlying HDL files (e.g., whether in HDL comments embedded in the HDL files or in a separate control file) offers a number of advantages. First, the use of separable expressions of design refinement intent allow a designer to retain a base description of the logical function(s) performed by an intent region within an implementation of entity in an abstract form that is easy for the human designer (and others) to read and comprehend. For example, a designer can easily determine the logic function of the logic statement C<=A*B, but may have difficulty in discerning the same function if presented in the form of a particular type of multiplier (e.g., Dadda, Wallace tree, etc.). Second, this base description of logic function is likely to persist through several technology generations of a given integrated circuit chip or, in any event, through a greater number of technology generations than the associated intent implementations, which tend to be more technology-dependent and/or of greater specificity and complexity. Third, designers are enabled to define and simulate intent implementations for intent regions in multiple varying levels of design complexity, ranging from fully abstract to near-full physical implementations. Fourth, designers can then simulate the design model to varying degrees of complexity. As will be appreciated, the more abstract implementations of intent regions generally correspond to more compact simulation models and promote greater simulation efficiency, albeit with less fidelity to the behavior of a physical implementation of a selected technology node. Conversely, the more detailed implementations of intent regions generally correspond to larger simulation models and slower simulation, but greater fidelity to the behavior of an actual physical implementation of the selected technology node.

Referring again to FIG. 24, following first stage refinement 2400, the modular circuit design is defined by the original PHDL files 203 and the RNHDL files 2402 obtained by the processing of NHDL files 205, derived NHDL files 212, and/or intent NHDL files 213 in first stage refinement 2400. The PHDL files 203 and RNHDL files 2402 are then processed by transform engine 218 at block 2404 to perform: (1) a logical hierarchy to physical design (PD) hierarchy transformation and (2) signal pre-routing.

At block 2404, transform engine 218, under control of control files 220 (as possibly pre-processed by pre-processor 208e), converts the hierarchy of instantiated entities comprising the modular circuit design, which initially exhibits a design-intent hierarchy structured based on logical function and on specific logic designer responsibility for the various constituent entities, into a PD hierarchy reflecting the actual physical design and layout of the integrated circuit to be produced and the boundaries of the portions of the design that will be processed and placed by logic synthesis engine 302 in a unitized manner. For example, a functional unit within a modular circuit design may include a number of NHDL entities that are meaningful decomposition of the functional unit into the design assignments of different human designers. This hierarchical structure allows for differing human designers to work independently of one another and for each designer to divide the overall logical function for which the designer is responsible into manageable separate NHDL files defining distinct portions of the designer's scope of design responsibility. However, when the integrated circuit design is subsequently processed in the physical design and integration and logic synthesis stages, the design hierarchy is preferably restructured to represent subdivisions of the design aligned with the logic synthesis and physical integration of the integrated circuit. Thus, as one example, multiple entities in the design hierarchy of a given designer may be combined into a single entity that will be processed by logic synthesis engine 302 as a whole. Reorganizing the design hierarchy in this manner allows logic synthesis engine 302 to synthesize larger portions of the design and to achieve optimizations over the larger portion of the design chosen based on physical design constraints. Restructuring the logical hierarchy of the modular circuit design into a PD hierarchy also allows the creation of entities that represent the sub-portions of the design that will be processed independently to produce PDHDL files. These PDHDL files can then be built up hierarchically to produce a set of PDHDL files defining the overall integrated circuit chip, as described further below with reference to FIGS. 33-35.

As noted above, control files 220 can be utilized to provide directives to control the transformation of the logical hierarchy to the PD hierarchy. Generally speaking, among other operations, these directives can specify the creation of an empty new entity, the deletion of an entity boundary, and the movement of a given entity within the hierarchy (e.g., up the hierarchy a certain number of levels and then down the hierarchy along a different branch of the instance tree). The logical connections between design entities are maintained throughout this process, with the appropriate port modification being made for each alteration of the design hierarchy. In at least some embodiments, the hierarchy transformation is constrained to not produce instances of the same HDL entity having differing internal logic or differing ports. This constraint against forming new entity variations can be removed in other embodiments (with a more complex tool implementation) by enabling the process of "uniquification," in transform engine 218 which produces additional versions, as necessary, of any entity that has instances with differing ports or structures after the processing of the transformation directives in control files 220.

Transform engine 218, at block 2404, also permits a designer as part of the logical to PD hierarchy transformation to override the default routing of signals connected between entities within the physical hierarchy by appropriate directives in control files 220. For example, consider a logical hierarchy of an integrated circuit design including three entities "region1," "region2," and "region3" at the same level of the hierarchy. Entity "region1" instantiates a child entity "A," entity "region2" instantiates a child entity "B, and a signal "X" connects entities "A" and "B." If this logical hierarchy is transformed to move entity "A" to entity "region3," the default routing algorithm of transform engine 218 may naturally route signal "X" from entity "region3" to entity "region2." However, in a particular integrated circuit design, the designer may believe that this default routing is not an optimal solution. Accordingly, the designer may include in control files 220 a directive to override the default routing to, for example, route the signal from entity "A" in entity "region3" through entity "region1" and then on to entity "B" in entity "region2" in order to retain or achieve a more optimal signal routing. Again, in at least some embodiments, transform engine 218 is constrained, in general, to not create instances of any given entity having differing ports or internal logic during the logical-to-physical hierarchy transformation that takes place in block 2404. In other embodiments, this constraint need not be observed, at the cost of additional tooling and design complexity.

After completion of the logical hierarchy to PD hierarchy transformation (along with any default routing overrides), transform engine 218, at block 2404, also performs preemptive signal pre-routing for any unconnected technology-specific control signals (e.g., such as signals 1504), if necessary. Without signal pre-routing, technology-specific control signals would conventionally be connected at the hierarchy level at which those technology-specific signals are generated. This signal connection may not be optimal in all cases, as discussed below with reference to FIG. 26.

Figure 26:
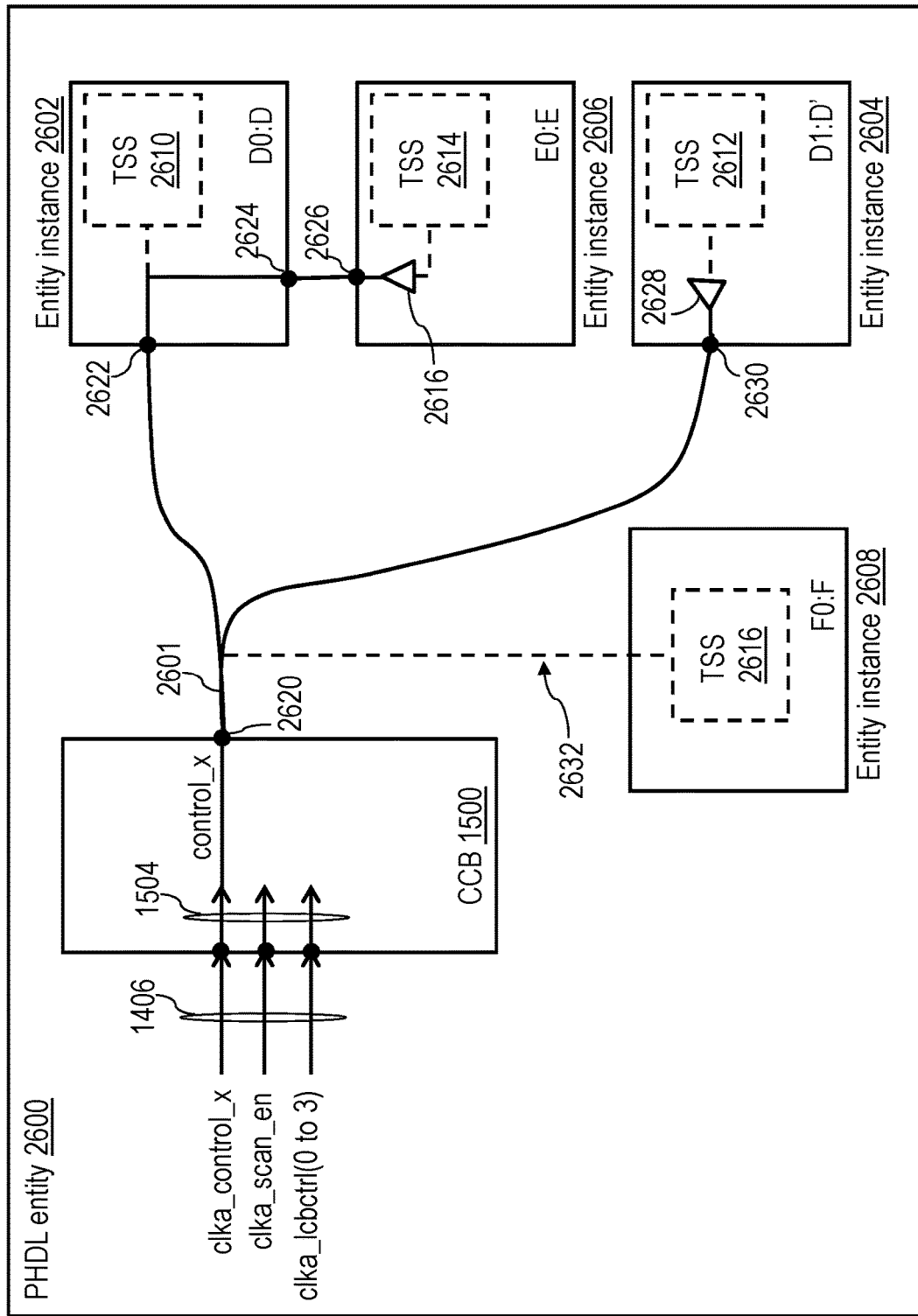
FIG. 26 depicts an exemplary PHDL entity in a physical design hierarchy that illustrates preemptive pre-routing of a technology-specific control signal by a transform engine in accordance with one embodiment.

Referring now to FIG. 26, there is depicted an exemplary PHDL entity 2600 in a PD hierarchy that illustrates preemptive pre-routing of a technology-specific signal by transform engine 218. In this example, PHDL entity 2600 includes a NHDL CCB 1500 that receives clka pervasive signals 1406 as inputs and produces, as outputs, pervasive signals 1504 including signal 2601 (i.e., "clka_control_x"), as previously described. PHDL entity 2600 also includes four PHDL entity instances 2602 (named D0:D), 2604 (named D1:D'), 2606 (named E0:E), and 2608 (named F0:F), where each instance name takes the form INSTANCE NAME:ENTITY NAME. As indicated by dashed line illustration, in subsequent processing at block 2414 of FIG. 24, transform engine 218 will create technology-specific structures (TSSs) 2610, 2612, 2614, and 2616 in entity instances 2602, 2604, 2606, and 2608, respectively. TSSs 2610, 2612, 2614, and 2616 are all sinks for signal 2601.

In some embodiments, transform engine 218 may, by default, "vertically" route each signal that a TSS sinks up the instance hierarchy of the integrated circuit design from the TSS to the first enclosing parent entity that sources the signal. For example, under this default routing methodology, transform engine 218 will establish a route for signal 2601 to TSS 2616 in entity instance 2608 directly from PHDL entity 2602, as shown generally at reference numeral 2632. While this default routing of signal connections may provide adequate or even optimal results in the general case, a designer may desire to specify a different routing in certain cases. For example, in the integrated circuit design depicted in FIG. 26, the physical implementation of entity instance 2602 may occlude or block a direct route between the output of CCB 1500 in PHDL entity 2600 and entity instance 2606. In this case, it may be more efficient in terms of wire length, routing level, and/or other routing metric(s), for the connection of signal 2601 to the prospective location of TSS 2614 within entity instance 2606 to pass through entity instance 2602 rather than around entity instance 2602.

In order to provide for the more optimal routing for signal 2601, transform engine 218 processes one or more anchor point directives in one or more of control files 220 to first establish an anchor point 2616 for signal 2601. In some embodiments or use cases, control files 220 and the directives therein can be read by a transform engine 218 from data storage 108. Alternatively or additionally, in some embodiments or use cases, control files 220 and the directives set forth therein can be created dynamically by a data processing system 100, for example, based on textual, graphical, gestural, verbal or other input types. In one possible implementation, the anchor point directives cause transform engine 218 to first create an anchor point 2616 within the entity instance of the design hierarchy at which the signal of interest is sourced (e.g., in this case PHDL entity 1500) and to then connect the newly created anchor point to a specified signal (e.g., signal "control_x" within PHDL entity 1500). An additional anchor point directive can then "drag" the anchor point through a specified series of entity instances, creating ports and internal signals as necessary to pre-route the specified signal to a sink. For example, the anchor point directives can be utilized to direct transform engine 218 to "drag" anchor point 2616 upwardly in the design hierarchy from PHDL entity 1500 to PHDL entity 2600, then downwardly in the design hierarchy from PHDL entity to entity instance 2602, then upwardly in the design hierarchy to PHDL entity 2600, and finally downwardly in the design hierarchy to entity instance 2606, which is the prospective location of the sink of the specified signal. The definition of this route by the anchor point directives causes transform engine 218 to automatically create output port 2620 on CCB 1500, input port 2622 and output port 2624 on entity instance 2602, and input port 2626 on entity instance 2606, as well as signal connections linking all of these ports.

In one or more embodiments, anchor point directives can also be utilized "clone" and route an anchor point for a signal as many times as desired to satisfy various sinks of the signal in the integrated circuit design. For example, in the example of FIG. 26, anchor point directives are utilized to cause transform engine 218 to clone anchor point 2616 within CCB 1500 to form anchor point 2628 and to then establish a route for anchor point 2628 from CCB 1500 to PHDL entity 2600 to entity instance 2604. The definition of this route by the anchor point directives causes transform engine 218 to automatically create input port 2630 for signal 2601 on entity instance 2604 and form a signal connection between ports 2620 and 2630. It should be appreciated that an anchor point can be cloned any number of times at any point or points along its route and that the pre-routing of a newly created anchor point(s) can diverge from the pre-routing of the original anchor point from the point the clone(s) are created.

FIG. 26 further illustrates that the process of preemptively pre-routing signals as shown can lead to the creation of new entities based off of existing entities (so-called "uniquification"). For example, prior to the processing of the anchor point directives by transform engine 218, entity instances 2602 and 2604 were two instances of a common entity "D" and thus had identical logic and ports. However, by processing the anchor point directives, transform engine 218 created differing sets of ports on entity instances 2602 and 2604 (i.e., entity instance 2604 lacks a port corresponding to output port 2624). Transform engine 218 preferably handles this case by automatically creating a new separate entity "D'."

In addition to HNHDL files 2406, transform engine 218 also preferably generates map files 2408 as an output of hierarchy transformation and signal pre-routing stage 2404. In at least some embodiments, signal names within an integrated circuit model are given model-wide unique names by appending, to the signal name, the name of each instance enclosing the signal. Thus, a signal "InstanceA.InstanceB.ExampleSignal" can provide a unique name for signal "ExampleSignal" appearing in entity instance "InstanceB," which is enclosed by parent entity instance "InstanceA." It is convenient if this signal naming convention is employed in both the RNHDL files 2402 describing a given integrated circuit design as a logical (or functional) hierarchy, as well as in HNHDL files 2406 describing the same integrated circuit design as a PD hierarchy. However, given the hierarchy transformation between the functional hierarchy and PD hierarchy performed by transform engine 218, which can modify the enclosing entity instances for signal in the design, signal names can be inconsistent between the functional hierarchy and PD hierarchy. Consequently, to enable other tools (e.g., power simulation tools, wave form tracing tools, etc.) to easily access signals from either representation of the integrated circuit design, transform engine 218 produces map files 2408, which associate signal names from the RNHDL files 2402 defining the functional hierarchy with signal names from the HNHDL files 2406 the PD hierarchy.

Figure 27:
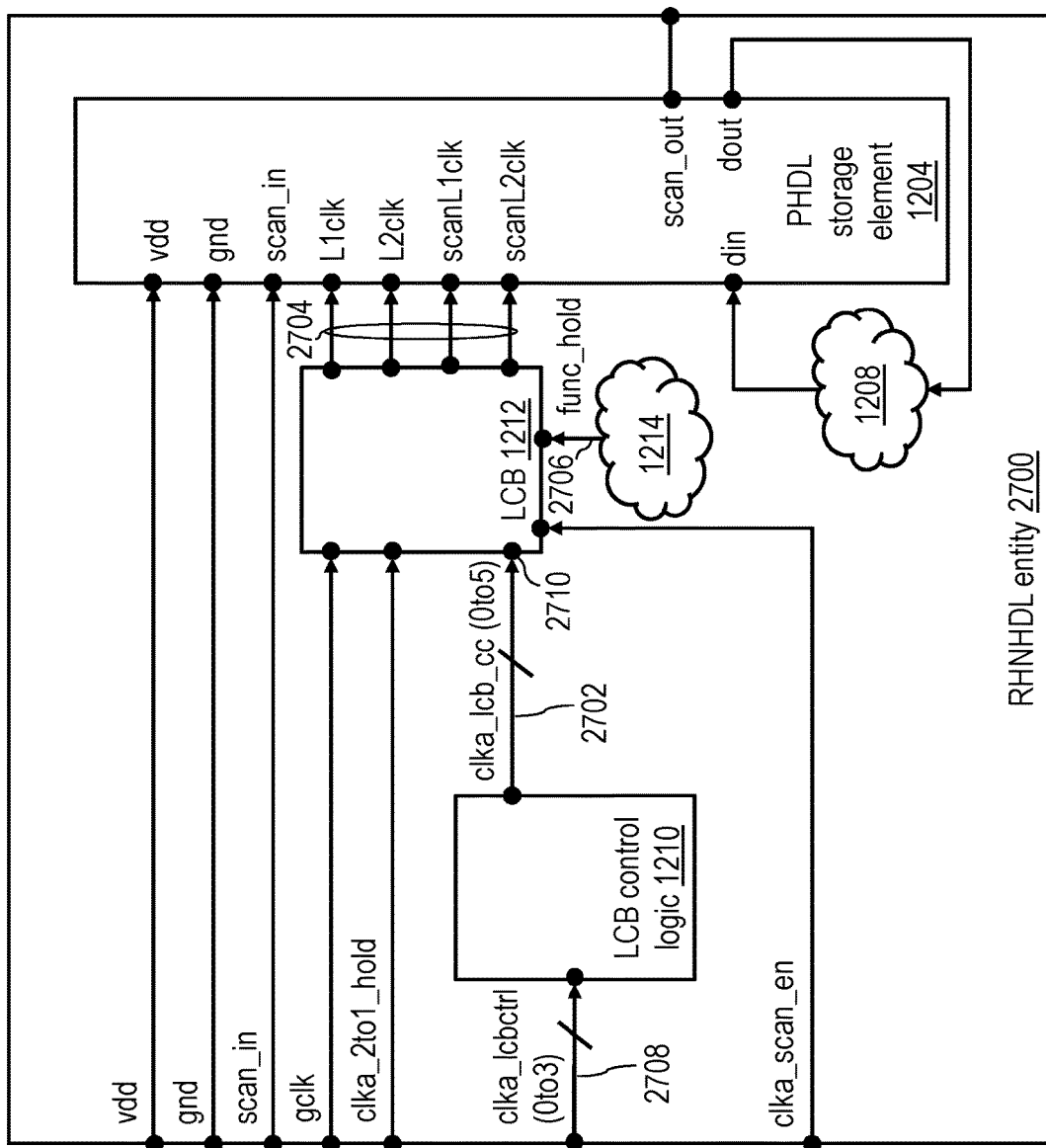
FIG. 27 illustrates a high-level logical flowchart of an exemplary refined hierarchical NHDL (RHNHDL) entity that is processed by a transform engine during technology mapping and structure insertion in accordance with one embodiment.

With reference now to FIG. 27, there is illustrated a high-level block diagram of an exemplary RHNHDL entity 2700 that is processed by transform engine 218 during technology mapping and structure insertion 2414 in accordance with one embodiment. As indicated by similar reference numerals, RHNHDL entity 2700 of FIG. 27 includes the same basic components (i.e., PHDL storage element 1204, dataflow logic 1208, LCB control logic 1210, LCB 1212, and clock logic 1214) as NHDL entity 1200 of FIG. 12, described above. In addition, RHNHDL entity 2700 has the same collection of ports, namely, "vdd," "gnd," "scan_in," "scan_out," "gclk," "clka_2to1_hold," "clka_lcbctrl(0 to 3)," and "clka_scan_en." It is noted that the names of "clka_2to1_hold," "clka_lcbctrl(0 to 3)," and "clka_scan_en" reflect localization of the associated signals to the clka clock domain. Control signal 2708 (named "clka_lcbctrl(0 to 3)") drives LCB control logic 1210, which, in turn, provides control signal 2702 (named "clka_lcb_cc(0 to 5)") to LCB 1212. Based on control signal 2702, signal "clka_scan_en," and signal 2706 (named "func_hold"), LCB 1212 generates SE clock signals 2704, which drive ports "L1clk," "L2clk," "scanL1clk," and "scanL2clk" on PHDL storage element 1204.

RHNHDL entity 2700 contains three of the four technology-specific structures (TSSs) involved in modeling a physical storage element. (The one TSS not included is the clock divider that performs a divide-down function on the gclk to produce signals to drive the attached storage element at the proper clock ratio to the base gclk.) The first of the TSSs in RHNHDL 2700 is PHDL SE 1204, which transform engine 218 utilizes to replace a corresponding NHDL storage element. In an exemplary embodiment, the ports "L1clk," "L2clk," "scanL1clk," and "scanL2clk" on PHDL storage element 1204 are constrained to be connected within the same design entity (i.e., RHNHDL 2700) to a specific TSS (in this case, LCB 1212). Although only one LCB 1212 is shown in FIG. 27, in other examples, a single design entity may include multiple PHDL SEs 1204 driven by the same LCB 1212, as long as those PHDL SEs 1204 have the same functional clock (as specified by REGION:RATIO of the logical clock) and share the same or equivalent "func_hold" signal 2706. Of course, there is a practical upper limit to the number PHDL SEs 1204 that a given LCB 1212 can drive. If this number is exceeded in a given design entity, another LCB 1212 can be instantiated. For the simplicity of description, however, it will hereinafter be assumed a respective LCB 1212 is connected to each PHDL SE 1204.

When transform engine 218 replaces a given NHDL SE with the combination of a PHDL SE 1204 and LCB 1212, transform engine 218 removes the logical clock signal and port for the logical clock signal from the enclosing entity because the logical clock signal is no longer necessary. In addition, transform engine 218 adds a number of new technology specific signals (i.e., "vdd," "gnd," "scan_in," "scan_out," clka_2to1_hold," "scan_en," "lcb_cc(0 to 5)") to the enclosing entity (e.g., RHNHDL entity 2700). Transform engine 218 also connects the signals formerly connected to the now-replaced NHDL SE with equivalent connections to the PHDL TSSs. For example, in this case, transform engine 218 connects signals "din," "dout," and "func_hold" to the existing NHDL signals.

The remaining unconnected technology-specific signals (e.g., "vdd," "gnd," "scan_in," "scan_out," "gclk," "clka_2to1_hold," "clka_lcb_cc(0 to 5)," and "scan_en") may be satisfied at entity 2700 or a higher level of an instance hierarchy of the integrated circuit model including RHNHDL entity 2700 and may therefore require transform engine 218 to create new ports on the enclosing RHNHDL entity 2700 to support connections to these signals. These signals are referred to herein as "floatable" signals in that connections for these signals are allowed to "float" up to higher levels in the instance hierarchy until an appropriate source signal is found (an error occurs if these signals do not ultimately connect in the overall integrated circuit model). In general, the "vdd" and "gnd" signals can be connected by transform engine 218 through application of a methodology not discussed herein that inserts voltage fences and voltage level translators based on directives contained in a control file. The "scan_in" and "scan_out" signals, which are used to control operation of the PHDL storage element 1204 when operating as a scan chain, are typically connected by transform engine 218 to one or more other storage elements in a daisy chain fashion utilizing a process not described herein in detail.

Floatable signals can be grouped in two types. The signals of the first type of floatable signals (e.g., "gclk" and "scan_en") continue to propagate up the instance hierarchy and merge with other sinks of the same signal until an appropriate signal source is found. In practice, signals of the first type of floatable signals are not physically implemented as a large fanout tree of wires from a single source. Instead, transform engine 218 automatically inserts buffers and staging latches along the signal paths as the wires propagate up the hierarchy to provide a viable signal at all of the sinks of the signal. The present specification omits discussion and illustration of these conventional buffers and staging latches to avoid obscuring the inventions.

The second type of floatable signals, referred to herein as "obligation" signals, refers to floatable signals whose presence implies that an additional technology-specific structure must be added to source the given obligation signal either in the current entity or some other enclosing entity at a higher level of the instance hierarchy. For example, LCB 1212 is a non-floating technology structure that receives control signal 2702 as an input. This presence of that obligation signal (or more precisely, the input port 2710 for control signal 2702 on LCB 1212) following insertion of LCB 1212 by transform logic 218 results in an "obligation" to have an instance of LCB control logic 1210, either in the same entity as LCB 1212 or in an enclosing entity at a higher level of the instance hierarchy, to source control signal 2702. Technology-specific structures that can be instantiated by transform engine 218 while propagating obligation signals up the instance hierarchy are themselves referred to as "floatable" technology-specific structures. When transform engine 218 inserts LCB control logic 1210 in RHNHDL entity 2700, transform logic removes control signal 2702 from the set of obligation signals and adds control signal 2708 (i.e., the input to LCB control logic 1210) to the obligation set. Similarly, the presence of signal "clka_2to1_hold" attached to an input of LCB 1212 implies the need to connected to a floatable clock divider at the current or a higher level of the instance hierarchy (in this example, the clock divider is instantiated in a higher level entity and thus not shown within RHNHDL entity 2700).

The obligation set of a given entity after the technology-specific structures that must be inserted into the entity (such as LCB 1212 and PHDL storage element 1204) are placed, implies a list, if any, of "eligible" floatable technology-specific structures that may be inserted into the given entity. Directives from control files 220 determine, which of the eligible technology structures, if any, transform engine 218 instantiates at each instance of an entity. For example, in the example of FIG. 27, transform engine 218 instantiates LCB control logic 1210 in entity RHNHDL entity 2700, but not the requisite clock divider. Any signals sourced by the instantiated eligible floatable technology-specific structures are removed from the obligation set.

The input(s) of a newly instantiated floatable technology-specific structure may, in turn, be obligation signal(s). If this is the case, transform engine 218 adds these obligation signal(s) to the obligation set. Finally, transform engine 218 creates ports on the enclosing entity for any signals in the obligation set that remain unconnected and connects the newly created ports to the relevant unconnected signals in the obligation set of signals. These previously unconnected signals will then constitute the portion of the obligation set on the next higher level of the instance hierarchy from this design entity. For example, in FIG. 27, the signals "gclk," "clka_2to1_hold," "clka_lcbctrl(0 to 3)," and "clka_scan_en" form the portion of the obligation set contributed by RHNHDL entity 2700 to the obligation set formed at the next highest level of the instance hierarchy level (again, ignoring signals "vdd," "gnd," "scan_in," and "scan_out," which are handled separately).

Figure 28:
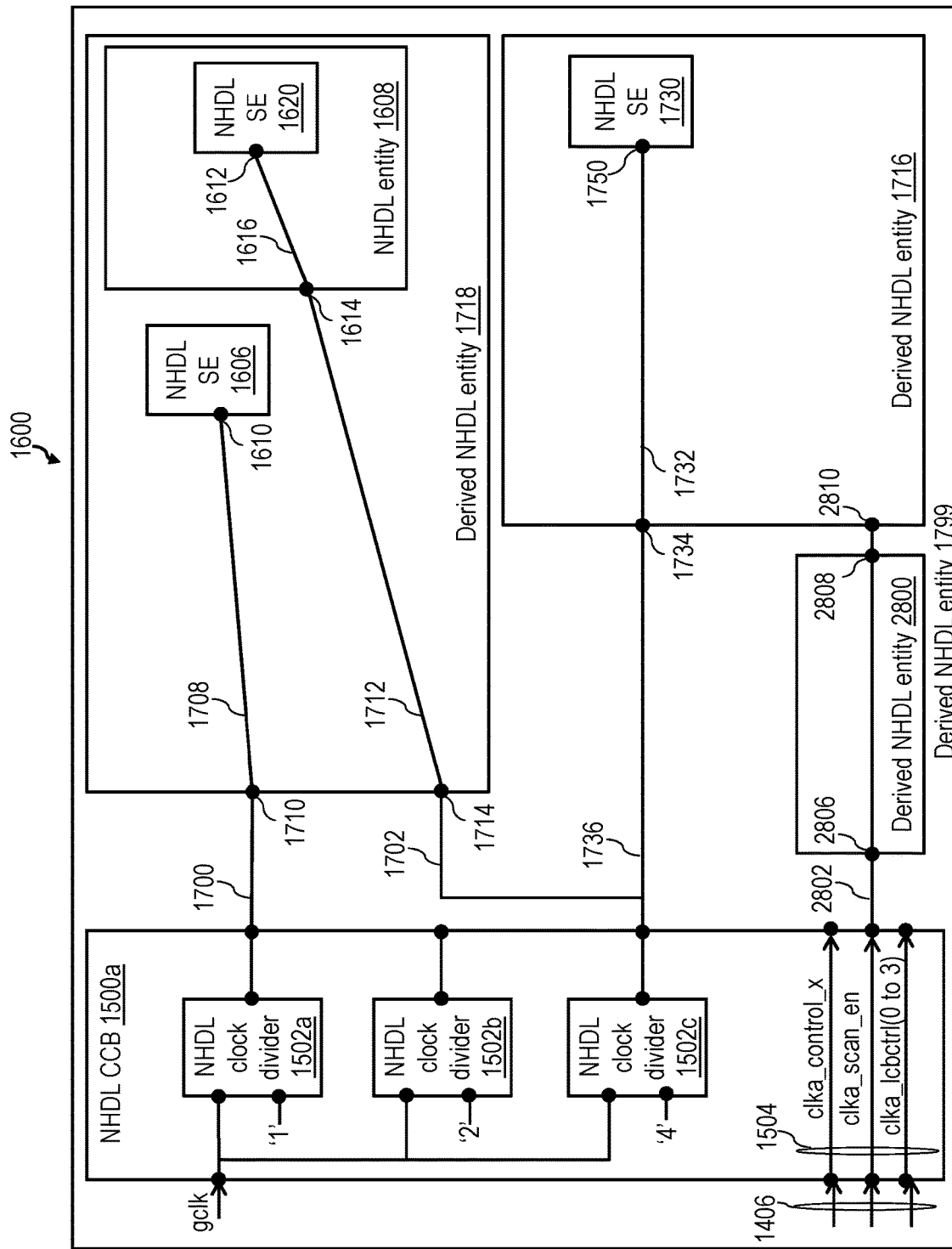
FIGS. 28-31 depict the processing of an exemplary integrated circuit design by a transform engine during technology mapping and structure insertion in accordance with one embodiment.
Figure 29:
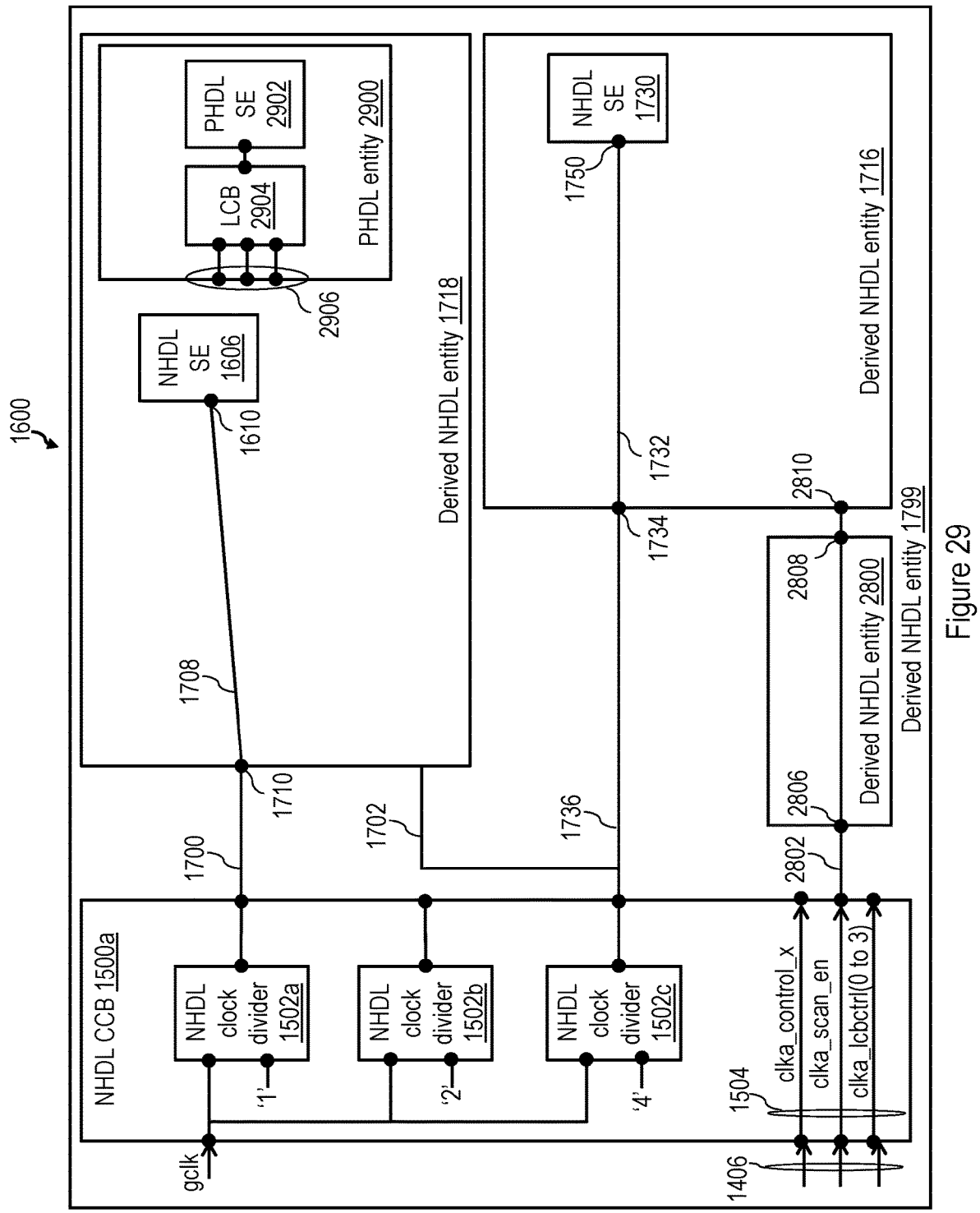
Figure 30:
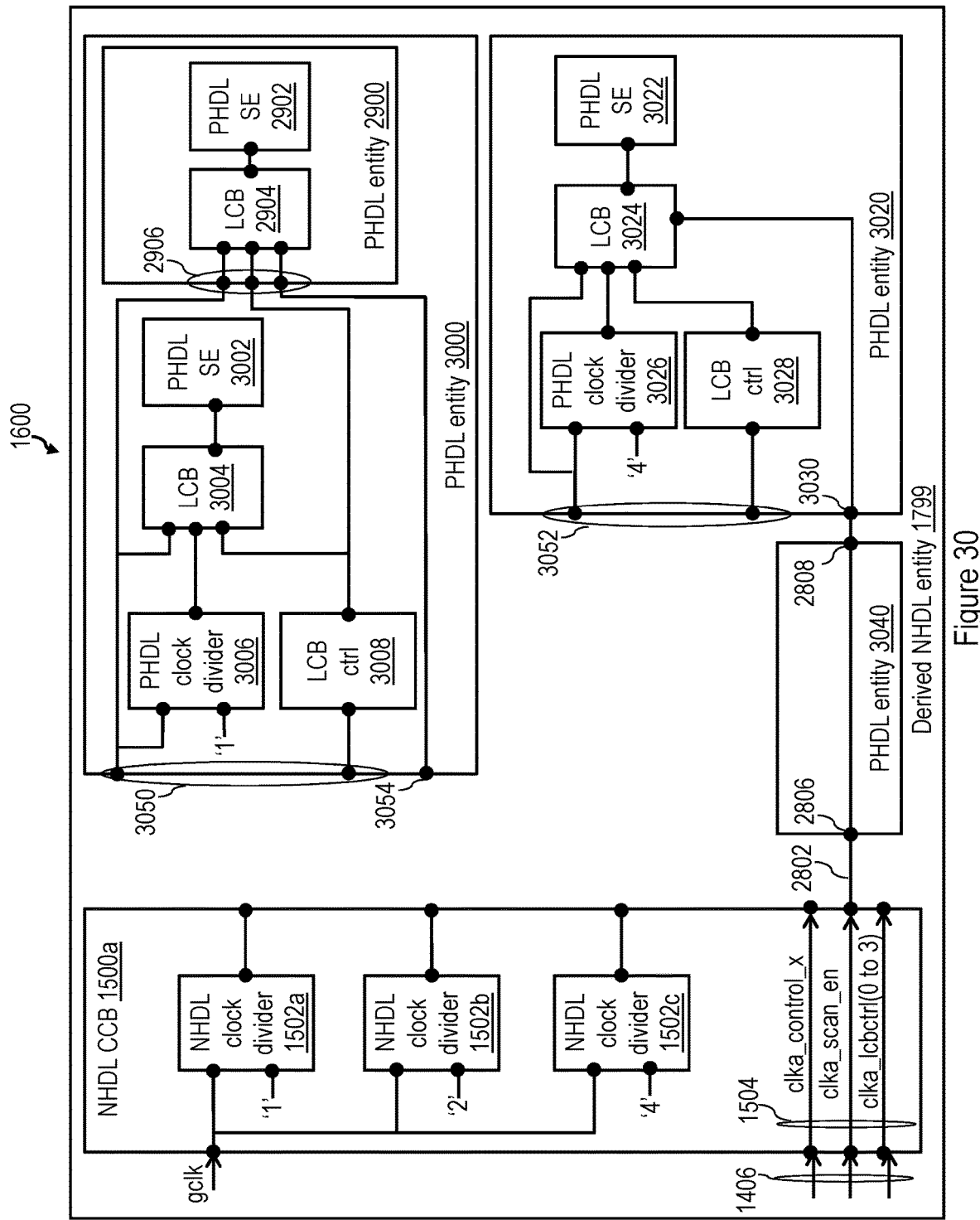
Figure 31:
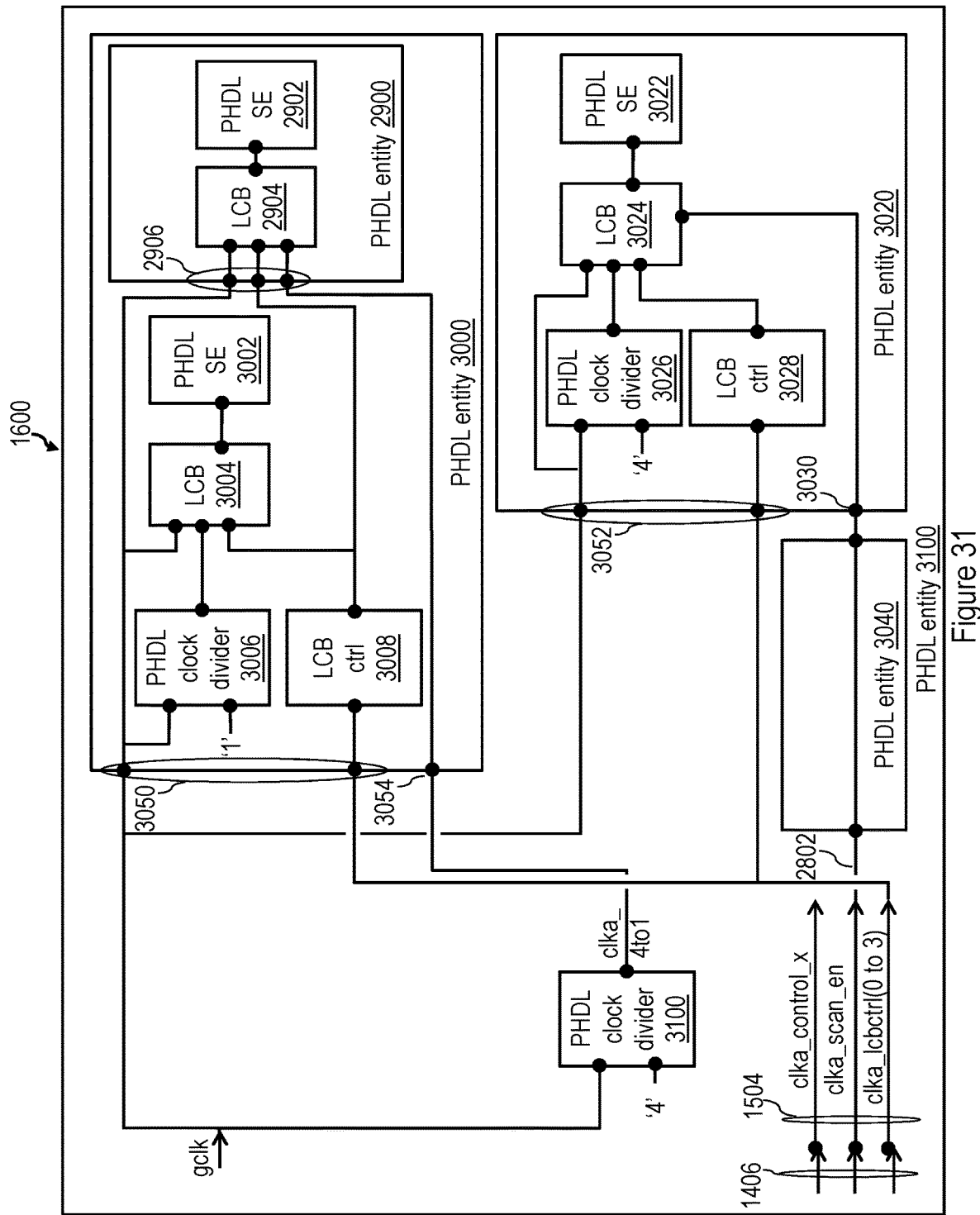

Referring now to FIGS. 28-31, there are depicted multiple views of an exemplary integrated circuit design 1600 illustrating various steps performed by a transform engine 218 during technology mapping and structure insertion 2414 in accordance with one embodiment. As indicated by like reference numerals, FIG. 28 illustrates a portion of integrated circuit design 1600 following the processing by stitching engine 210 as described above with reference to FIGS. 16-17 and after processing by transform engine at stages 2400, 2404, and 2410, but prior to transform engine 218 performing technology mapping and structure insertion at block 2414 of FIG. 24. FIGS. 29 and 30 illustrate the intermediate states of the same portion of integrated circuit design 1600 following first and second iterations of bottom-up processing of instances by transform engine 218 at block 2414. FIG. 31 depicts a state of the same portion of integrated circuit design 1600 as represented by TPHDL files 2416 (and possibly, PHDL files 203) at the conclusion of processing by transform engine 218 at block 2414. To better illustrate the principles of the inventions disclosed herein, PCL 1400 is omitted from these views and a heretofore unillustrated derived NHDL entity 2800 within integrated circuit design 1600 is now shown.

As shown specifically in FIG. 28, during processing by transform engine 218 at block 2404, transform engine has preemptively pre-routed a technology-specific signal, namely, signal 2802 (named "clka_scan_en"), from the output of NHDL CCB 1500a through derived NHDL entity 2800 to derived NHDL entity 1716 (thus establishing ports 2806 and 2808 on derived NHDL entity 2800 and port 2810 on derived NHDL entity 1716 in accordance with the process described above with reference to FIG. 26. As shown in FIG. 27, "clka_scan_en" signal 2802 is one of the input signals of LCBs (e.g., LCB 1212). It should be understood that although "clka_scan_en" signal 2802 is only illustrated in FIGS. 28-31 as being routed to derived NHDL entity 1716 to avoid obscuring the disclosed inventions, in practice "clka_scan_en" signal 2802 is an input of all LCBs in the clka clock region.

At block 2404, transform engine 218 processes the PD instance hierarchy defined by RHNHDL files 2412 in a bottom-up manner, as described below in detail with reference to FIG. 22 and FIGS. 32A-32C. In the example of integrated circuit design 1600, this bottom-up processing of the instance hierarchy begins in the instance at the greatest depth, which in NHDL SE 1620. As described below with reference to block 3202 of FIG. 32A, transform engine 218 does not perform any processing within a NHDL SE, as these are examples of structures that are replaced by transform engine 218 during processing at a subsequent higher level of hierarchy.

Transform engine 218 next processes instances at a next higher level of the instance hierarchy of integrated circuit model 1600, which includes instances NHDL SE 1606, NHDL entity 1608, NHDL SE 1730, and NHDL clock dividers 1502a-1502c. With the exception of NHDL entity 1608, all of these entities are replaced by transform engine 218 during processing at a subsequent level of hierarchy. Accordingly, processing by transform engine 218 of NHDL SE 1606, NHDL SE 1730, and NHDL clock dividers 1502a-1502c is deferred until processing at a subsequent higher level of hierarchy, as described with reference to block 3202 of FIG. 32A. Transform engine 218 does, however, perform processing within NHDL entity 1608. This processing includes replacement of NHDL SE 1620 with technology-specific structures (TSSs) and, in particular, a PHDL SE 2902 and associated LCB 2904 that provides SE clock signals 2704, as generally depicted in FIGS. 28-29 and blocks 3206-3208 of FIG. 32A. This replacement of an abstract NHDL storage element with a technology-specific PHDL storage element converts NHDL entity 1608 into a PHDL entity 2900. Transform logic 218 then connects the existing signal(s) within PHDL entity 2900 that correspond to the ports of the newly instantiated TSS, which in this case include signal "din," "dout," and "act," as described at block 3208. As also depicted at block 3208 of FIG. 32A and as shown in FIGS. 28-29, transform engine 218 deletes logical clock port 1614 from NHDL entity 1608, thus removing signal connection 1616.

Transform logic 218 then forms an obligation set of signals for the instantiated TSSs (i.e., PHDL SE 2902 and LCB 2904), as discussed below with reference to block 3220 of FIG. 32B. As discussed above with reference to FIG. 27, for PHDL SE 2902 and LCB 2904, this obligation set includes (again, ignoring separately processed signals "vdd," "gnd," "scan_in," "scan_out," and "clk_scan_en") signals "gclk," "clka_2to1_hold," and "clka_lcb_cc(0 to 5)." Because none of these signals are present in PHDL entity 2900, transform engine 218 does not connect any of these signals when initially processing within PHDL entity 2900 (see, e.g., block 3222 of FIG. 32B). Transform engine 218 additionally determines which floatable technology-specific structures are eligible to be added to PHDL entity 2900 to drive the signals in the obligation set of signals (see, e.g., block 3224 of FIG. 32B). As noted above in the discussion of FIG. 27, for PHDL SE 2902 and LCB 2904, these floatable technology-specific structures include a PHDL clock divider and LCB control logic. However, because control files 220 do not specify the insertion of either of these floatable technology-specific structures in PHDL entity 2900, transform engine 218 does not insert either of these floatable technology-specific structures into PHDL entity 2900 (see, e.g., block 3226 of FIG. 32B). Accordingly, transform logic 218 automatically adds ports to support unconnected signals in the obligation set signals (i.e., "gclk," "clka_2to1_hold," and "clka_lcb_cc(0 to 5)") on PHDL entity 2900, as shown generally at reference numeral 2906 of FIG. 29 and described below with reference to block 3236 of FIG. 32B.

Thereafter, transform logic 218 processes instances at a next higher level of the instance hierarchy of integrated circuit model 1600, which includes derived NHDL entities 1716 and 1718, derived NHDL entity 2800, and NHDL CCB 1500*a*. Transform engine 218 need not add any TSS to derived NHDL entity 2800 and therefore directly reclassifies the entity as a PHDL entity 3040, as illustrated in FIG. 30. Transform engine 218 also performs no additional processing on NHDL CCB 1500*a* at this point because NHDL CCB 1500*a* is a structure having a predetermined rule that causes it to be replaced at a subsequent processing step (see, e.g., block 3202 of FIG. 32A).

In the same manner described above with reference to NHDL SE 1620, when transform engine 218 processes derived NHDL entity 1716 and 1718, transform engine 218 replaces each of NHDL SE 1606 and NHDL SE 1730 with a respective PHDL SE 3002 or 3022 and associated LCB 3004 or 3024, as shown in FIGS. 29-30. This replacement of the abstract NHDL SEs with TSSs converts derived NHDL entities 1718 and 1716 into PHDL entities 3000 and 3020, respectively. However, in each of these cases, control files 220 direct transform engine 218 to instantiate, in PHDL entity 3000 and PHDL entity 3020, the floatable TSSs to provide the obligations signals for PHDL SEs 3002, 3022 and LCBs 3004, 3024. Accordingly, transform logic 218 instantiates PHDL clock divider 3006 and LCB control logic 3008 in PHDL entity 3000 and instantiates PHDL clock divider 3026 and LCB control logic 3028 in PHDL entity 3020 (see, e.g., block 3226 of FIG. 32B). In addition, transform engine 218 connects the obligation signal provided by PHDL clock divider 3006 to LCB 3004, connects the obligation signal provided by LCB control logic 3008 to LCBs 3004 and LCB 2904, and connects the obligation signals provided by PHDL clock divider 3026 and LCB control logic 3028 to LCB 3024 (see, e.g., block 3226 of FIG. 3226). Transform engine 218 adds and removes the relevant signals from the obligation set of signals for PHDL entities 3000 and 3020, leaving "gclk" and signal 2708 (i.e., "clka_lcbctrl(0 to 3)") as the remaining unconnected obligation signals in PHDL entities 3000 and 3020, Accordingly, transform engine 218 creates ports for these signals on PHDL entities 3000 and 3020, as shown at reference numerals 3050 and 3052, respectively (see, e.g., FIG. 32B, block 3236). Transform engine 218 also creates a port 3054 on PHDL entity 3000 because signal "clka_2to1_hold" for LCB 2904 remains in the obligation set for PHDL entity 3000 (see, e.g., FIG. 32B, block 3236).

Figure 32A:
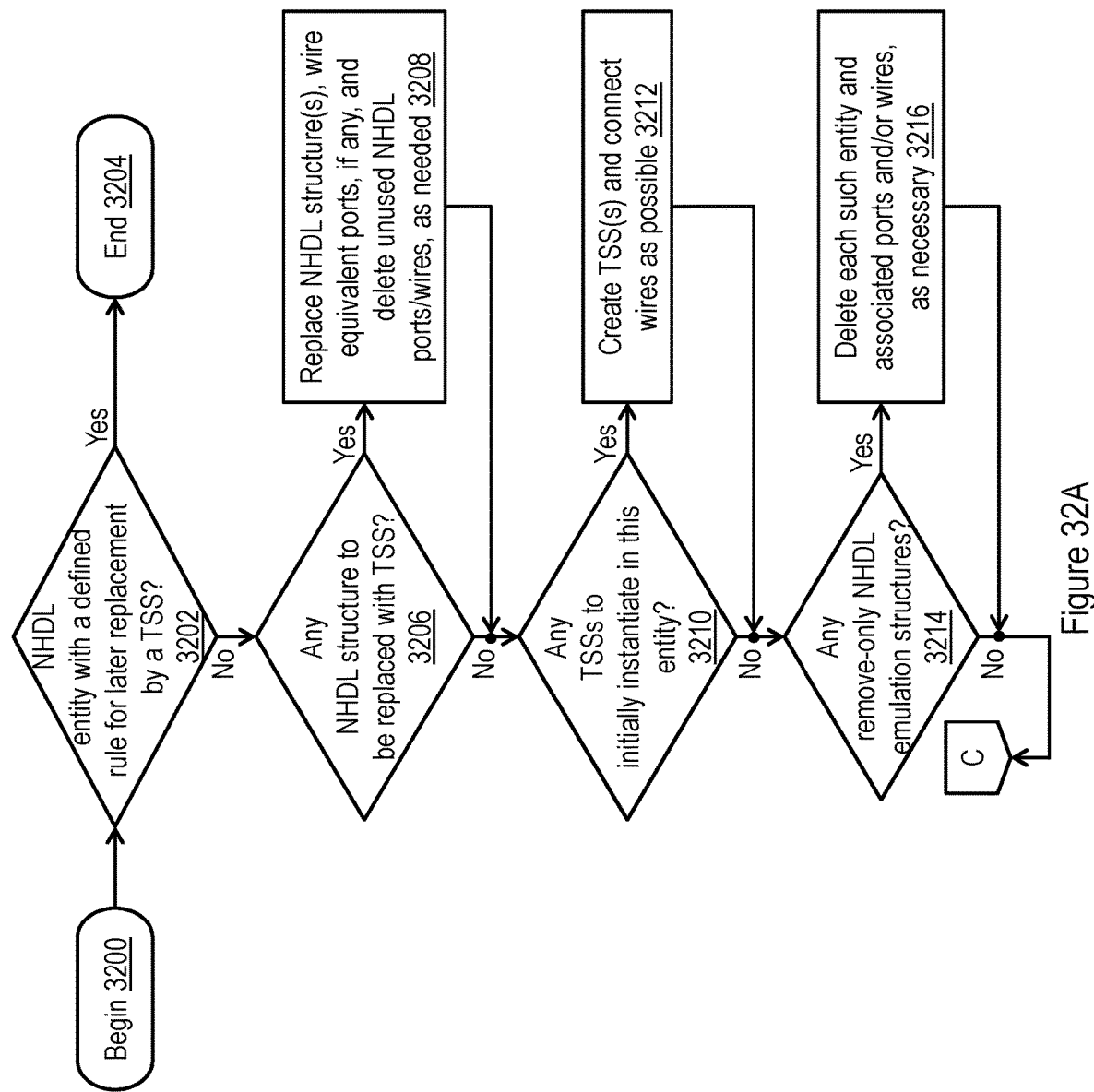
FIGS. 32A-32C together form a high-level logical flowchart depicting an exemplary processes by which a transform engine processes an integrated circuit design during technology mapping and structure insertion in accordance with one embodiment.
Figure 32B:
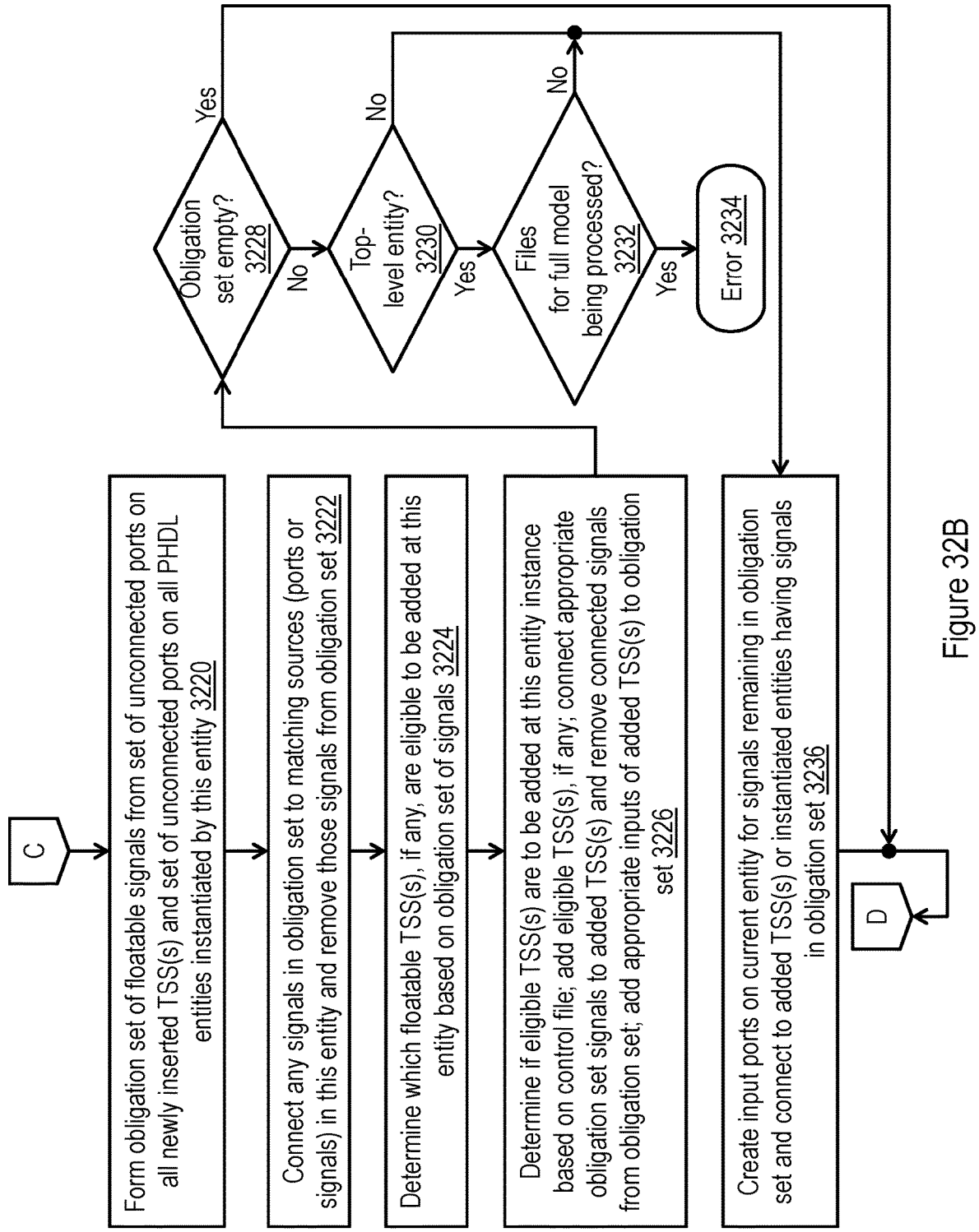

An additional detail of the processing performed by transform engine 218 depicted in FIG. 30 (and representative of similar processing at other entities) is that the preemptive pre-routing of "clka_scan_en" signal 2802 to port 3030 on PHDL entity 3020 at block 2404 causes transform engine 218 to thereafter automatically connect this input port to the floatable obligation signal "clka_scan_en" on LCB 3024 when LCB 3024 is instantiated in PHDL entity 3020 (see, e.g., FIG. 32B, block 3222).

Thereafter, transform logic 218 processes top level of the instance hierarchy of integrated circuit model 1600, which is derived NHDL entity 1799. Within derived NHDL 1799, transform engine 218 determines that NHDL CCB 1500*a* is to be replaced in accordance with a rule set for NHDL CCBs (see, e.g., FIG. 32A, block 3206). In accordance with this rule set, the processing of NHDL CCB 1500*a* includes dissolving the entity boundary of NHDL CCB 1500*b*, connecting the signals NHDL CCB 1500*a* sources to the appropriate sinks, and removing any unused clock dividers among clock dividers 1502*a*-1502*c*. The result of this processing by transform engine 218 is depicted in FIG. 31. In particular, the boundary of NHDL CCB 1500*a* is removed, NHDL clock divider 1502*c* is replaced with a corresponding PHDL clock divider 3100, the "clka_4to1" signal required by LCB 2904 is connected to the associated input port on PHDL entity 3000, and the "gclk" and "clka_lcbctrl(0 to 3)" signals are connected to corresponding ports on PHDL entity 3000 and PHDL entity 3020. Because all NHDL entities within integrated circuit design 1600 have been removed or replaced, derived NHDL entity 1799 is transformed into a PHDL entity 3100.

Figure 32C:
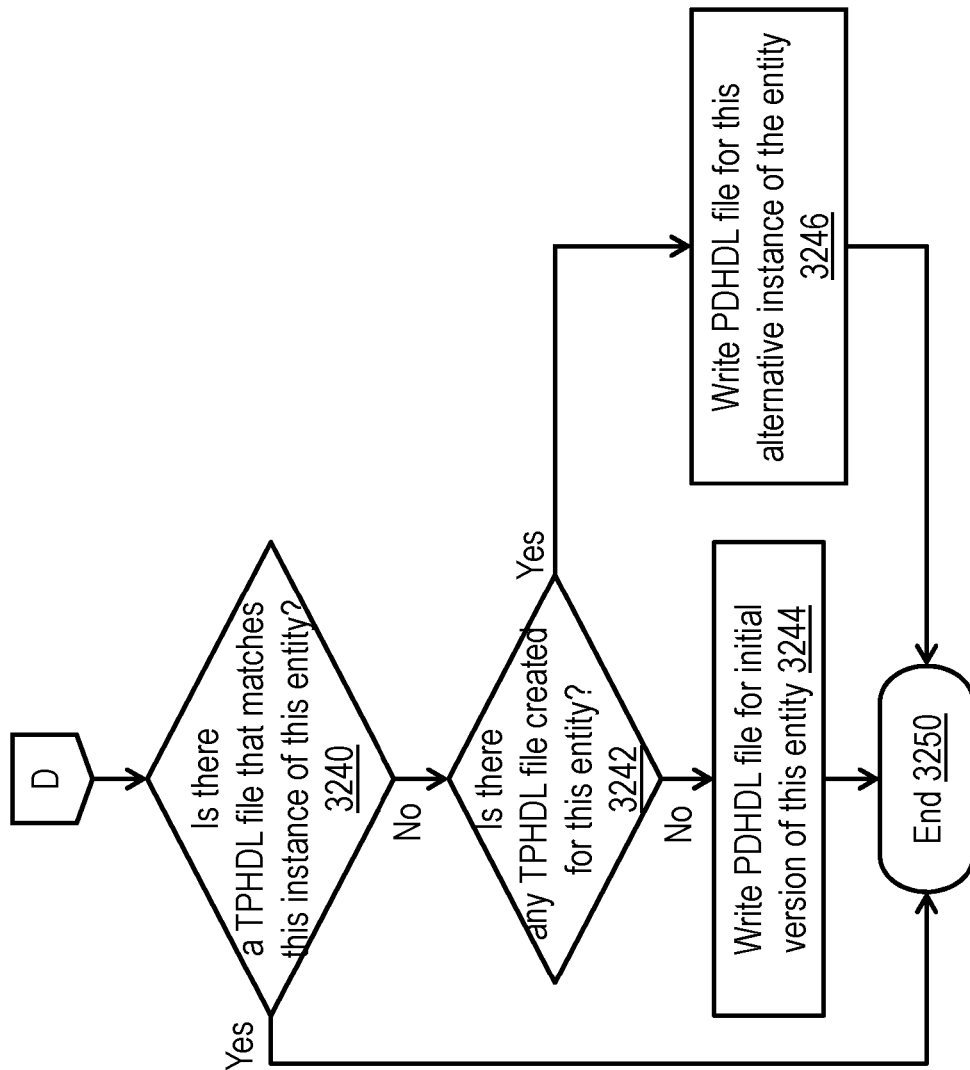

With reference now to FIGS. 32A-32C, there is illustrated a high-level logical flowchart of an exemplary process by which transform engine 218 performs technology mapping and structure insertion at block 2414 of FIG. 24 in accordance with one embodiment. In at least one embodiment, an iteration of the illustrated process is performed for each NHDL entity in an instance tree defining a hierarchical integrated circuit model as the instance tree is traversed in a bottom-up manner, for example, as described above with reference to FIG. 22.

The process of FIGS. 32A-32C begins at block 3200 and then proceeds to block 3202, which illustrates transform engine 218 determining whether or not a NHDL entity selected for processing in the bottom-up traversal of the instance tree of the integrated circuit design is an NHDL entity with a predefined rule for replacement by a technology-specific structure (TSS). In some embodiments, examples of such NHDL entities would include NHDL CCBs 1500 and NHDL SEs, which transform engine 218 replaces with PHDL entities at a subsequent processing step. In response to an affirmative determination at block 3202, handling of the selected NHDL entity is complete, and the process of FIG. 32A ends at block 3204.

In response to a negative determination at block 3202, transform engine 218 determines whether any the selected SHDL entity includes an NHDL structure to be replaced with a technology-specific structure. For example, in some embodiments, at block 3202, transform engine 218 determines that each NHDL SE, if any, within the selected NHDL entity is to be replaced by the combination of a PHDL SE and LCB. In response to an affirmative determination at block 3206, transform engine 218 replaces one or more NHDL structures with corresponding technology-specific structures (block 3208). At block 3208, transform engine 218 additionally wires each port, if any, on the TSS(s) equivalent to a port on a replaced NHDL structure with an existing signal in the NHDL entity and deletes any unused NHDL ports or signal connections. Following block 3208 or a negative determination at block 3206, the process passes to block 3210.

Block 3210 illustrates transform logic 218 determining whether or not control files 220 and/or the nature of the entity being processed direct transform engine 218 to initially instantiate a TSS (as opposed to replacing an existing NHDL structure) in the currently selected NHDL entity. As one example, a directive in control file 220 or the presence of an array structure in the entity being processed may direct transform engine 218 to create an array built-in self-test (ABIST) engine to facilitate testing of an array in the NHDL entity. In response to an affirmative determination at block 3210, transform engine 218 creates the specified TSS(s) in the selected NHDL entity and connects any available signal connections within the NHDL entity to the newly instantiated TSS(s) (block 3212). Following block 3212 or in response to a negative determination at block 3210, the process passes to block 3214. At block 3214, transform logic 218 determines whether or not there are NHDL entities present that are designated (typically by convention such as name of the entity or a control file directive) to be simply removed (rather than replaced) from the entity as part of the NHDL-to-PHDL transformation. One example of such a structure is clock shim 1206 of FIG. 12, which is employed to enable inclusion of a PHDL entity into a NHDL functional simulation model. In response to an affirmative determination at block 3214, transform engine 218 deletes each specified entity, as well as any associated ports and/or wires, as necessary (block 3216). Following block 3216 or a negative determination at block 3214, the process passes through page connector C to FIG. 32B.

Referring now to FIG. 32B, the process proceeds from page connector C to block 3220, which illustrates transform engine 218 forming an obligation set of floatable signals from a set of ports for such signals on all newly inserted TSS(s) and the set of ports for such signals on all PHDL entities instantiated by the selected NHDL entity. Transform engine 218 then connects any signals in the obligation set formed at block 3220 to any matching sources (ports or signals) in the selected NHDL entity and removes those signals from the obligation set (block 3222). Transform engine 218 also determines a list of eligible floatable TSS(s), if any, that are eligible to be added at the selected NHDL entity based on obligation set of signals (block 3224). At block 3226, transform engine 218 examines control files 220 to determine if control files 220 include a directive specifying that any eligible floatable TSS(s) in the list formed at block 3224 are to be added in the selected NHDL entity instance. If so, transform engine 218 adds one or more eligible floatable TSSs to the current NHDL entity instance, connects appropriate floatable signals in the obligation set to the newly added TSS(s), and removes the connected floatable signals from the obligation set (block 3226). At block 3226, transform engine 218 also adds appropriate input signals of the added TSS(s) to the obligation set for the selected NHDL entity.

Following block 3226, transform engine 218 determines at block 3228 whether or not the obligations set of signals is empty. If so, the process passes directly FIG. 32C through page connector D. If, however, transform engine 218 determines at block 3228 that the obligation set of signals is not empty, transform engine 218 additionally determines at blocks 3230-3232 whether or not the selected NHDL entity is the top-level entity of the integrated circuit design and whether or not all files for the full integrated circuit design are being processed (i.e., it is not just a portion of the overall model being processed). In response to affirmative determinations at blocks 3230-3232, the process of FIG. 32B terminates with an error at block 3234 because at least one required signal in the obligation set was not found in the RHNHDL files 2412 defining the integrated circuit design. If, however, transform engine 218 makes a negative determination at either of blocks 3230-3232, the process proceeds to block 3236, which illustrates transform engine 218 creating input ports on the currently selected NHDL entity for all floatable signals remaining in the obligation set and connects these ports to the TSS(s), if any, added at block 3226 and/or instantiated entities having signals in the obligation set of signals. Following block 3236, the process passes through page connector D to FIG. 32C.

In FIG. 32C, the process passes from page connector D to block 3240, which illustrates transform engine 218 determining whether or not a TPHDL file 2416 that matches the present instance of the selected NHDL entity already exists. If so, there is no need to duplicate the existing file. Accordingly, the process of FIG. 32C ends at block 3250 without creating a TPHDL file 2416. However, in response to a negative determination at block 3240, transform engine 218 determines at block 3242 whether or not any TPHDL file 2416 exists that corresponds to the selected NHDL entity. If not, transform engine 218 writes a PDHDL file 2416 representing an initial PHDL version of the selected NHDL entity (block 3244). If, however, transform engine 218 determines at block 3242 that the selected NHDL entity already has a corresponding TPHDL file 2416 that does not match the current instance of that entity, transform engine 218 creates a TPHDL file 2416 for this alternative version of the entity, thus "uniquifying" this entity as noted above with reference to FIG. 26. Following either block 3244 or block 3246, the process of FIG. 32C (and the processing of transform engine 218 at block 2414) ends at block 3250.

Upon reference to the foregoing description, those skilled in the art will appreciate that that the described design methodology can be applied to integrated circuit designs of varying scopes, including multiple different scopes of the design of a given integrated circuit chip. In accordance with one aspect of the present disclosure, each of one or more smaller scope(s) of the integrated circuit design, which can each be assigned to a different design team, are first processed from PHDL files 203, NHDL files 205, and SHDL files 207 into a respective post-synthesis PDHDL file 314. Conveniently, each such post-synthesis PDHDL file 314 employs the physical hierarchy boundaries also utilized by RHNHDL files 2412. Leveraging this insight, transform engine 218 can be utilized to incorporate PDHDL entities defined by these PDHDL files 314 into a RHNHDL representation of a larger scope of the integrated circuit design that encloses the smaller scope(s) corresponding to the PDHDL entities. This process can be repeated iteratively to build up a PDHDL representation of an integrated circuit design to any desired level of the design hierarchy. One example of such an iterative design process is described below with reference to FIGS. 33-34 with additional reference to exemplary integrated circuit chip 3500 of FIG. 35.

With reference now to FIG. 33, there is illustrated a high-level logical flowchart of an exemplary iterative integrated circuit design process in accordance with one embodiment. The process of FIG. 33 begins at block 3300 and then proceeds to block 3302, which illustrates using the previously described design methodology 200 to produce an initial integrated circuit design, which at this point may be represented, for example, by RHNHDL files 2412. For example, in FIG. 35, which is graphical representation of a hierarchical integrated circuit design of an entire integrated circuit chip 3500, various possibly different teams of designers may independently develop initial integrated circuit designs of each of various units of the overall integrated circuit chip 3500 at block 3302. These units may include, for example, units 3506 and 3512 instantiated in cores 3502a, 3502b, as well as a unit 3514 instantiated as instances 3514a, 3514b in a cache hierarchy 3504. Following block 3302, one or more teams of designers may select sub-regions of the integrated circuit design for processing into a finished state, for example, as represented by post-synthesis PDHDL files 314, as indicated at block 3304. As further illustrated at block 3304, following the selection, each of the selected sub-regions is independently processed, for example, utilizing design methodology 200 to obtain finished post-synthesis PDHDL files 314. In at least some embodiments, one or more of these post-synthesis PDHDL files 314 may be licensed-in or licensed-out as an IP block.

Figure 35:
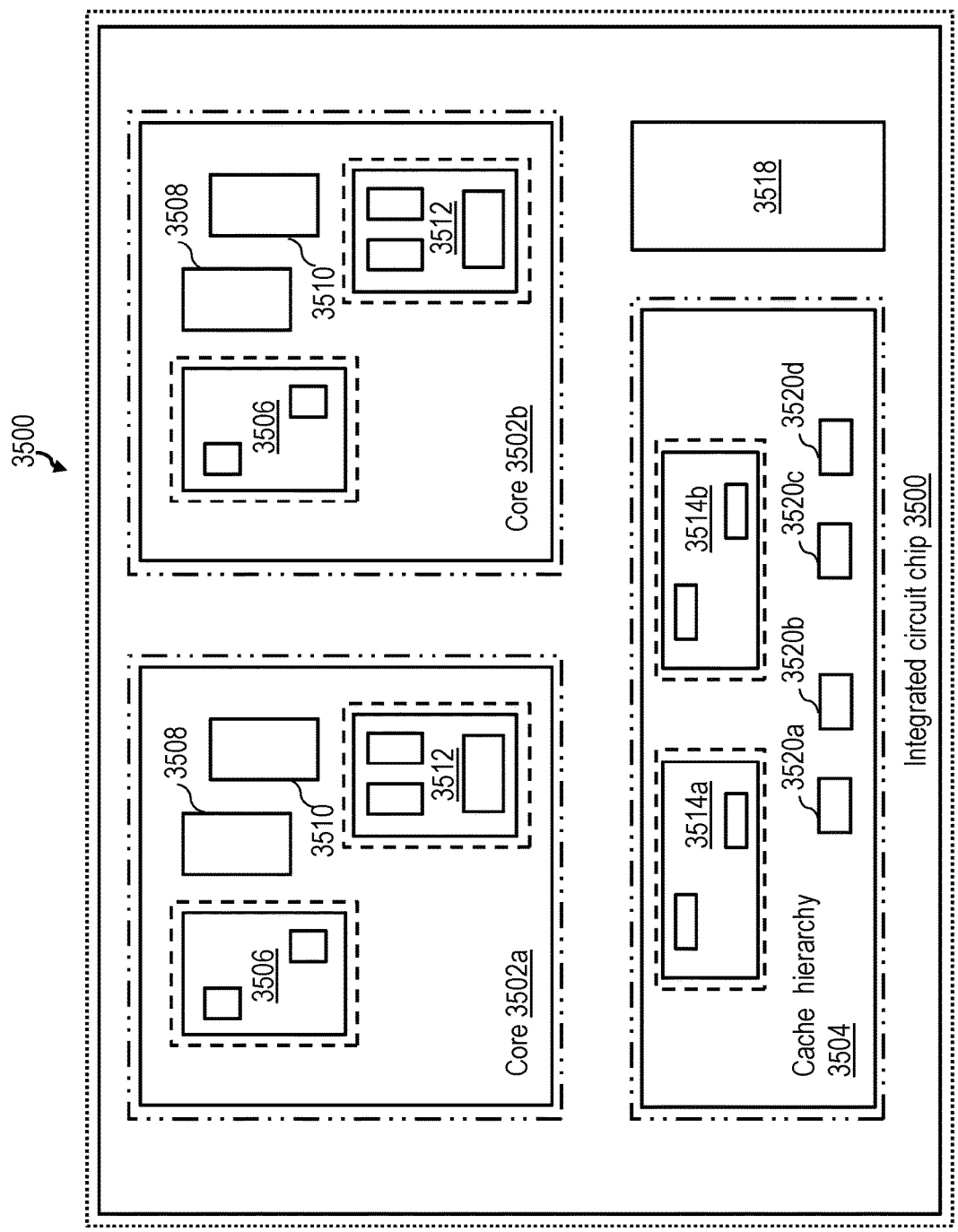
FIG. 35 is a high-level block diagram of an exemplary integrated circuit design that may be processed in accordance with the design processes given in FIGS. 34-35.

As illustrated at block 3306, a larger scope of integrated circuit design represented by a collection of RHNHDL files 2412 is developed. This larger scope includes one or more units initially processed into a finished post-synthesis PDHDL representation at block 3304. This larger scope corresponds to a desired maximum scope of iteration in the process of FIG. 33. In one example, this larger scope is represented in FIG. 35 by one of the units (e.g., core 3502 or cache hierarchy 3504) identified by a dash-double-dot line. As another example, this larger scope can be the entire integrated circuit chip 3500 enclosed by a dotted line. At block 3306, transform engine 218 is utilized to process the instance tree of the larger scope of design bottom-up in order to substitute the pre-processed PDHDL entities in place of the corresponding RHNHDL entities. One exemplary process for performing the processing illustrated at block 3306 of FIG. 33 is given in FIG. 34, which is described below. As indicated at block 3308, a set of post-synthesis PDHDL files 314 is then produced to represent the larger scope of design. A determination is then made at block 3310 whether or not additional regions within the model produced at block 3308 are to be processed into an updated integrated circuit design. If a negative determination is made at block 3310, the iterative design process is complete, and the iterative design process of FIG. 33 ends at block 3312. If, however, an affirmative determination is made at block 3310, the process of FIG. 33 returns to block 3304 and following blocks, which have been described.

Referring now to FIG. 34, there is depicted a high-level logical flowchart of an exemplary process for preparing a PDHDL entity for substitution into an integrated circuit design in place of a more abstract design entity (e.g., a RHNHDL entity) in accordance with one embodiment. The illustrated process can be performed, for example, at block 3306 of FIG. 3306.

The process of FIG. 34 begins at block 3400 and then proceeds to block 3402, which illustrates processing RHNHDL files 2412 defining a larger scope of integrated circuit design utilizing transform engine 218. Directives in control files 220 are then utilized to direct transform engine 218 to delete selected RHNHDL entities from the larger scope of integrated circuit design for which corresponding PDHDL entities have already been defined (block 3404). At block 3404, transform engine 218 also removes from the integrated circuit design any NHDL-only signals connected to PDHDL entities. In place of the deleted RHNHDL entities, transform engine 218 inserts into the integrated circuit design the pre-processed PDHDL entities corresponding to the removed RHNHDL entities, again under the control of directives in control files 220 (block 3406). At block 3408, transform engine 218 reconnects any non-technology-specific signals formerly attached to the deleted RHNHDL entities to the inserted PDHDL entities. At this point, the representation of the integrated circuit design is indistinguishable from the state of a partially complete integrated circuit design that has been developed all the way from SHDL/NHDL files defining entities at the lowest level of the instance hierarchy all the way to the current point by the bottom-up processing of the instance hierarchy described above. Transform engine 218 then invokes bottom-up processing of the instance hierarchy in the manner described above with reference to FIGS. 22 and FIGS. 32A-32C to perform technology mapping and structure insertion on the RHNHDL representation of that selected scope of the integrated circuit design, as depicted at block 2414 of FIG. 24. The resultant TPHDL files 2416 are further processed in accordance with design methodology 200 to obtain a collection of post-synthesis PDHDL files 314 defining a single PDHDL entity representing the current level of the instance hierarchy and all enclosed lower-level entities (block 3410). Thereafter, the process of FIG. 34 ends at block 3412.

The present invention may be a system, a method, and/or a computer program product. If the present invention is implemented as a computer program product, the computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, in some embodiments, a processor receives, as input, a first hardware description language (HDL) file defining an entity of a modular circuit design. The first HDL file instantiates, by a storage element declaration in a hardware description language, a storage element within the entity. The first HDL file omits a port map for the storage element. Based on the first HDL file, the processor automatically fully elaborates a port map for the storage element. The processor stores, in data storage, a derived second HDL file defining the entity and including the port map.

While the present invention has been particularly shown as described with reference to one or more preferred embodiments, it will be understood by those skilled in the art that various changes in form and detail may be made therein without departing from the scope of the claims. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

The figures described above and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time-to-time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of data processing in a data processing system including a processor, the method comprising:
   a processor receiving, as input, a first hardware description language (HDL) file defining an entity of a modular circuit design, wherein the first HDL file instantiates, by a storage element declaration in a hardware description language, a storage element within the entity, and wherein the first HDL file omits a port map for the storage element;

based on the first HDL file, the processor automatically fully elaborating a port map for the storage element; and the processor storing, in data storage, a derived second HDL file defining the entity and including the port map.

2. The method of claim 1, wherein the storage element declaration specifies only a data input signal and a data output signal of the storage element.

3. The method of claim 1, wherein:
the storage element is one of multiple storage elements within the entity;
the method further comprises applying to the multiple storage elements characteristics defined by an attribute declaration statement in the first HDL file.

4. The method of claim 3, wherein the characteristics include a clock region and a clock frequency relative to a global clock.

5. The method of claim 1, wherein:
the first HDL file includes a storage element variable declaration statement defining a value for a particular characteristics of a plurality of characteristics of a storage element; and
the method further comprises the processor applying the value to the storage element based on the first HDL file including a storage element declaration for the storage.

6. The method of claim 1, further comprising:
the processor replacing a portion of an implementation defined within the entity based on an expression of design refinement intent specified in comments within the second HDL file.

7. The method of claim 1, further comprising:
compiling the second HDL file with one or more additional HDL files to form a functional simulation model of the modular circuit design.

8. The method of claim 1, further comprising:
the processor automatically creating on the entity a port for a functional signal not referenced within the entity and not found within the entity.

9. A data processing system, comprising:
a processor; and
a storage device coupled to the processor, wherein the storage device includes program code executable by the processor to cause the processor to perform:
receiving, as input, a first hardware description language (HDL) file defining an entity of a modular circuit design, wherein the first HDL file instantiates, by a storage element declaration in a hardware description language, a storage element within the entity, and wherein the first HDL file omits a port map for the storage element;
based on the first HDL file, automatically fully elaborating a port map for the storage element; and
storing, in data storage, a derived second HDL file defining the entity and including the port map.

10. The data processing system of claim 9, wherein the storage element declaration specifies only a data input signal and a data output signal of the storage element.

11. The data processing system of claim 9, wherein:
the storage element is one of multiple storage elements within the entity;
the program code further causes the processor to perform applying to the multiple storage elements characteristics defined by an attribute declaration statement in the first HDL file.

12. The data processing system of claim 11, wherein the characteristics include a clock region and a clock frequency relative to a global clock.

13. The data processing system of claim 9, wherein:
the first HDL file includes a storage element variable declaration statement defining a value for a particular characteristics of a plurality of characteristics of a storage element; and
the program code further causes the processor to perform applying the value to the storage element based on the first HDL file including a storage element declaration for the storage.

14. The data processing system of claim 9, wherein the program code further causes the processor to perform:
replacing a portion of an implementation defined within the entity based on an expression of design refinement intent specified in comments within the second HDL file.

15. The data processing system of claim 9, wherein the program code further causes the processor to perform:
compiling the second HDL file with one or more additional HDL files to form a functional simulation model of the modular circuit design.

16. The data processing system of claim 9, wherein the program code further causes the processor to perform:
automatically creating on the entity a port for a functional signal not referenced within the entity and not found within the entity.

17. A program product, comprising:
a storage device; and
program code stored within the storage device and executable by a processor to cause the processor to perform:
receiving, as input, a first hardware description language (HDL) file defining an entity of a modular circuit design, wherein the first HDL file instantiates, by a storage element declaration in a hardware description language, a storage element within the entity, and wherein the first HDL file omits a port map for the storage element;
based on the first HDL file, automatically fully elaborating a port map for the storage element; and
storing, in data storage, a derived second HDL file defining the entity and including the port map.

18. The program product of claim 17, wherein the storage element declaration specifies only a data input signal and a data output signal of the storage element.

19. The program product of claim 17, wherein:
the storage element is one of multiple storage elements within the entity;
the program code further causes the processor to perform applying to the multiple storage elements characteristics defined by an attribute declaration statement in the first HDL file.

20. The program product of claim 19, wherein the characteristics include a clock region and a clock frequency relative to a global clock.

21. The program product of claim 17, wherein:
the first HDL file includes a storage element variable declaration statement defining a value for a particular characteristics of a plurality of characteristics of a storage element; and
the program code further causes the processor to perform applying the value to the storage element based on the first HDL file including a storage element declaration for the storage.

22. The program product of claim 17, wherein the program code further causes the processor to perform:

replacing a portion of an implementation defined within the entity based on an expression of design refinement intent specified in comments within the second HDL file.

23. The program product of claim 17, wherein the program code further causes the processor to perform:
compiling the second HDL file with one or more additional HDL files to form a functional simulation model of the modular circuit design.

24. The program product of claim 17, wherein the program code further causes the processor to perform:
automatically creating on the entity a port for a functional signal not referenced within the entity and not found within the entity.

* * * * *